United States Patent
Landers et al.

(10) Patent No.: US 6,985,793 B2
(45) Date of Patent: Jan. 10, 2006

(54) HORIZONTALLY STRUCTURED CAD/CAM COORDINATE SYSTEM FOR MANUFACTURING DESIGN

(75) Inventors: Diane M. Landers, Frankenmouth, MI (US); Bradley T. Muscott, Saginaw, MI (US); Pravin Khurana, Rochester, MI (US)

(73) Assignee: Delphi Technologies, Inc., Troy, MI (US)

( * ) Notice: Subject to any disclaimer, the term of this patent is extended or adjusted under 35 U.S.C. 154(b) by 134 days.

(21) Appl. No.: 10/355,662

(22) Filed: Jan. 31, 2003

(65) Prior Publication Data

US 2004/0153201 A1 Aug. 5, 2004

(51) Int. Cl.
*G06F 17/50* (2006.01)

(52) U.S. Cl. .................. 700/182; 700/97; 700/104; 700/118; 703/1

(58) Field of Classification Search ............. 700/95–98, 700/103, 104, 117, 118, 180–182; 703/1
See application file for complete search history.

(56) References Cited

U.S. PATENT DOCUMENTS

| | | | |
|---|---|---|---|
| 5,184,426 A | 2/1993 | Minatani | 451/5 |
| 5,351,196 A | 9/1994 | Sowar et al. | 364/474.24 |
| 5,434,791 A | 7/1995 | Koko et al. | 700/97 |
| 5,467,293 A | 11/1995 | Summer et al. | 364/578 |
| 5,659,493 A | 8/1997 | Kiridena et al. | 703/2 |
| 5,691,909 A | * 11/1997 | Frey et al. | 700/159 |
| 5,710,709 A | 1/1998 | Oliver et al. | 364/474.26 |
| 5,768,136 A | 6/1998 | Fujiwara et al. | 364/474.24 |
| 5,793,647 A | 8/1998 | Hageniers et al. | 702/35 |

(Continued)

OTHER PUBLICATIONS

U.S. Appl. 10/358,873.*

Solid Edge User's Guide Version 6, MU28900–ENG, by Unigraphics Solutions, 1998, pp. 28, 29, 33, 90, 91, 96, 157, and 178.

Artificial Intelligence (Understanding Computers Series), Time–Life Books, 1986, ISNBN–0–8094–5675–3, pp. 36–43.

Hemmett, Fussell, Jerard: "A Robust and Efficient Approach to Feedrate Selection for 3–axis Machining" ASME International Mechanical Engineering Congress and Exposition, Nov. 2000.

Roth D et al: "Surface swept by a toroidal cutter during 5–axis machining" Computer Aided Design, Elsevier Publishers BV., Barkings, GB, vol. 33, No. 1, Jan. 2001, pp. 57–63.

Spence A D et al: "Integrated solid modeller based solutions for machining" Computer Aided Design, Elsevier Publishers BV., Barking, GB, vol. 32, No. 8–9, Aug. 2000, pp. 553–568.

(Continued)

*Primary Examiner*—Paul Rodriguez
(74) *Attorney, Agent, or Firm*—Michael D. Smith

(57) ABSTRACT

A method of horizontally structured CAD/CAM manufacturing with horizontal coordinate systems including selecting a blank for machining into an actual part, establishing a coordinate system; and establishing an other coordinate system. The other coordinate system exhibits an associative relationship with the coordinate system. The method also includes creating a master process model including a virtual blank corresponding to the blank, a manufacturing feature, virtual machining of the manufacturing feature into the virtual blank, the manufacturing feature exhibiting another associative relationship with at least one of the coordinate system and the other coordinate system, and generating manufacturing instructions to create the actual part by machining the manufacturing feature into the blank.

39 Claims, 23 Drawing Sheets

U.S. PATENT DOCUMENTS

| | | | | |
|---|---|---|---|---|
| 5,808,432 | A | | 9/1998 | Inoue et al. ................. 318/561 |
| 5,815,154 | A | | 9/1998 | Hirschtick et al. ........... 345/356 |
| 5,949,693 | A | * | 9/1999 | Tandler .......................... 703/1 |
| 6,073,056 | A | | 6/2000 | Gawronski et al. ............ 700/98 |
| 6,120,171 | A | | 9/2000 | Shaikh .................. 364/468.04 |
| 6,219,049 | B1 | | 4/2001 | Zuffante et al. ............. 345/339 |
| 6,219,055 | B1 | | 4/2001 | Bhargava et al. ........... 345/355 |
| 6,263,252 | B1 | | 7/2001 | St. Ville ....................... 700/98 |
| 6,323,863 | B1 | | 11/2001 | Shinagawa et al. .......... 345/441 |
| 6,341,153 | B1 | | 1/2002 | Rivera et al. ................... 378/4 |
| 6,341,996 | B1 | | 1/2002 | Brien et al. ..................... 451/8 |
| 6,356,800 | B1 | | 3/2002 | Monz et al. ................. 700/184 |
| 6,430,455 | B1 | | 8/2002 | Rebello et al. ............. 700/105 |
| 6,599,125 | B1 | | 7/2003 | Freilich et al. ........... 433/212.1 |
| 6,606,528 | B1 | * | 8/2003 | Hagmeier et al. ............. 700/98 |
| 6,629,065 | B1 | | 9/2003 | Gadh et al. ..................... 703/1 |
| 2002/0107673 | A1 | * | 8/2002 | Haller et al. .................... 703/1 |
| 2002/0133252 | A1 | | 9/2002 | Landers et al. ................ 700/97 |
| 2002/0133253 | A1 | | 9/2002 | Landers et al. ................ 700/98 |
| 2002/0133264 | A1 | | 9/2002 | Maiteh et al. ............... 700/182 |
| 2002/0133265 | A1 | | 9/2002 | Landers et al. .............. 700/182 |
| 2002/0133266 | A1 | | 9/2002 | Landers et al. .............. 700/182 |
| 2002/0133267 | A1 | | 9/2002 | Landers et al. .............. 700/182 |
| 2002/0133803 | A1 | | 9/2002 | Landers et al. .............. 717/104 |
| 2002/0152000 | A1 | | 10/2002 | Landers et al. ................ 700/98 |
| 2003/0004596 | A1 | | 1/2003 | Landers et al. ................ 700/98 |
| 2003/0033041 | A1 | | 2/2003 | Richey ......................... 700/98 |
| 2003/0083773 | A1 | * | 5/2003 | Schwanecke et al. ........ 700/182 |
| 2003/0114945 | A1 | | 6/2003 | Hirano et al. ................. 700/97 |

OTHER PUBLICATIONS

Wang W P et al: "Geometric Modeling for Swept Volume of Moving Solids" IEEE Computer Graphics and Applications, IEEE Inc. New York, US, vol. 6, No. 12, Dec. 1, 1986, pp. 8–17.

U.S. Appl. No. 10/355,310, filed Jan. 31, 2003, Landers et al.

U.S. Appl. No. 10/355,326, filed Jan. 31, 2003, Khurana.

U.S. Appl. No. 10/355,355, filed Jan. 31, 2003, Landers et al.

U.S. Appl. No. 10/355,749, filed Jan. 31, 2003, Landers et al.

U.S. Appl. No. 10/355,763, filed Jan. 31, 2003, Landers et al.

U.S. Appl. No. 10/358,870, Filed Feb. 5, 2003, Thomas et al.

U.S. Appl. No. 10/358,874, filed Feb. 5, 2003, Thomas et al.

William H. Beyer, Ph.D., editor; CRC Handbook of Mathematical Sciences, 5th Edition, 1978, pp. 354–355.

Sridhar S. Condoor, "Integrating Design in Engineering Graphics Using Feature–Based, Parametric Solid Modeling," ASEE/IEEE Frontiers in Education Conference 12d2–13; 1999; pp. 12d2–13–12d2–17.

Chih–Hsing, Chu and Chun–Fong You; "Operation Planning in NC Programming Based on CAD Systems," found at http://www.dnclab.berkeley.edu/Ima/people/chchu/paper/NCoptim.html, Feb. 22, 2002.

* cited by examiner

HORIZONTALLY STRUCTURED CAD/CAM COORDINATE SYSTEM FOR MANUFACTURING DESIGN

BACKGROUND

This disclosure relates to Computer-Aided Design and Computer-Aided Manufacturing (CAD/CAM) methods. CAD/CAM software systems are long known in the computer art. Some utilize wire-and-frame methods of building models while others utilize form features. Typically, in the form feature method of building CAD/CAM models, physical features are added to the model in an associative relationship with whatever other features. Unfortunately, then, the alteration or deletion of any one feature will result in the alteration or deletion of any other features attached to it. This makes altering or correcting complicated models extensive and time-consuming.

BRIEF SUMMARY

A method of horizontally structured CAD/CAM manufacturing with horizontal coordinate systems comprising: selecting a blank for machining into an actual part; establishing a coordinate system; and establishing another coordinate system wherein the another coordinate system exhibits an associative relationship with the coordinate system. The method also includes creating a master process model comprising: a virtual blank corresponding to the blank; a manufacturing feature; virtual machining of the manufacturing feature into the virtual blank, the manufacturing feature exhibiting another associative relationship with at least one of the coordinate system and the another coordinate system; and generating machining instructions to create the actual part by machining the manufacturing feature into the blank.

A manufactured part created by a method of horizontally structured CAD/CAM manufacturing with a horizontal coordinate system, comprising: a blank for machining into the manufactured part; a coordinate system; and another coordinate system wherein the another coordinate system exhibits an associative relationship with the coordinate system. The manufacture part is also manufactured by a master process model comprising: a virtual blank corresponding to the blank; a manufacturing feature wherein the manufacturing feature is characterized by virtual machining of the manufacturing feature into the virtual blank, the manufacturing feature exhibiting another associative relationship with at least one of the coordinate system and the another coordinate system; and the actual part created by machining said manufacturing feature into the blank in accordance with a machining instruction.

Also disclosed is a storage medium encoded with a machine-readable computer program code for horizontally structured CAD/CAM manufacturing with horizontal coordinate systems. The storage medium including instructions for causing a computer to implement the abovementioned method.

Additionally disclosed is a computer data signal for horizontally structured CAD/CAM manufacturing with horizontal coordinate systems. The computer data signal comprising code configured to cause a processor to implement the abovementioned method.

DETAILED DESCRIPTION

Figure 1:
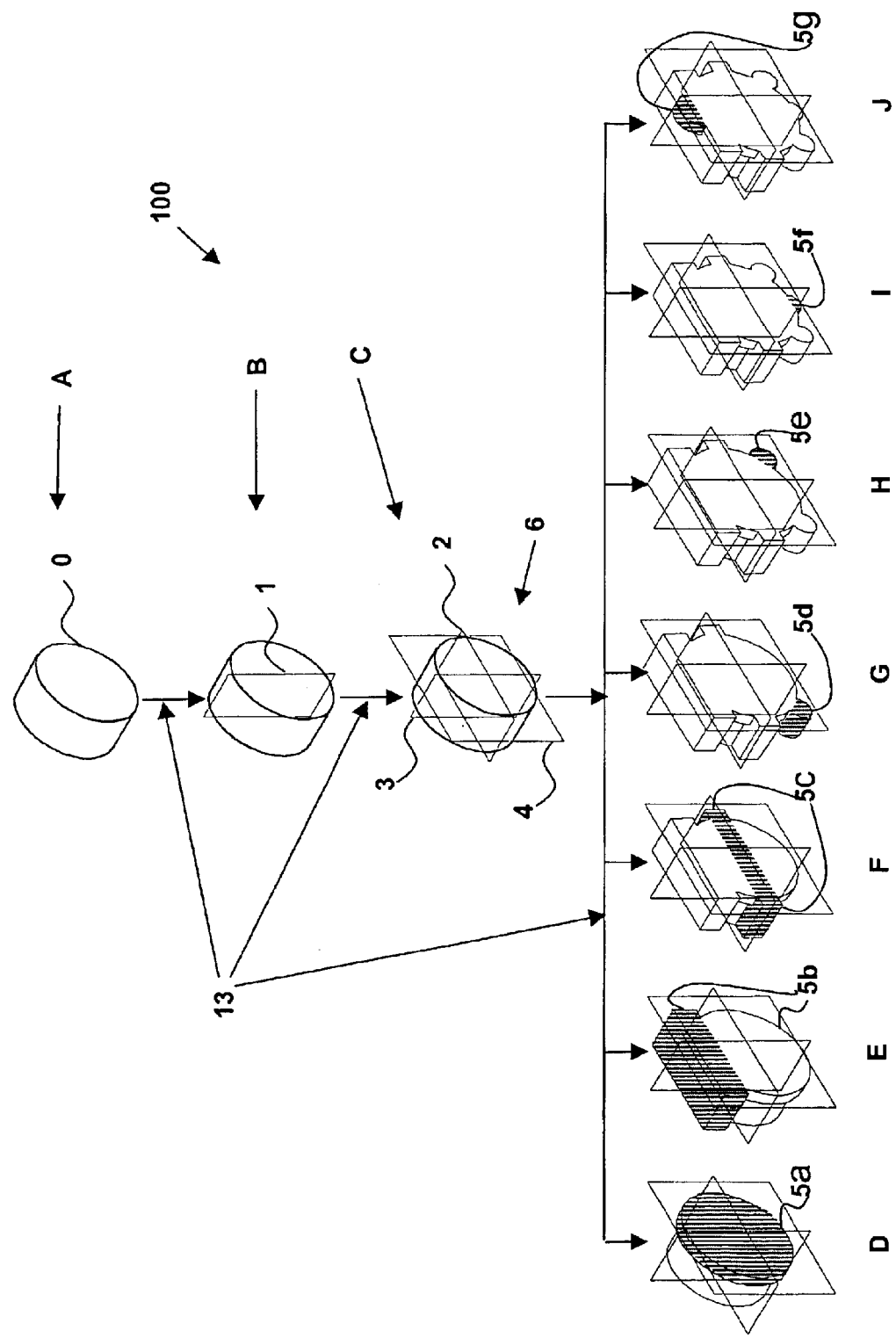
FIG. 1 is a schematic of the horizontal modeling method.

Disclosed herein is a horizontal method of computer-aided design and computer aided manufacture (CAD/CAM) modeling that is superior over the modeling employing vertical methods. The disclosed embodiments permit alterations, additions, and deletions of individual features (e.g., holes, bosses, etc.) of a virtual part, wherein a change in any one feature is independent of the remaining features.

The disclosed method may be implemented on any CAD/CAM software package that supports (a) reference planes or their Cartesian equivalents, (b) parametric modeling or its equivalent, and (c) feature modeling or its equivalents.

A "horizontal tree structure" is employed to add features to a model, preferably by establishing an exclusive parent/child relationship between a set of reference planes and each feature. The reference planes themselves may, but need not be, children of a parent base feature from which a horizontally structured model is developed. Moreover, the reference planes themselves may, but need not be, children of a parent virtual blank model that may correspond to a real-world part or blank in the manufacturing process model. The parent/child relationship means that changes to the parent will affect the child, but changes to the child have no effect upon the parent. Since each added feature of the model is related exclusively to a reference coordinate, then individual features may be added, edited, suppressed or deleted individually without affecting the rest of the model.

Throughout this specification, examples and terminology will refer to Unigraphics® software for illustrative purposes, but the method is not to be construed as limited to that particular software package. Other suitable CAD/CAM software packages that meet the three criteria above and that would therefore be suitable. For example, other suitable software packages include, but may not be limited to, SOLID EDGE®, also by Unigraphics®, and CATIA® by IBM®. Note that the phrases "datum planes", "parametric modeling" and "features" are phrases derived from the Unigraphics® documentation and may not necessarily be used in other software packages. Therefore, their functional definitions are set out below.

"Model" refers to the part that is being created via the CAD/CAM software. The model comprises a plurality of modeling elements including "features".

"Datum planes" refer to reference features that define Cartesian coordinates by which other features may be referenced to in space. In Unigraphics®, the datum planes are two-dimensional, but a plurality of datum planes may be added to a drawing to establish three-dimensional coordinates. These coordinates may be constructed relative to the model to move and rotate with the model. Regardless of how the coordinate system is created, for the purposes of this disclosure it should be possible to reference numerous features to the same coordinate system.

"Parametric modeling capabilities" refers to the ability to place mathematical constraints or parameters on features of the model so that the features may be edited and changed later. Models that do not have this capability i.e., models that include non-editable features, are referred to as "dumb solids". Most CAD/CAM systems support parametric modeling.

"Features" refers to parts and details that combine to form the model. A "reference feature", such as a coordinate system, is an imaginary feature that is treated and manipulated like a physical feature, but does not appear in the final physical model.

"Feature modeling" is the ability to build up a model by adding and connecting a plurality of editable features. Not all CAD/CAM software supports this capability. AutoCAD®, for example, currently employs a wire-frame-and-skin methodology to build models rather than feature modeling. An aspect of feature modeling is the creation of associative relationships among models, model elements, features, and the like, as well as combinations of the foregoing, meaning the features are linked such that changes to one feature may alter the others with which it is associated. An exemplary associative relationship is a "parent/child relationship".

"Parent/child relationship" is a type of associative relationship among models, model elements, features, and the like, as well as combinations of the foregoing. For example, a parent/child relationship between a first feature (parent) and a second feature (child) means that changes to the parent feature will affect the child feature (and any children of the child all the way down the familial line), but changes to the child will have no effect on the parent. Further, deletion of the parent results in deletion of all the children and progeny below it. The foregoing definition is intended to address associative relationships created as part of generating a model, notwithstanding associative relationships created because of the application of expression driven constraints applied to feature parameters.

The present invention relates to the design and manufacture of a real-world object based upon a virtual CAD/CAM model. An inventive aspect thereof is disclosed in copending, commonly assigned:

U.S. Ser. No. 09/483,722, Filed Jan. 14, 2000, entitled "HORIZONTALLY-STRUCTURED CAD/CAM MODELING", the disclosures of which are incorporated by reference herein in their entirety.

U.S. Pat. No. 6,735,489, U.S. Ser. No. 09/483,301, Filed Jan. 14, 2000, entitled "HORIZONTALLY-STRUCTURED COMPUTER AIDED MANUFACTURING", the disclosures of which are incorporated by reference herein in their entirety.

United States Publication No. U52002-0133267A1, U.S. patent application Ser. No. 10/033,163, filed Oct. 24, 2001, entitled "Enhancement to Horizontally Structured Manufacturing Process Modeling", by Diane M. Landers et al., the disclosures of which are incorporated by reference herein in their entirety.

United States Publication No. US2002-0133803A1, U.S. patent application Ser. No. 10/032,960, filed Oct. 24, 2001, entitled "Enhancement to Horizontally-structured CAD/CAM Modeling", by Diane M. Landers et al., the disclosures of which are incorporated by reference herein in their entirety.

U.S. Pat. No. 6,775,581, United States Publication No. US2002-0004596A1, U.S. patent application Ser. No. 10/001,748, filed Oct. 24, 2001, entitled "Horizontally-structured CAD/CAM Modeling For Virtual Concurrent Product and Process Design" by Diane M. Landers et al., the disclosures of which are incorporated by reference herein in their entirety.

United States Publication No. US2002-0133266A1, U.S. patent application Ser. No 10/033,162 filed Oct. 24, 2001, entitled "Horizontally-structured Manufacturing Process Modeling For: Alternate Operations, Large Parts, and Charted Parts", by Diane M. Landers et al., the disclosures of which are incorporated by reference herein in their entirety.

United States Publication No. US2002-0133253A1, U.S. patent application Ser. No. 10/033,333, filed Oct. 24, 2001, entitled "Horizontally Structured CAD/CAM Modeling For Virtual Fixture and Tooling Processes", by Diane M. Landers et al., the disclosures of which are incorporated by reference herein in their entirety.

United States Publication No. US2002-015220001A1, U.S. patent application Ser. No. 10/075,804, filed Oct. 24, 2001, entitled "Automated Horizontally Structured Manufacturing Process Design Modeling", by Diane M. Landers et al., the disclosures of which are incorporated by reference herein in their entirety.

U.S. Pat. No. 6,839,606, United States Publication No. US2002-0133252A1, U.S. patent application Ser. No. 10/002,678, filed Oct. 24, 2001, entitled "Horizontally Structured Process Modeling for Fixtures and Tooling", by Diane M. Landers et al., the disclosures of which are incorporated by reference herein in their entirety.

United States Publication No. US2002-0133265A1, U.S. patent application Ser. No. 10/032,959 filed Oct. 24, 2001, entitled "Horizontally Structured Process Modeling for Concurrent Product and Process Design", by Diane M. Landers et al., the disclosures of which are incorporated by reference herein in their entirety.

U.S. patent application Ser. No. 10/142,709, filed May 10, 2002, entitled "System and Method for Integrating Geometric Models" by Ravikiran Duggirala, the disclosures of which are incorporated by reference herein in their entirety.

U.S. patent application Ser. No. 10/358,873, U.S. Provisional Patent Application Ser. No. 60/375,621, filed April 26, 2002, "Virtual Inspection of Math Based Machined Parts", by Steven Thomas and Diane Landers, the disclosures of which are incorporated by reference herein in their entirety.

U.S. patent application Ser. No. 10/358,874, U.S. Provisional Patent Application Ser. No. 60/375,787, filed April 26, 2002, entitled "Math Base Metal Removal of Complex Tool Shapes Along Complex Paths", by Steven Thomas and Diane Landers, the disclosures of which are incorporated by reference herein in their entirety.

Horizontally-Structured Models

An example of horizontally structured modeling is depicted in FIG. 1. FIG. 1 shows the progressive building up of a model 100 through processes depicted at A through J. The actual shape of the model 100 depicted in the figures is purely for illustrative purposes only, and is to be understood as not limiting, in any manner. In the figure, at A, the creation of the first feature of the model 100, known as the base feature 0 is depicted.

Referring again to FIG. 1, B depicts the creation of another feature, a datum plane that will be referred to as the base-level datum plane 1. This is a reference feature as described above and acts as a first coordinate reference. The arrows that flow from the creation of one feature to another indicate an associative relationship or link 13, here a parent/child relationship between the originating feature created and the feature(s) to which the arrow points. Hence, the base feature 0 is the parent of the base-level datum plane. As explained above, any change to the parent will affect the child (e.g., rotate the parent 90 degrees and the child rotates with it), and deletion of the parent results in deletion of the child. This effect ripples all the way down the family line. Since the base feature 0 is the great-ancestor of all later features in the modeling process, any change to the base feature will show up in every feature later created in the process and deletion of the base feature will delete everything. Note that since the base-level datum plane 1 is the child of the base feature 0, any change to the base-level datum plane will have no effect upon the base feature, but will affect all its progeny. As a reference coordinate, the base-level datum plane is useful as a positional tool.

It is preferred that the positioning of the base-level datum plane 1 with respect to the base feature 0 be chosen so as to make the most use of the base-level datum plane as a positional tool. Note that in FIG. 1, the base-level datum plane 1 is chosen to coincide with the center of the cylindrical base feature. By rotating the base-level datum plane symmetrically with the center of the base feature, all progeny will rotate symmetrically about the base feature as well. Differently shaped base features may suggest differently positioned base-level datum planes. Once again, it is noted that datum planes are used here because that is the coordinate system utilized by Unigraphics® software and is therefore illustrative only. Other software or systems may use coordinate reference features that are linear or three-dimensional. It is noteworthy then to appreciate that the teachings disclosed herein are not limited to planar reference features alone and may include various other reference features.

A second coordinate reference may be created as a child of the first coordinate reference described above, though this is not strictly necessary. As seen at C of FIG. 1, three datum planes 2, 3, and 4 are created. Each datum plane is oriented orthogonal to the others so that the entire unit comprises a three-dimensional coordinate system 6. The 3-D coordinate system 6 thus created is a relative one, meaning it rotates and moves along with the model 100. This is in contrast to an absolute coordinate system that exists apart from the model 100 and as is common to all CAD/CAM software. Unigraphics® software for example, actually includes two absolute coordinate systems, a "world" coordinate system and a local "working level" coordinate system.

Figure 2:
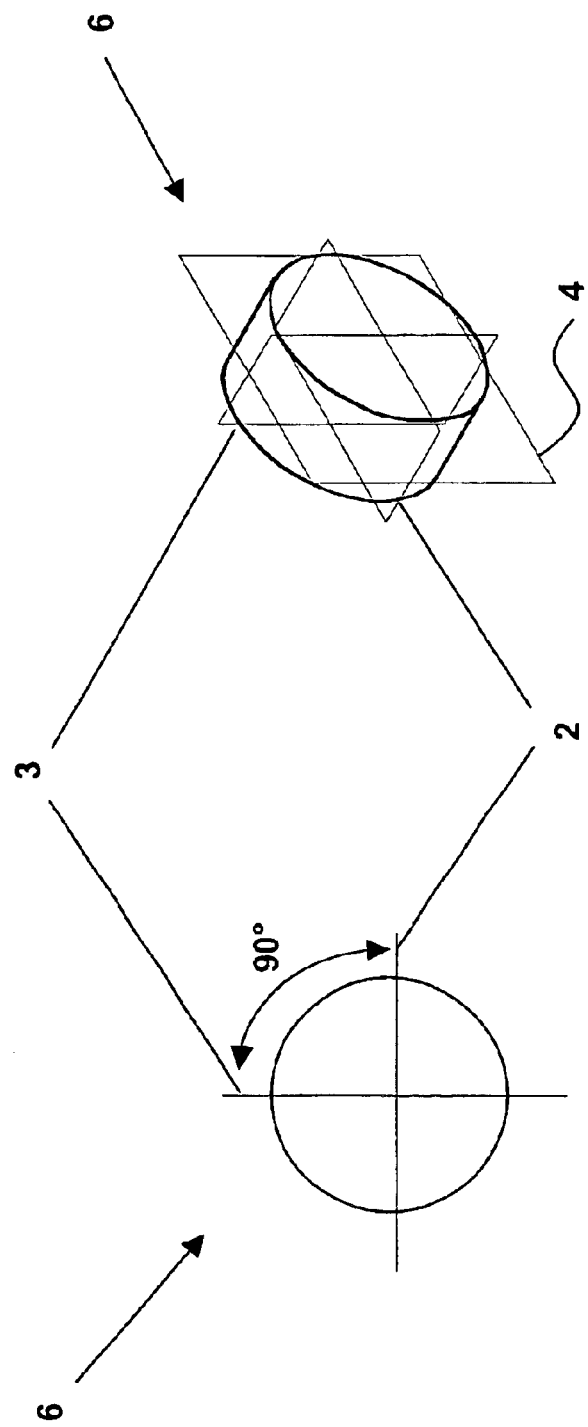
FIG. 2 is a magnified view of the relative 3-D coordinate system used in FIG. 1.

Referring to FIGS. 1 and 2, there are numerous ways and configurations possible to establish the 3-D coordinate system 6. For example, three independent datum planes, each referenced to another reference, or three datum planes relative to one another, where a first datum plane 2 may be referenced to a particular reference. A preferred method is to create a first datum plane 2 that is the child of the base-level datum plane 1 and offset 90 degrees therefrom. Then, a second datum plane 3 is created as a child of the first datum plane 2 and is offset 90 degrees therefrom. Note that the second datum plane 3 now coincides with the base-level datum plane 1, but they are not the same plane. It can be seen that any movement of the base-level datum plane 1 will result in corresponding movement of first 2 and second 3 datum planes of the 3-D coordinate system 6. The third datum plane 4 of the 3-D coordinate system 6 is created orthogonal to both the first and second planes, but is a child of the base feature 0 and will preferably coincide with a surface of the base feature. This is preferred with software that requires that physical features be mounted, or "placed", on a surface though they may be positioned relative to any number of datum planes. While not required, or explicitly enumerated, the third datum plane 4 may further include associative relationships with the first datum plane 2 and second datum plane 3, or any other reference plane. The third datum plane of the 3-D coordinate system is therefore referred to as the "face plane," while the first two datum planes of the 3-D coordinate system are referred to as the "positional planes". All physical features added to the model 100 from hereon will be "placed" onto the face plane and positioned relative to the positional planes datum planes 2 and 3 respectively of the 3-D coordinate system. It will be understood that the abovementioned example of feature placement is illustrative only, and should not be construed as limiting. Any datum plane may operate as a "face plane" for feature placement purposes. Moreover, any feature may also be oriented relative to a reference axis, which may be relative to any reference, which may include, but not be limited to, a datum plane, reference plane, reference system, and the like, as well as combinations of the foregoing.

It is an advantage to using datum planes that features may be placed upon them just as they may be placed upon any physical feature, making the 3-D coordinate systems created from them much more convenient than simple coordinate systems found on other CAD/CAM software. It should be noted, however, that these techniques apply to software that utilize datum planes such as Unigraphics® v-series. For other software, there may, and likely will be, other techniques to establishing a 3-D coordinate system relative to the model 100 to which the physical features of the model 100 may be positioned and oriented. Once, again, this method is not to be construed as limited to the use of datum planes or to the use of Unigraphics® software.

Continuing once again with FIGS. 1 and 2, the system now includes the datum planes 2, 3, and 4, which may be manipulated by the single base-level datum plane 1 so as to affect the positioning of all features added to the base feature 0, but with the constraint that the "placement" of each feature is fixed relative to a face of the base feature 0. This is but one of many possible arrangements but is preferred in the Unigraphics® environment for its flexibility. Movement of the base-level datum plane 1 results in movement of the first two positional 2, 3 planes, but need not necessarily affect the datum plane 4. The result is that objects will move when the base-level datum plane 1 is moved, but be constrained to remain placed in the face plane. It is found that this characteristic allows for more convenient and detailed adjustment, though it is a preferred, rather than a mandatory characteristic of the invention.

Referring again to FIG. 1, we see the successive addition of physical features, or form features 5*a* through 5*g*, to the model 100 at D through J. At D a circular boss 5*a* is mounted to the face plane and positioned relative to the positional planes. At each of E and F, a pad 5*b*, 5*c* is added to the model 100, thereby creating protrusions on either side. At G through J, individual bosses 5*d*, 5*e*, 5*f*, and 5*g* are added to the periphery of the model 100. Note that in each instance, the new feature is mounted to the face plane and positioned relative to the positional datum planes 2, and 3. This means that each feature 5 is the child of the face datum plane 4 and of each of the positional datum planes 2, and 3. In the embodiment shown, each feature is therefore a grandchild, great-grandchild, and great-great-grandchild of the base feature 0 by virtue of being a child of the face datum plane 4, first datum plane 2 and second datum plane 3, respectively. This means that movement or changes of the base feature results in movement and changes in all aspects of the added features, including both placement and positioning.

Each feature added to the coordinate system of the model 100 is independent of the others. That is to say, in the example depicted in FIG. 1 that no physical feature (except the base feature) is the parent of another. Since no physical feature is a parent, it follows that each individual physical feature may be added, edited, suppressed, or even deleted at leisure without disturbing the rest of the model 100. This characteristic of the disclosed embodiment that permits model 100 development to proceed approximately at an order of magnitude faster than traditional "vertical" CAD/CAM development. It should be further noted that while the example provided identifies features exhibiting no respective associative relationships, such a characteristic is not necessary. Features may exhibit associative relationships with other features as well as other elements of the model 100. The constraint this adds is the loss of independence (and hence modeling simplicity) among the several features.

Figure 3:
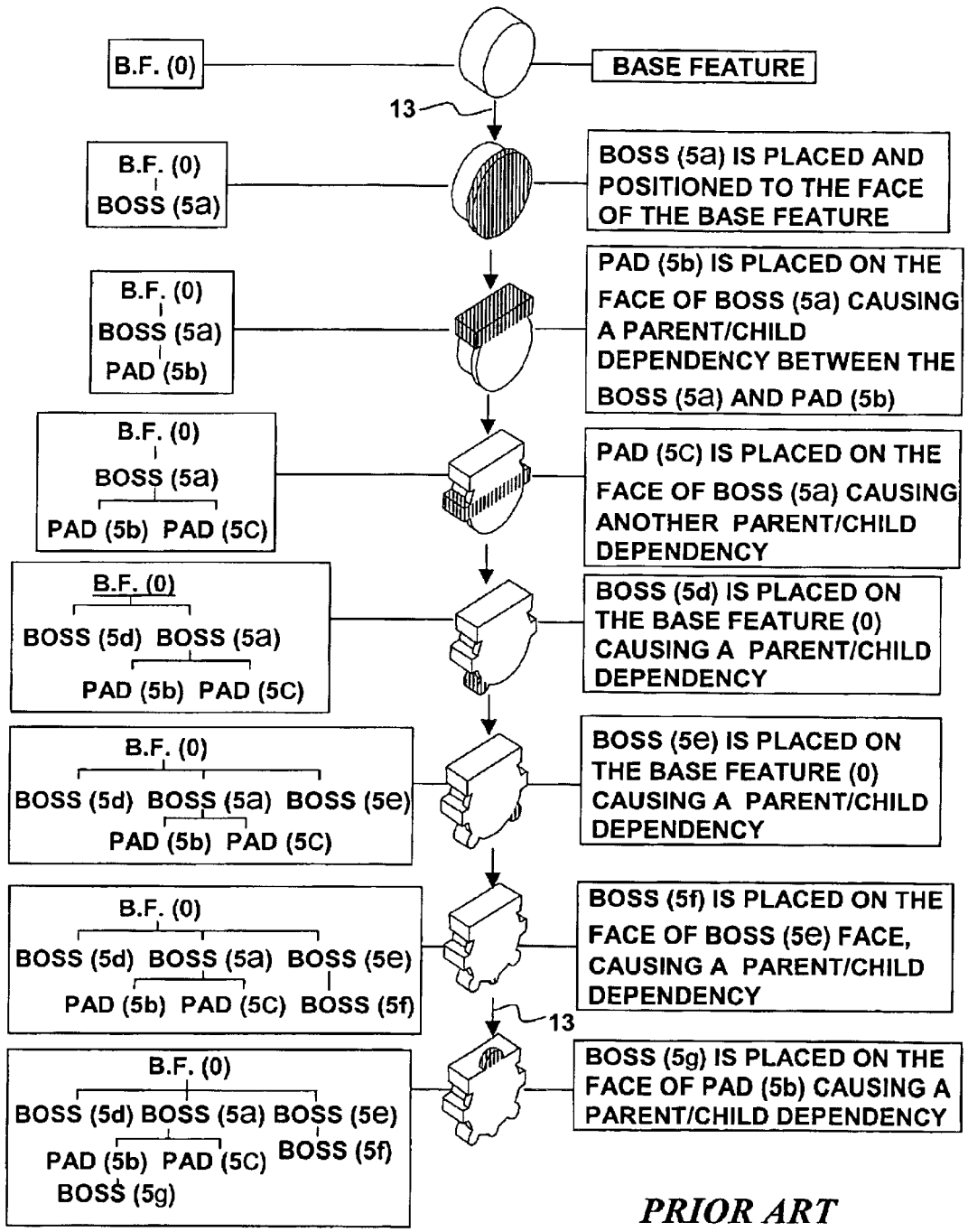
FIG. 3 is an example of the vertical modeling method.

The "vertical" methods of the prior art are graphically depicted in FIG. 3 and as taught by the Unigraphics® User's Manual. The column on the right of FIG. 3 describes the process performed, the central column shows the change to the model 100 as the result, and the leftmost column shows the changing tree structure. Note that here, since there are no datum planes utilized, there are only seven features shown as opposed to the eleven depicted in FIG. 1. It is noteworthy to observe the complex tree structure generated when features are attached to one another as depicted in FIG. 3, rather than to a central coordinate system as depicted by FIG. 1. Now, further consider what happens if the designer decides that the feature designated "Boss (5*a*)" (corresponding to 5*a* in FIG. 1) is no longer needed and decides to delete it. According to the tree structure in the lower left of FIG. 3, deletion of "Boss (5*a*)" results in the deletion of "Pad (5*b*)", "Pad (5*c*)" and "Boss (5*g*)". These features must now be added all over again. It is this duplication of effort that makes traditional "vertical" CAD/CAM design generally frustrating and time-consuming. Employment of the methods disclosed herein utilizing a similar model 100, suggest reductions of a factor of two in the time required for creation of a model 100, and time reductions of a factor of ten for making changes to a model 100.

It should be noted that certain form features may be preferably dependent from other form features or model 100 elements rather than directly dependent as children from the 3-D coordinate system as described herein. For example, an edge blend may preferably be mounted on another physical feature, not a datum plane. Such features will preferably be added to a single physical feature that itself is a child of the 3-D coordinate system, the intent being to keep the lineage as short as possible to avoid the rippling effect of a change whenever a feature is altered or deleted.

It is also noted that additional datum planes may be added as features to the 3-D coordinate system as children just like any physical feature. These would be added as needed to position other physical features, or to place them on surfaces in addition to the datum plane 4. Any additional face planes needed to mount features should be at the same level as the 3-D coordinate system, that is to say a sibling of the original datum plane 4, not a child of it. In the example shown, such an added plane would be created as a child of the base feature 0 just as the third datum plane 4 is.

Enhancement to Horizontally Structured Modeling

Figure 4:
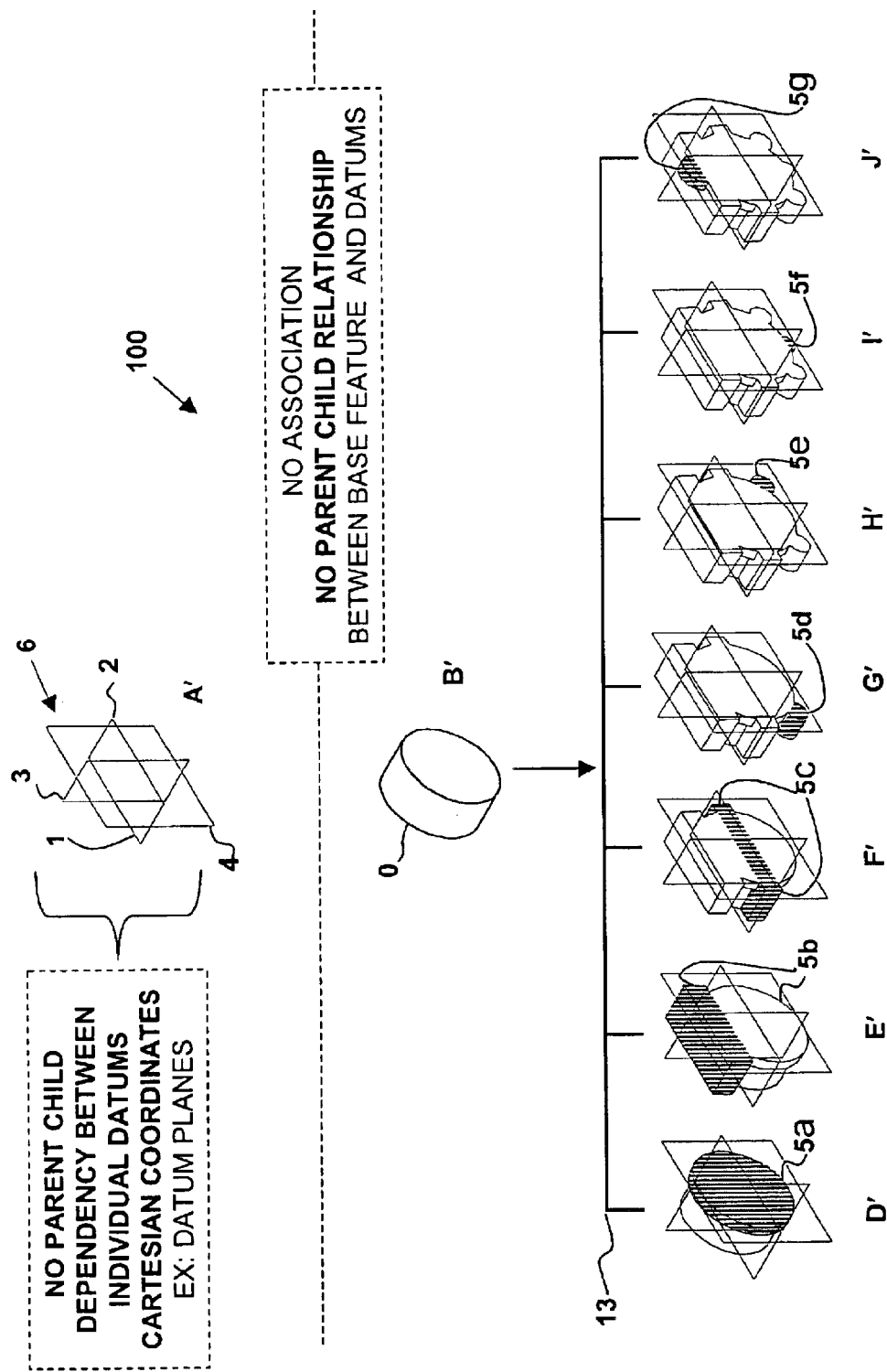
FIG. 4 is a diagram depicting an alternative embodiment of the horizontal modeling method.

A first embodiment of the method is depicted and exemplified in FIG. 4. FIG. 4 also depicts the progressive building up of a model via process depicted at A' through J'. The actual shape of the model 100 depicted in the figures is once again, purely for illustrative purposes, and is to be understood as not limiting, in any manner. In this embodiment, a set of coordinate references is established. As seen at A' of FIG. 4, three datum planes are created. Similar to the abovementioned horizontally structured modeling disclosure, each datum plane may be oriented orthogonal to the others so that the entire unit comprises a three-dimensional coordinate system 6. Alternatively, each datum plane or 3-D coordinate system may be positioned and oriented relative to some other reference, for example an absolute reference or coordinate system. For example, the 3-D coordinate system 6 may be relative to another reference, or an absolute reference such as the reference supplied by the Unigraphics® environment. This means it may rotate and move along with a reference.

A preferred method when utilizing Unigraphics® software is to create a first datum plane 2. Then, a second datum plane 3 is created independent of the first datum plane 2 and may, but need not be, offset 90 degrees therefrom. The third datum plane 4 is created, and once again, may be orthogonal to both the first datum plane 2 and second datum plane 3, but not necessarily so, thereby formulating the orthogonal 3-D coordinate system 6.

One advantage to using datum planes is that features may be placed upon them just as they may be placed upon any physical feature, making the 3-D coordinate systems created from them much more convenient than simple coordinate systems found on other CAD/CAM software. It should be noted, however, that these techniques apply to software that utilize datum planes such as Unigraphics®. For other software, there may and likely will be other techniques to establishing a 3-D coordinate system relative to the model 100 to which the physical features of the model 100 may be positioned and oriented. Once, again, this method is not to be construed as limited to the use of datum planes or to the use of Unigraphics® software.

Another feature of this embodiment is that the relation between reference datum planes e.g., 2, 3, and 4 may, but need not be, associative. Unlike earlier mentioned horizontally structured modeling methods where a parent-child relationship was utilized, in this instance the relationship between the datum planes may be as simple as position and orientation. Once again, the teachings of this invention are not limited to planar reference features.

Turning now to B' depicted in FIG. 4, a base feature 0 is added as a first feature, assembly or a sketch to an existing coordinate system or associative datum plane structure comprising datum planes 2, 3, and 4. Where in this instance, unlike the horizontally structured modeling methods described above, there may only be a positional and orientational relationship but not necessarily an associative or parent child relationship among the datum planes 2, 3, and 4. The elimination of an associative relationship among the datum planes 2, 3, and 4, the 3-D coordinate system 6, and the base feature 0 provides significant latitude in the flexibility attributed to the 3-D coordinate system 6 and the base feature 0. Therefore, the datum plane structure comprising 2, 3, and 4 may take its place as the zero'th level feature of the model 100. Thereafter, the base feature 0 is added at B' and the physical features, or form features 5a–5g are added at D' through J' in a manner similar to that described earlier. However, once again, it is noteworthy to appreciate that here a parent child relationship is eliminated between the base feature 0 and the physical features, or form features 5a–5g. In addition, an associative relationship, in this case a parent child relationship is created between the physical features, or form features 5a–5g and the datum planes 2, 3, and 4.

It may be beneficial to ensure that the positioning of the base feature 0 with respect to the datum planes 2, 3, and 4 be chosen so as to make the most use of the base feature 0 as an interchangeable element. Note once again from FIG. 1, in that embodiment, the base-level datum plane was chosen to coincide with the center of the cylindrical base feature. By rotating the base-level datum plane symmetrically with the center of the base feature, all progeny will rotate symmetrically about the base feature as well. Differently shaped base features will suggest differently positioned base-level datum planes. In this embodiment, the physical features, or form features 5a–5g and the datum planes 2, 3, and 4 maintain an associative relationship, but neither with the base feature 0. When the 3-D coordinate system is established before the fundamental shape is placed on the screen and presented to the user, it simplifies substitution of the base feature 0 to other models. For example, where it may be desirable to change one base feature 0 for another, and yet preserve the later added physical features, or form features e.g., 5a–5g. The disclosed embodiment simplifies this process by eliminating the parent child relationship between the base feature 0 and the datum planes. Therefore, the base feature 0 may be removed and substituted with ease. Moreover, the physical features, or form features 5a–5g and the datum planes 2, 3, and 4 may easily be adapted to other base features of other models.

Another feature for generating a solid model 100 may be achieved using extracted models, called virtual extract(s) or extracted bodies, hereinafter denoted extract(s) 22. Each in-process model 22 represents the model 100 at a particular part or step of the modeling process and each is a child of the model 100 from which it is extracted (often a master process model as will be discussed in detail later). Any changes to the parent model 100 are automatically reflected in all the relevant extract(s) 22, but changes to the extract(s) 22 have no effect on the parent model 100. Each in-process model 22 is a three-dimensional snapshot of the model 100 at a moment in "time" of its creation. The in-process models 22 created for each operation are children of the parent model 100. By changing the parent model 100, the in-process models 22, and therefore, the modeling process is automatically updated.

The "extraction" is accomplished through a software module provided with the CAD/CAM software, otherwise the user may create a software program for the process. In Unigraphics® software, a Modeling Module includes software configured to handle the extraction process. The order of creation of the in-process models 22 is preferably dictated by a user-friendly graphical interface 21, hereinafter referred to as a model navigation tool 21. The model navigation tool 21 will preferably allow the user to arrange the order of features through simple mouse operations to make manipulation of the model 100 as simple and intuitive as practicable. In the Unigraphics® software, a model navigation tool provides similar functionality and capability. Since the model 100 is preferably created using the horizontally structured methods described above, editing the model 100 is a simple and expedited matter of adding, editing, suppressing, or deleting individual features 5 of the model 100, which will automatically update all the extract(s) 22.

One may think of an in-process model 22 as a three-dimensional "snapshot" of the assembly of the model 100 in progress, showing all of the feature(s) 5 up to that point in the development of the model 100, but none that come after it. It is noteworthy to appreciate that feature(s) 5 may thereafter be added to the in-process model 22 without appearing in the model 100, however any feature(s) 5 added to the model 100 will appear in the in-process model 22 if the particular feature is directed to be added at or before the state of the model 100 represented by the in-process model 22.

Enhancement to Horizontally Structured Modeling Employing Model Link/Unlink

Another feature of the horizontally structured modeling and modeling is disclosed which utilizes the horizontal CAD/CAM modeling methods described above. Specifically, the first embodiment is further enhanced to ultimately facilitate generating horizontally structured CAD/CAM models. In an exemplary embodiment, horizontally structured modeling methods disclosed above are employed to facilitate the generation of one or more models for creating the actual part To facilitate the method disclosed and model creation, a link and unlink functionality is disclosed which provides for automatic references and the modification of associative relationships among one or more CAD/CAM models and model elements. The link/unlink function allows a newly created or existing model or model elements to be replaced by another. Moreover, the features associated with a first model may be re-associated to another model with little if any impact to the associated features.

In the Unigraphics® environment, the exemplary embodiment takes advantage of the existing link and unlink functionality of the Unigraphics® CAD/CAM system software coupled with the methods of horizontally structured CAD/CAM modeling to facilitate an enhanced method of modeling. In the exemplary embodiment, an illustration employing Unigraphics® software and references is provided. However, it should be noted that while the exemplary embodiment is described by way of illustration with and reference to Unigraphics® CAD/CAM system software it is not to be construed as limited thereto. The disclosed embodiments are equally applicable to any CAD/CAM system software, which exhibits or possesses the dictated requirements and capabilities. The disclosed method includes the removal of feature dependency between modeling elements, in this instance a form feature of model generated as disclosed earlier, and a linked geometry. Therefore, enabling the form feature or linked geometry to be replaced by a new for feature or linked geometry without losing the prior positional and orientational dependencies associated with the form feature or linked geometry. Therefore, this capability maintains the associative relationships generated between a linked geometry and a model element.

Figure 5:
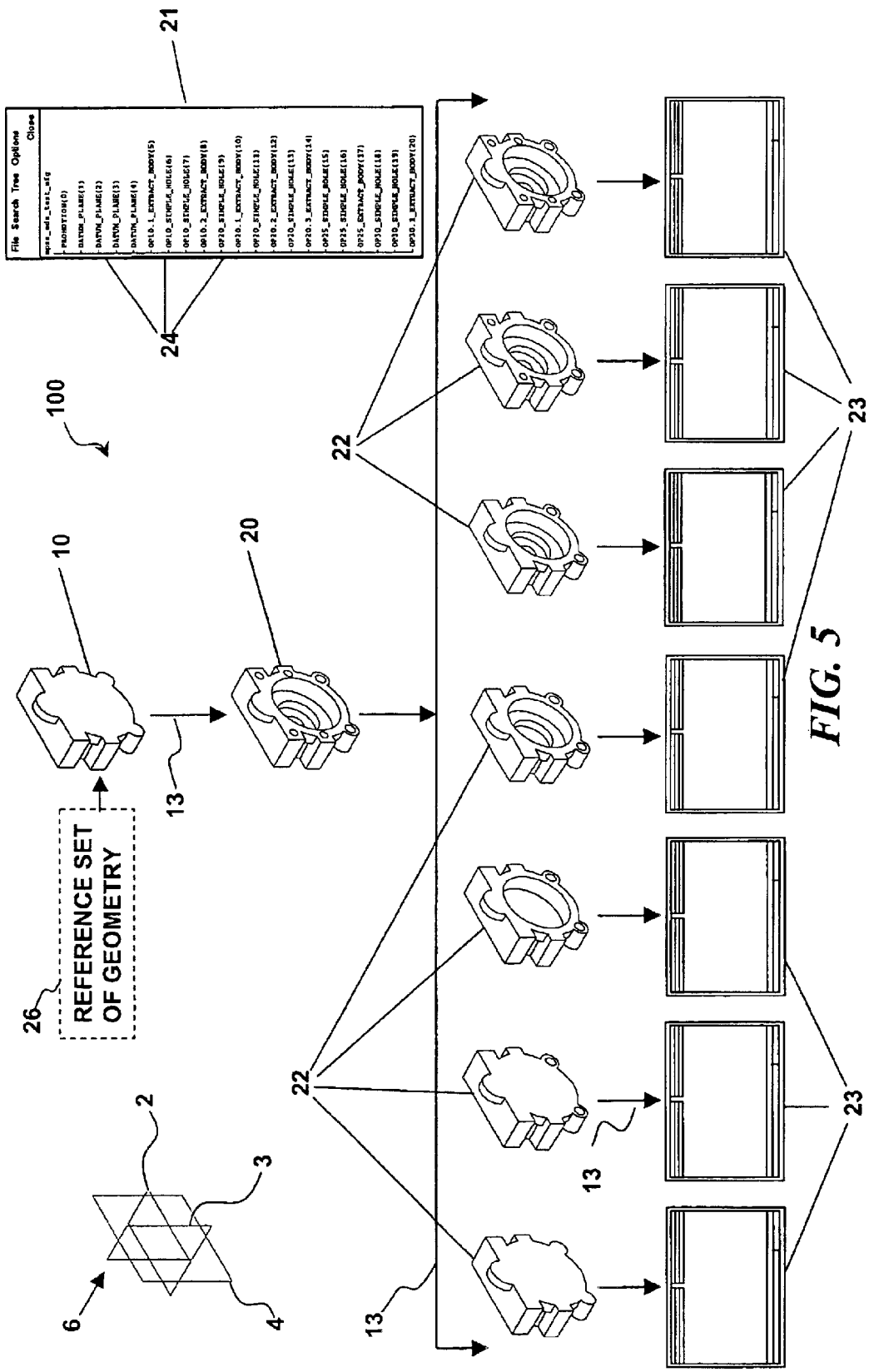
FIG. 5 is a schematic of the manufacturing process modeling method.

Referring to FIGS. 1 and 5, for a better understanding of the features of the disclosed embodiment, reference is made to the earlier disclosed enhanced modeling embodiment, as well as exemplified below. Therefore, the disclosure will be in reference to horizontally structured product modeling but is not to be construed as limited thereto. In reference to the modeling, once again, a suitable base feature 0 may be selected for developing a 3-D parametric solid model 100 with the horizontally structured modeling method.

FIG. 4 once again, shows the progressive building up of a model 100 via process depicted at A' through J'. The actual shape of the model 100 depicted in the figures is once again, purely for illustrative purposes, and is to be understood as not limiting, in any manner. Once again, in this embodiment, a set of coordinate references is established. These coordinate references including datum planes and axes exhibit the same characteristics, properties and relationships as described in the above mentioned embodiments and therefore will not be repeated here. Moreover, the relationships among the modeling elements are similar and need not be reiterated to illustrate the application of the exemplary embodiment.

Turning now to FIG. 4 and once again to the build up of the model 100 in an exemplary embodiment, at B', a base feature 0 is added as a first feature, assembly or a sketch to an existing coordinate system or associative datum plane structure comprising the first, second, and third datum planes 2, 3, and 4 respectively. Where in this instance, there is only a positional and orientational relationship but not necessarily an associative or parent child relationship among the first, second, and third datum planes 2, 3, and 4 respectively. The elimination of an associative relationship among the first, second, and third datum planes 2, 3, and 4 respectively, the 3-D coordinate system 6, and the base feature 0 provides significant latitude in the flexibility attributed to the 3-D coordinate system 6 and the base feature 0. Therefore, the datum plane structure comprising the first, second, and third datum planes 2, 3, and 4 respectively, may take its place as the zero'th level feature of the model 100. Thereafter, the base feature 0 is added at B' and the physical features, or form features 5a–5g are added at D' through J' in a manner similar to that described earlier. However, once again, it is noteworthy to appreciate that here a parent child relationship is eliminated between the base feature 0 and the physical features, or form features 5a–5g. In addition, an associative relationship, in this case a parent child relationship is created between the physical features, or form features 5a–5g and the first, second, and third datum planes 2, 3, and 4 respectively.

In an illustration of the exemplary embodiment the model 100 including the base feature 0, the first, second, and third datum planes 2, 3, and 4 respectively of the coordinate system 6, as well as the form features 5a–5g may be manipulated utilizing the link/unlink function to develop a model 100 or modify and existing model 100. In an example which exemplifies the features of the horizontally structured modeling would be to unlink one or more of the first, second, and third datum planes 2, 3, or 4 respectively with respect to the form features 5a–5g, thereby eliminating the associative relationships, thereafter, substituting a new or different datum planes and re-linking the form features 5a–5g to establish the associative relationships with the new datum planes. Such a capability makes extraordinary use of the datum planes or form features as interchangeable model elements. Note also, the converse is also possible where additional form features may be interchangeably utilized with a particular datum planes e.g., 2, 3, and 4.

In yet another illustration of the exemplary embodiment, a model element such a form feature 5b for instance may be linked to another form feature or a form feature of another model in such a manner that when a change is implemented which modifies the first form feature in this instance 5b, the second is automatically modified.

In this embodiment, once again, the physical features, or form features 5a–5g and the first, second, and third datum planes 2, 3, and 4 respectively, maintain an associative relationship, but neither with the base feature 0. When the 3-D coordinate system is established before the fundamental shape is placed on the screen and presented to the user, it simplifies substitution of the base feature 0 to other models. For example, where it may be desirable to change one base feature 0 for another, and yet preserve the later added physical features, or form features e.g., 5a–5g. The disclosed embodiment simplifies this process by eliminating the parent child relationship between the base feature 0 and the datum planes. Therefore, the base feature 0 may be removed and substituted with ease. Moreover, the physical features, or form features 5a–5g and the first, second, and third datum planes 2, 3, and 4 respectively, may easily be adapted to other base features of other models.

The described independence of the modeling and model element described above provides significant flexibility in the modeling process by allowing a user to interchangeably apply various features to a particular model 100. Likewise, interchangeable models may be generated without impacting the particular features or datum planes (e.g., 2, 3, and 4) utilized. For example, different base features 0 may be selected and a new model generated therefrom and subsequently, the same features and associated datums added. Moreover, links may be established between model elements to establish associative relationships such that when a change is made to a first model element, the change is automatically reflected in the linked element. Referring once again to FIGS. 1 and 4, the modeling process of the exemplary embodiment where form features are added to the base feature 0 is depicted. The process is similar to that disclosed above and therefore, need not be repeated.

Once again, one may recognize the model 100 as the completed horizontally structured model 100 depicted at J' in FIG. 4 including all of the "form features 5a–5g. Once again, some CAD/CAM software packages may require that the addition of the form features(s) 5a–5g to be in a particular order. Once again, in such a case, a method for reordering the features may prove beneficial.

It is noteworthy to appreciate that the link/unlink capability realizes its potential and significance primarily due to the characteristics of the horizontally structured model 100 and disclosed herein. Specifically, the separation/distribution of associative relationships in the models provides the enhanced flexibility and ease of model generation and modification achieved.

In contrast, in "vertical" modeling as depicted in FIG. 3, where the traditional approach to modeling was to create separate features in series. If a change or deletion was made in one model, it was necessary to individually update the entire model with all the subsequent features. Using the horizontally structured modeling disclosed herein and employing the modeling link/unlink capabilities, it is now possible to generate multiple horizontally structured models linked in a manner such that changes in one model are automatically carried out in other linked models.

Horizontally Structured Coordinate System

In the abovementioned embodiments, the Cartesian coordinate system employed as a reference for all subsequent measurements and reference was initially undefined. To establish a coordinate system (herein a 3-D coordinate system 6), modeling elements such as datum planes (e.g., 1, 2, 3, and 4) were created in reference to a base or parent feature 0. These datum planes (e.g., 2, 3, and 4) were used to define placement and positioning references for other modeling elements such as form features e.g., 5a–5g.

Employing the abovementioned method, removal of the parent feature e.g., base feature 0 or datum plane 1 results in a loss of associativity with the datum planes e.g., 2, 3, and 4 and the parent feature, which, in turn, results in the loss of any form features e.g., 5a–5g that are associated to these datums e.g., 2, 3, and 4. Therefore, it would be beneficial to modify features and modeling elements e.g., datums 2, 3, and 4 or form features 5a–5g without significant impact to the existing modeling elements.

One method of editing is to either delete features or modify them with the addition or subtraction of additional features. This approach can be time consuming and cumbersome. Moreover, datums that were previously either placed on or positioned relative to faces and edges, for example of a base feature 0, limit the manipulation of subsequent form features e.g., 5a–5g created in relationship to these datums e.g., 2, 3, and 4. Namely because the associative relationship established between the datums and the features prohibits the independent manipulation of child features or removal of the parent feature.

Figure 18:
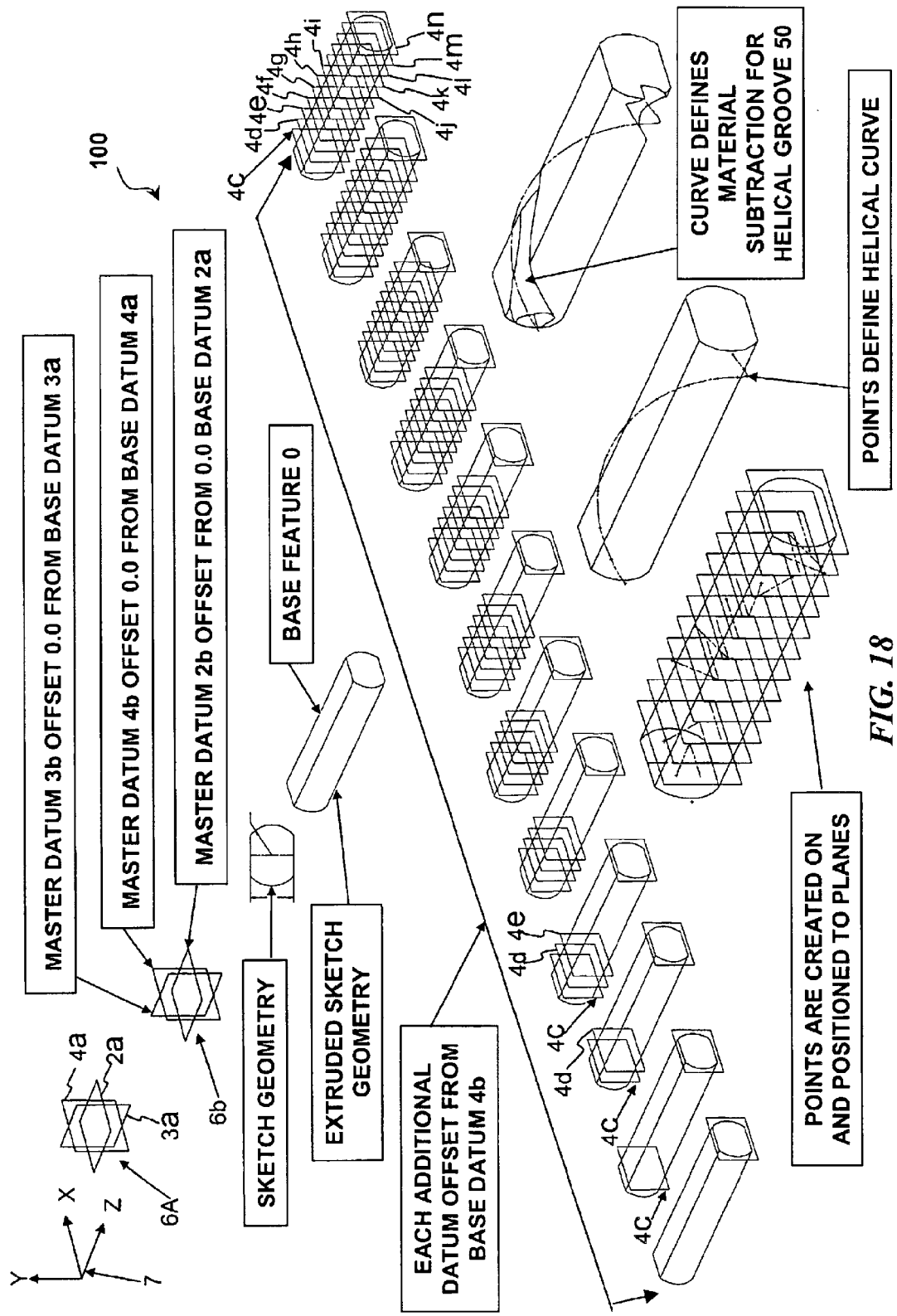
FIG. 18 depicts an exemplary embodiment of a horizontally structured 3-D coordinate system with multiple modeling elements.

Disclosed herein by way of an exemplary embodiment is a new methodology for establishing a reference coordinate system for subsequent modeling. Referring to FIG. 18, a 3-D coordinate system 6a is defined using three references in this instance, datum planes 2a, 3a, and 4a, respectively, denoted as base datums is created in accordance with an existing work coordinate system 7. The work coordinate system 7 is an arbitrary reference coordinate or measurement system inherent or generated in existing CAD systems. The references may be points, axes, lines, curves, datum planes, surfaces, bodies, regions, and the like, as well as combination including at least one of the foregoing. Hereinafter, the references shall be referred to as in this instance, datum planes 2a, 3a, and 4a respectively for clarity. Using datums, for example, these features become the basis of the horizontally structured model 100.

The 3-D coordinate system 6a comprising the datum planes 2a, 3a, and 4a may thereafter be referenced by subsequent constrained reference coordinate systems e.g., datums and/or modeling elements. The new configuration for the horizontally structured coordinate system facilitates model generation where a feature is placed and positioned, or an operation is performed independently according to the subsequent constrained references e.g., coordinate system(s), datums and the like. In such a configuration, if the parent feature is removed, there will be no loss of any associated child features. This independence of the various modeling elements also allows for the addition, subtraction, and reordering of new or existing modeling elements.

Figure 19:
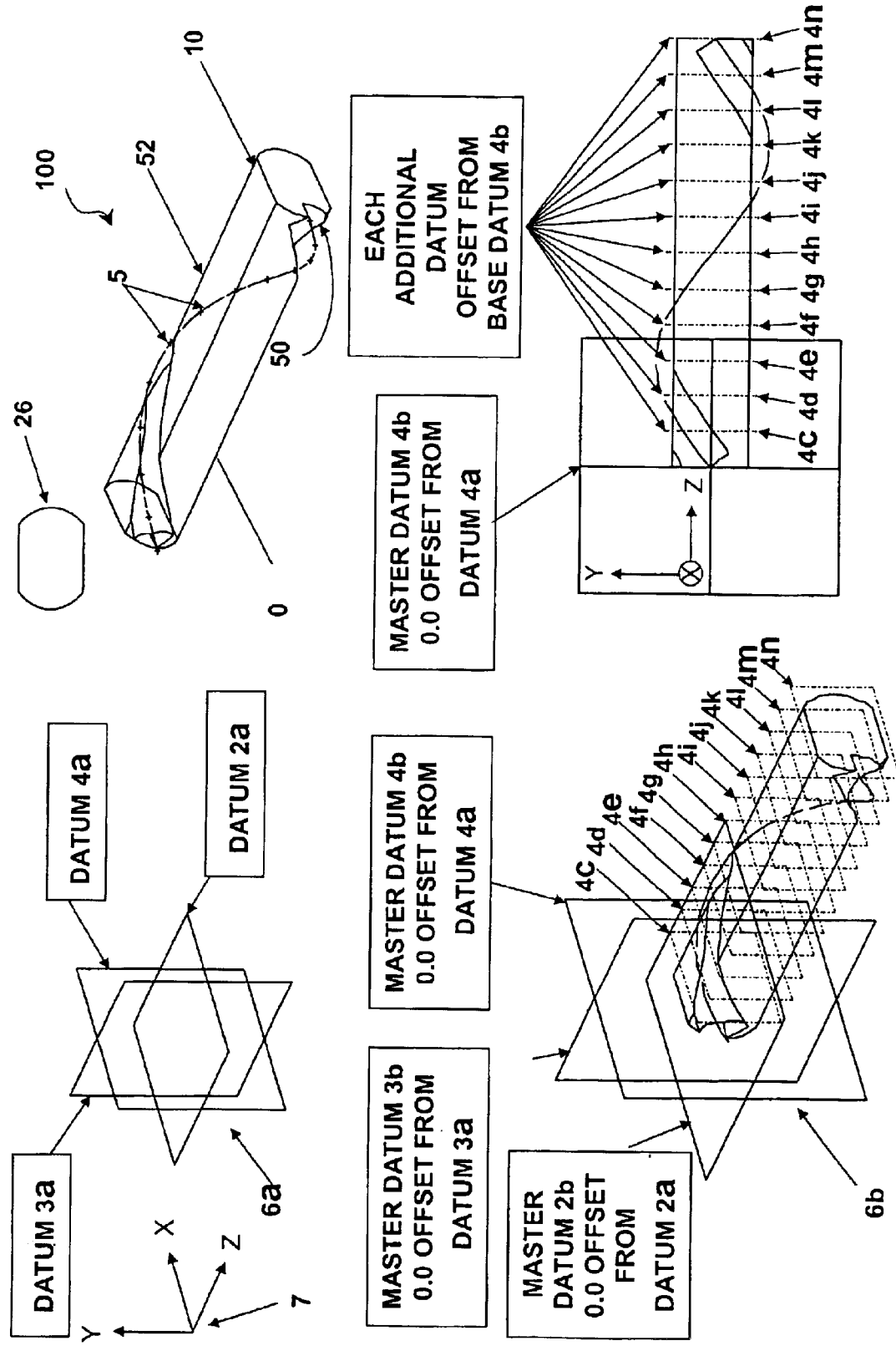
FIG. 19 depicts an exemplary embodiment of a horizontally structured 3-D coordinate system with multiple modeling elements.

For example, a Cartesian coordinate system creates such a 3-D coordinate system. A base feature is then created and positioned relative to these datums. To illustrate, referring to FIGS. 18 and 19, another 3-D coordinate system 6b comprising (in this example) a set of three additional datums may be established. The three new datums denoted as master datums 2b, 3b, and 4b respectively are depicted with a zero offset from the datums 2a, 3a, and 4a respectively. Further, a series of positioning datums 4c–4n is created, each depicted with offsets along the z-axis from master datum 4b. For example, as depicted in the figure, a base feature 0 is modeled as an extrusion from a geometry, in this instance, a rectangular shape with radial two radial opposing sides. The base feature 0 is modeled by translating the geometry along the z-axis forming the solid model depicted. Thereafter, one or more additional datums e.g. 4c–4n are positioned with offsets along the z-axis. Each of the additional datums e.g. 4c–4n includes no associative relationship with another, only (in this instance) with datum 4b. Thereafter, additional modeling elements may be added with associative relationships to any of the datums where a modeling element, e.g., a form feature (5a for example) is referenced to one of the coordinate system e.g., 6a, datums etc. while another modeling element e.g., another form feature (5b for example) is referenced to coordinate system 6b, or a datum. Moreover as shown in the figure, a series of form features (or any modeling element for that matter) may be created each including associative relationships with one or more of the respective datums 4c–4n. In such a fashion, if the coordinates for a particular datum are later modified, the form features that include associative relationships with that particular datum would also include the modification. For example, if datum 4n is later offset further along the Z-axis, the form features e.g., 5 that includes an associative relationship with that datum would also now include the modified offset. For example, as depicted in FIG. 19, the base feature 0 (depicted here as a rectangular shape with radial two radial opposing sides) is oriented along the z axis. Thereafter, a series of form features 5 (in this instance points) are determined and established along each of the datum planes 4b–4n respectively where the respective datum planes 4b–4n intersect the surface of the base feature 0, to establish a helical path 52 for a tool to follow. The base feature may then be virtual machined with a selected tool of selected dimensions to establish a helical groove 50 cut into the base feature 0 and thereby completing a 3-D model for the part.

Additional references may be created and association established to the various references and modeling elements. The references may be points, axes, lines, curves, datum planes, surfaces, bodies, regions, and the like, as well as combination including at least one of the foregoing. In an exemplary embodiment, datums are described as references and various for features are created and positioned relative and associated to these datums. These datums may be positionally constrained with numeric values or expression parameters from existing modeling features, after which, all consecutive child modeling elements features are created preferably using the Horizontally Structured CAD/CAM Modeling techniques as described above.

Virtual Fixture Tooling Modeling

Manufacturing tool and fixture drawings are often created and maintained as two-dimensional. This practice results in the manual editing of drawings. Moreover, such practice foregoes the generation of a three dimensional parametric solid model, which facilitates down stream applications. Significantly, manual editing eventually produces drawings, which may not be true to size. More damaging, is that many operators may avoid investing the time to incorporate the exact dimensional changes made to a part in the drawings, especially on two dimensional, tool, and fixture drawings.

The model link/unlink functionality coupled with the horizontally structured modeling as disclosed earlier brings forth new opportunities for enhancement of CAD/CAM modeling and manufacturing process modeling. One such opportunity is horizontally structured CAD/CAM modeling and manufacturing process modeling methods to facilitate virtual fixture and tooling product and process design. An exemplary embodiment addresses the deficiencies of known tooling and fixture design and modeling methods by creating linkages to a model, for example a casting model, and to the required in-process models for the finished component or product and the manufacturing process for the product.

A method is disclosed which automates the process of generating and editing contact tooling and fixture drawings. This new process creates a 3-D parametric solid model of contact tools and fixtures by linking the contact area of a tool and/or fixture to its corresponding reference set, production part model, in-process models, or other models, and the like including combinations of the foregoing. Thereby, a contact area geometry exhibiting associative relationships with a modeled part will be automatically updated as the linked part is modified.

For a better understanding of the features of the disclosed embodiment, reference is made to the earlier disclosed horizontally structured modeling including model link/unlink disclosed above and the horizontally structured manufacturing process modeling disclosed herein, and as further exemplified below. The exemplary embodiment is described by illustration of additional features subsequent to the abovementioned embodiments. Therefore, the disclosure will be in reference to and illustrated using horizontally structured CAD/CAM modeling and manufacturing process modeling as an example but is not to be construed as limited thereto. Additionally, reference should be made to the Virtual Fixture Tooling Manufacturing Process disclosed at a later point herein.

In the disclosed embodiment, horizontally structured modeling methods as disclosed above are employed to facilitate the generation of a product design model for creating an actual part and the tooling and fixtures therefor. In an exemplary embodiment, a model is developed to facilitate the creation of the tooling/fixtures corresponding to an actual part modeled or manufactured. In this instance, similar to the models and master process models disclosed herein includes associative relationships (e.g. links) configured such that changes in model are reflected in all the subsequent linked models or modeling elements, including, but not limited to reference sets, virtual blanks, product models, process models, in-process models or extracts, process sheets, product drawings, and the like including combinations of the foregoing. Moreover, changes in such a model may as disclosed herein, also be reflected in tooling and fixture models, which are likewise, subsequently reflected in tooling and fixture drawings.

Figure 15:
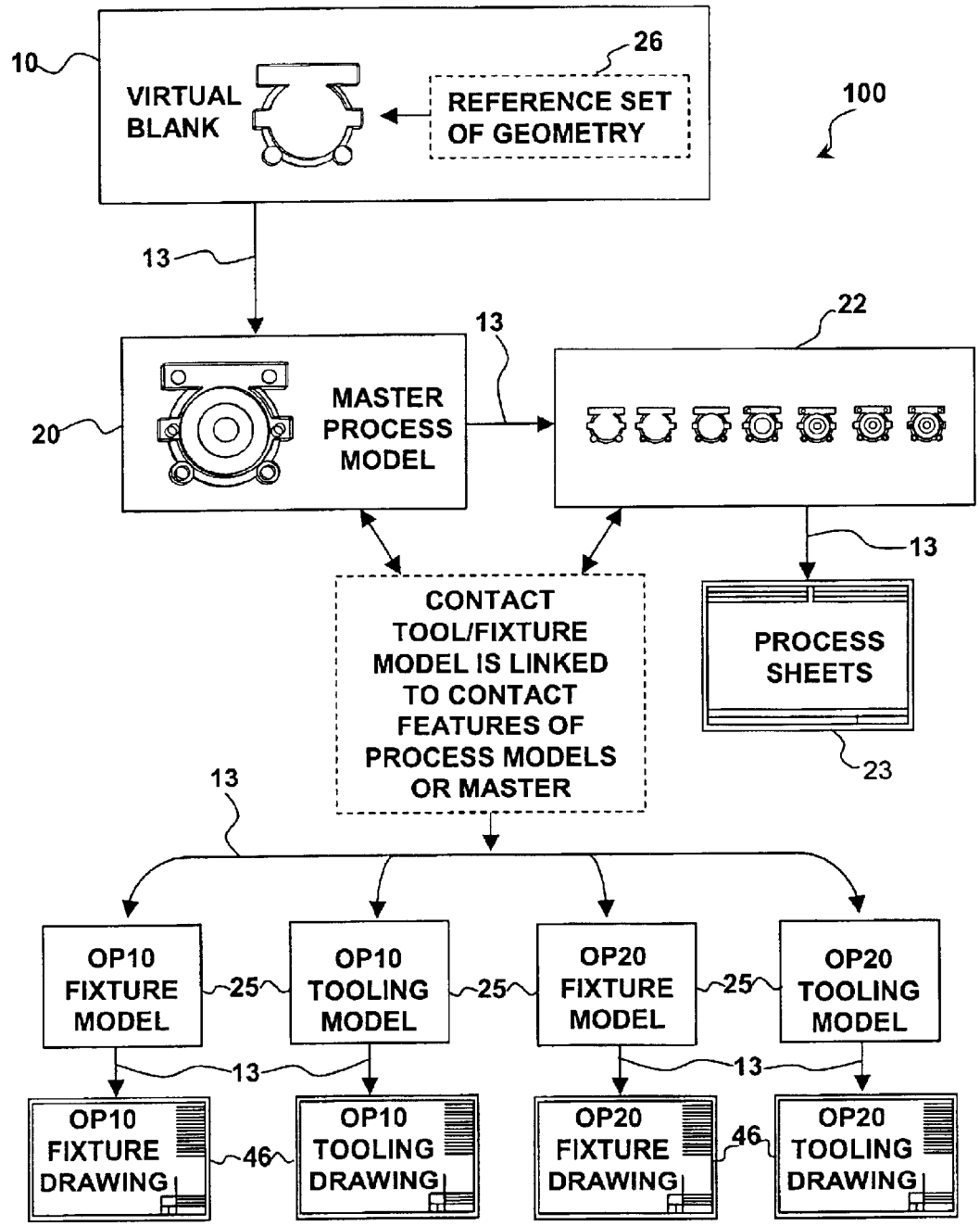
FIG. 15 is a diagram depicting the virtual fixture/tooling manufacturing process modeling.

Referring now to FIG. 15, as well as FIGS. 4 and 5 to facilitate the disclosed embodiment, the link/unlink and extraction functions disclosed and described herein are once again employed. To execute generating a model configured to facilitate tooling and fixture generation, once again in the same manner as described in the embodiments above, a 3-D parametric solid model representative of a selected contact geometry is selected, created, or generated in a manner similar to those described in the abovementioned embodiments.

In an exemplary embodiment, for a model for a part, selected two-dimensional (2-D) contact area geometries and/or surfaces are established for tooling and fixtures. Associative relationships are established with such contact areas and surfaces. The selected contact area 2-D geometries are linked as described earlier, and established a new 2-D reference set. A new file may be created, and the new 2-D reference set is imported to create the virtual tool or fixture. Similar to the abovementioned embodiments, in a Unigraphics® environment, a linked reference geometry is generated via the Wave link function from the new reference set. The linked 2-D reference geometry is then extruded to create a new 3-D parametric solid model for the virtual tool or fixture. This model may be termed a tooling model 25. The extrusion process is a method by which the linked 2-D reference geometry is expanded into a third dimension to 3-D parametric solid model. For example, a 2-D reference geometry of a circle may be extruded into a 3-D solid cylinder. The 3-D solid model now represents the contact tool and corresponds to the feature that is modeled or machined into the actual part.

In an exemplary embodiment the tooling model 25, may be generated as described above. It should be noted that the generation of the tooling model 25 as disclosed herein is illustrative and not limited to the disclosed embodiment. Other methods for generating models such as product models, process models, in-process models as well as extracts and extrusions thereof, and the like, as well as combinations of the foregoing are possible and contemplated. The tooling model 25, a 3-D parametric solid model exhibits characteristics similar to those of other product models or master process models as disclosed in the abovementioned embodiments. Once again, this tooling model 25, logically, is a child of the reference set or referenced geometry 26. The new tooling model 25 includes, but is not limited to the elements, characteristics, and relationships of a part model, reference set 26, virtual blank 10 or casting, or master process model as in the horizontally structured manufacturing process modeling disclosed herein. Moreover, the relationships among the model elements, including, but not limited to, positional, orientational, associative, and the like, as well as combination of the foregoing are also acquired and retained. To avoid duplication, reference may be made to the abovementioned embodiments for insight concerning horizontally structured model characteristics and relationships. Moreover, in a similar fashion to the product modeling and manufacturing process modeling, no mandatory associative relationship need exist among the tooling model 25 and the first, second, and third datum planes 2, 3, and 4 respectively (e.g., FIG. 4).

The first, second, and third datum planes 2, 3, and 4 respectively, comprise the reference 3-D coordinate system 6 with respect to which, the form features (e.g. 5a–5g) and manufacturing features 12a–12j (see FIG. 6) are positioned and oriented.

Therefore, now the tooling model 25 may be manipulated and modified as required via modeling and virtual machining processes to model the creation of the tool or fixture. (Please see also the Virtual Fixture Tooling Manufacturing Process). The tooling model 25 is utilized to ultimately generate a tool/fixture drawing 46 depicting the design of a tool or fixture. The tool/fixture drawing 46 includes the information required to define the tool/fixture, including, but not limited to, materials, characteristics, dimensions, requirements for the designed part or product, and the like, as well as combinations of the foregoing.

The modeling characteristics described above, once again, provide significant flexibility in the product design modeling, tooling/fixture design, and manufacturing process modeling by allowing a user to interchangeably apply various form features (e.g., 5a–5g) or manufacturing features (e.g., 12a–12j) to a particular model, in this instance a tooling model 25. Likewise, interchangeable tooling models may be generated without impacting the particular manufacturing features applied to the tool or fixture, or datum planes (e.g., 2, 3, and 4) utilized. For example, different reference sets 26 may be selected and a new tooling model 25 generated therefrom and subsequently, the same manufacturing features 12a–12j added with associated datum planes (e.g., 2, 3, and 4). Moreover, in a similar fashion, a variety of interchangeable features may be added to multiple tooling models generated from common referenced geometries.

It is noteworthy to appreciate that the virtual tool and fixture design modeling capability disclosed herein realizes its potential and significance primarily due to the characteristics of the horizontally structured model and manufacturing processes disclosed herein and concurrent product and process design modeling. Specifically, the separation/distribution of associative relationships in the models provides the enhancement achieved. In contrast, in "vertical" modeling methods and tool design, where the traditional approach was to create separate models for product design, tool/fixture design and manufacturing process. If a change or deletion was made in one model, it was necessary to manually update the other models having the same part. Using the horizontally structured modeling disclosed herein and employing the model link/unlink capabilities, it is now possible to generate horizontally structured models linked in a manner such that changes are automatically carried out in both the product design, manufacturing, and tooling/fixture models enabling significantly enhanced design, tooling, and manufacturing processes. Further, it is noteworthy to appreciate that the subsequent process sheets 23, and tooling/fixture drawings 46 that are linked thereto are automatically updated.

The Manufacturing Process

The manufacturing process of a disclosed embodiment utilizes the horizontal CAD/CAM methods described above to ultimately generate process instructions and documentation used to control automated machinery to create a real-world part based on a horizontally-structured model. In a preferred method, "extracts" are used to generate process sheets or other instructions for each requirement for machining of the real-world part.

Figure 6:
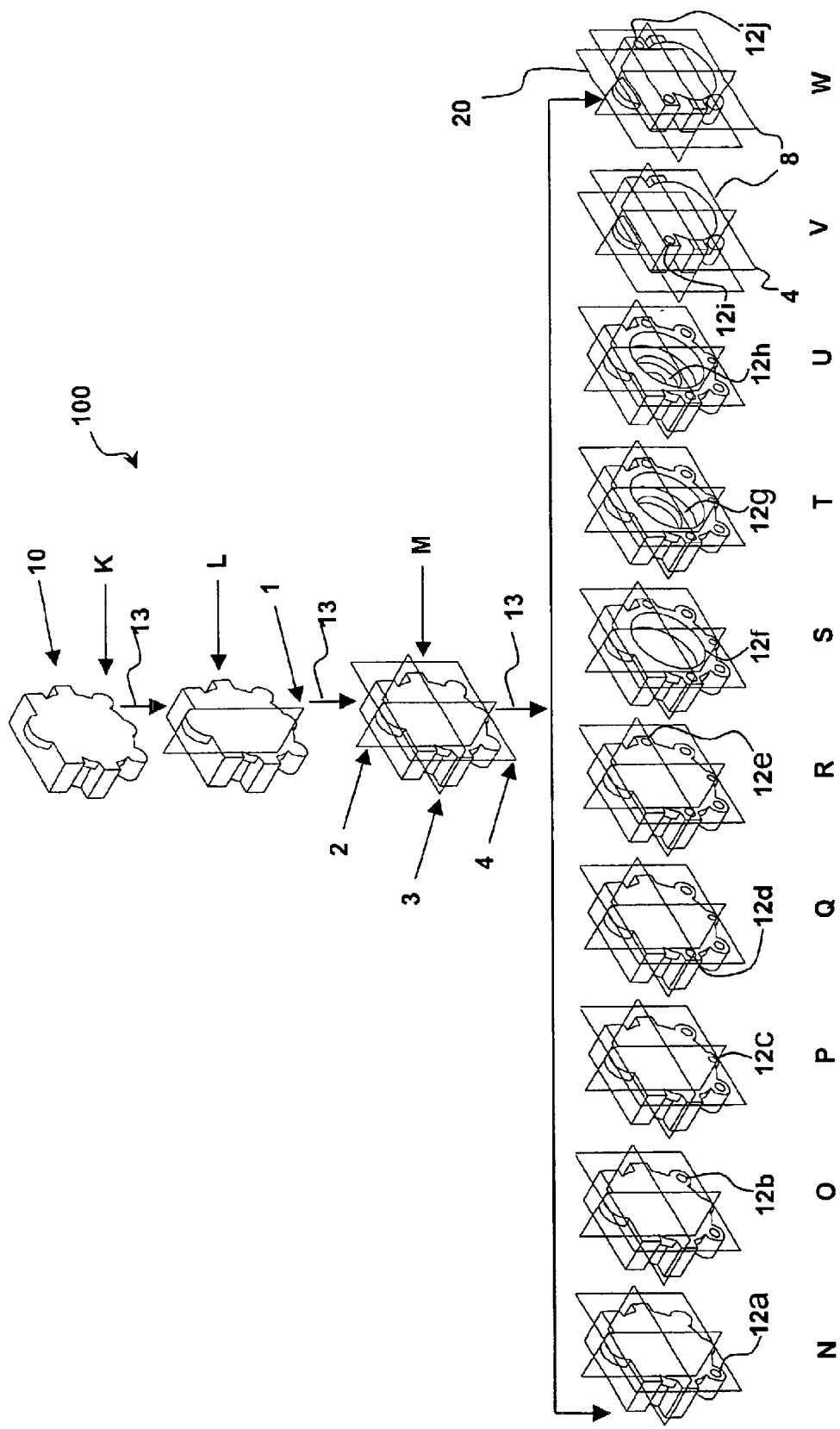
FIG. 6 depicts the virtual machining of the manufacturing process modeling method.

Referring to FIGS. 5 and 6, to initiate the manufacturing process and virtual machining, a suitable blank may be selected or created, usually a cast piece, the dimensions and measurements of which are used as the virtual blank 10 for the virtual machining of the 3-D parametric solid model with the horizontally structured manufacturing method. Alternatively, a virtual blank 10 may be selected, and a blank manufactured to match. For example, in the Unigraphics® environment, a suitable blank or component is selected, a virtual blank 10 is generated therefrom, commonly a referenced set of geometries from a model termed a reference set 26 (e.g., a built up product model of a part). From this referenced set of geometries a three-dimensional (3-D) parametric solid model termed a virtual blank 10 may be generated or created for example via the Wave link or Promotion process of Unigraphics®, which includes all of the modeled details of the completed part.

Once a virtual blank 10 has been established that corresponds to a real-world blank, a horizontally-structured 3-D parametric solid model is created in a manner that describes machining operations to be performed on the blank so as to produce the final real-world part. This horizontally structured model will be referred to as the master process model 20. It is noteworthy to appreciate that the master process model 20 depicted includes with it, but is not limited to, the virtual blank 10, added manufacturing features 12a–12j by way of virtual machining, and datum planes 2, 3, and 4 all in their respective associative relationships as exhibited from the geometries and characteristics of the reference set 26.

FIG. 6 depicts the virtual machining process of the exemplary embodiment where manufacturing features are "machined" into the virtual blank 10. For example, at N, O, and P various holes are "drilled" into the virtual blank 10 as manufacturing features 12a, 12b, and 12c respectively. Moreover, at S a large hole is created via a boring operation at 12f. It is also noted once again, just as in the horizontally structured modeling methods discussed above, that the datum planes 2, 3, and 4 may be added as features to the 3-D coordinate system as children just like any form feature (e.g., 5a–5g) or manufacturing feature 12a–12j. These may be added as needed to position other features, or to place them on surfaces in addition to the datum planes 2, 3, and 4. For example as shown in FIG. 6 at V, such an added plane may be created as a child of the virtual blank 10 just as the third datum plane 4 is. Moreover, at V the model has been flipped around and a face plane 8 is placed on the back as a child of the virtual blank 10. This allows manufacturing features 12i and 12j to be placed on the back of the object, in this case "counter-bores" for the holes "drilled" through the front earlier.

Figure 7:
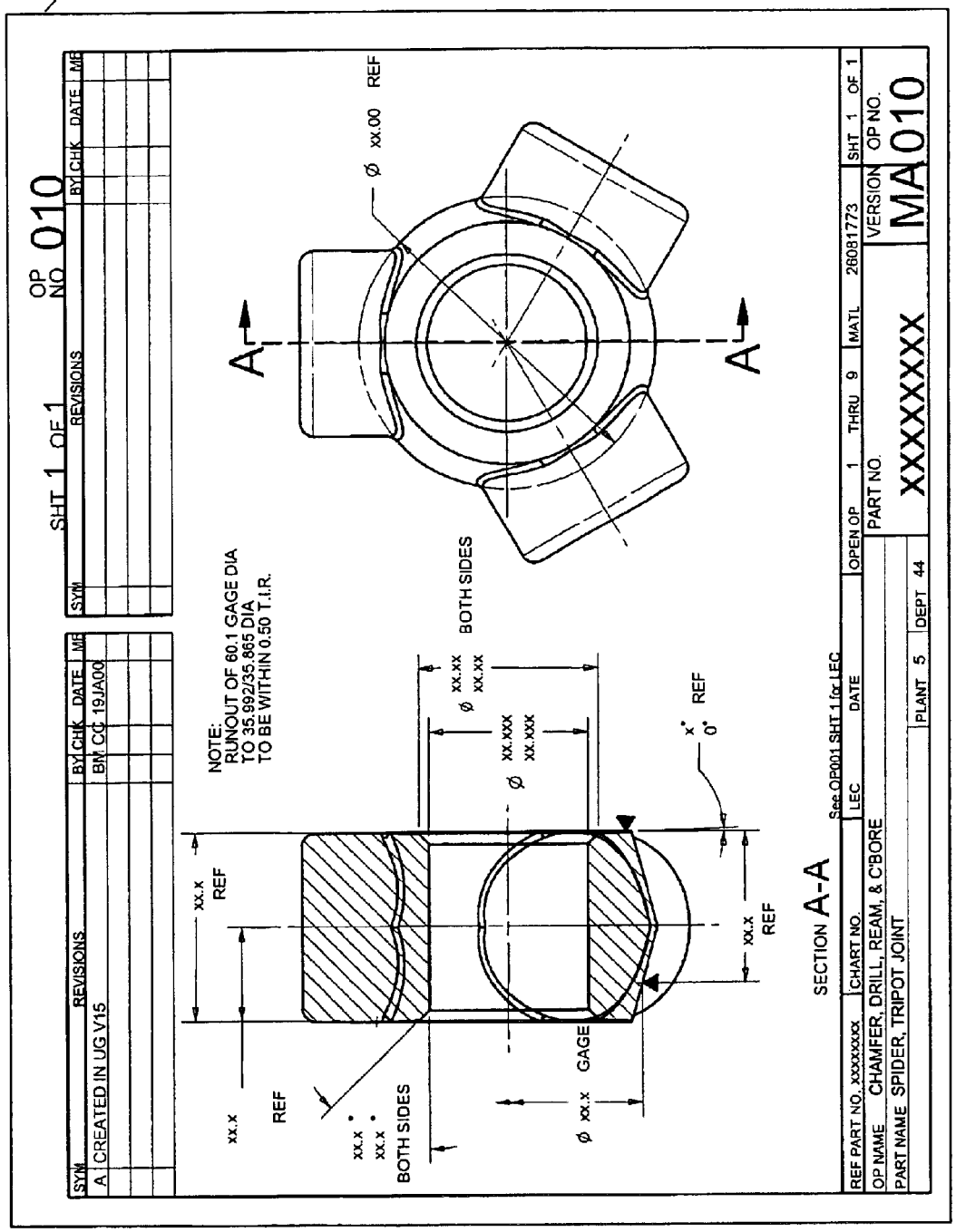
FIG. 7 shows a typical process sheet.

One may recognize the master process model 20 as the completed horizontally structured model depicted at W in FIG. 6 including all of the "machining" operations. Referring again to FIG. 4, some CAD/CAM software packages may require that the addition of the features be in a particular order, for example, in the same order as manufacture. In such a case, a method for reordering the features is beneficial. In this case, the reordering method is a displayed list of features 24 that the user may manipulate, the order of features in the list corresponding to that in the master process model 20. Process instructions and documentation termed process sheets 23 are then generated from each operation. The process sheets 23 are used to depict real-time in-process geometry representing a part being machined and can be read by machine operators to instruct them to precisely machine the part. An example of a Unigraphics® process sheet 23 is shown in FIG. 7. The geometry can then be used to direct downstream applications, such as cutter paths for Computer Numerical Code (CNC) machines. In an embodiment, the software is adapted to generate such CNC code directly and thereby control the machining process with minimal human intervention or even without human intervention at all. For example, in the Unigraphics® environment, CNC code is generated by the Manufacturing software module, which is configured to automate the machining process.

The traditional approach to manufacturing modeling is to create individual models representing the real-world component at particular operations in the manufacturing process. If a change or deletion is made in one model, it is necessary to individually update each of the other models having the same part. Using the horizontally structured modeling disclosed herein, it is now possible to generate a horizontally structured master process model 20 and generate a set of process sheets 23 that are linked thereto. Any changes to the master process model 20 are reflected in all the process sheets 23.

As seen in FIG. 5, this linkage between the master process model 20 and the process sheets 23 is preferably achieved through the use of extracted in-process models, called virtual extract(s) or extracted bodies, hereinafter denoted extract(s) 22, that are time stamped and linked to the master process model 20. Each in-process model 22 represents part of the manufacturing process and each is a child of the master process model 20. Any changes to the master process model 20 are automatically reflected in all the relevant extract(s) 22, but changes to the extract(s) 22 have no effect on the master process model 20. Each in-process model 22 is a three-dimensional snapshot of the master process model 20 at a moment in "time" of its creation. The in-process models 22 created for each operation are children of the master process model 20. By changing the master process model 20, the in-process models 22, and therefore, the manufacturing process is automatically updated.

The order of creation of the in-process models 22 is preferably dictated by a user-friendly graphical interface 21, hereinafter referred to as a model navigation tool 21. The model navigation tool 21 will preferably allow the user to arrange the order of features through simple mouse operations to make manipulation of the master process model 20 as simple and intuitive as practicable. In the Unigraphics® software, a model navigation tool provides similar functionality and capability. In the example depicted at FIG. 6, a process sheet 23 is generated for each in-process model 22 in one-to-one correspondence. Since the master process model 20 is preferably created using the horizontally-structured methods described above, editing the master process model 20 is a simple and expedited matter of adding, editing, suppressing, or deleting individual features of the master process model 20, which through the extract(s) 22 will automatically update all the process sheet(s) 23. In a similar example, the disclosed method of generating process sheets has resulted in a 50% reduction in the time needed to create new process sheets and an 80% reduction in the time required to revise existing process sheets over the "vertical" modeling methods.

Further, this principle may be extended downstream in the manufacturing process model by utilizing the electronic data for CNC programs, tooling (i.e., cutting tool selection), and fixture design by direct transmission to the machining tools without the need for process sheets 23 and human intervention. For example, in the Unigraphics® environment, this may be achieved by creating a reference set to the particular in-process model 22 and including it in to a new file via virtual assembly, similar to the method employed for the creation of the virtual blank 10 discussed earlier. The in-process model 22 therefore, is used to create the corresponding geometry. Software must then be provided to adapt the CAD/CAM software to translate the geometry into CNC form.

The method leading to generating process sheets 23 initiates with selection of a virtual blank 10 and then proceeding to add via virtual machining, manufacturing features (12a–12j) to the virtual blank 10 in a horizontally-structured manner as described earlier. Following each virtual machining operation, an in-process model 22 is made representing the state of the master process model 20 at that instant of the manufacturing process. The order in which the features are machined onto the real-world part is decided either through automated means or manually by the user with the model navigation tool 21. In the Unigraphics® environment an "extract" is then preferably made of the master process model 20 corresponding to each added feature representing a manufacturing position or operation. The "extraction" is accomplished through a software module provided with the CAD/CAM software, otherwise the user may create a software program for the process. In Unigraphics® software, a Modeling Module includes software configured to handle the extraction process. The process sheets 23 may then be created from the in-process models 22 that are added into the Drafting Module of the Unigraphics® software.

One may think of an in-process model 22 as a three-dimensional "snapshot" of the assembly of the master process model 20 in progress, showing all of the manufacturing features 12a–12j up to that operation in the assembly, but none that come after it. The process sheet 23 derived from the in-process model 22 contains the instructions to machine the latest feature that appears at that "snapshot" in time. In the Unigraphics® environment, an in-process model 22 is an associative replica of master process model 20 depicting only those features, which have been added to that point in the manufacturing process. It is noteworthy to appreciate that; manufacturing features 12a–12j may thereafter be added to the in-process model 22 without appearing in the master process model 20, however any manufacturing features 12a–12j added to the master process model 20 will appear in the in-process model 22 if the particular manufacturing feature (e.g. one of 12a–12j) is directed to be added at or before the manufacturing procedure represented by the in-process model 22.

Referring to FIGS. 5 and 7, there is shown a typical process sheet 23. A process sheet 23 is a document defining the sequence of operations, process dimensions, and listing of equipment, tools, and gauges required to perform an operation. Manufacturing personnel utilize process sheets to obtain the detailed information required to manufacture and inspect the components depicted thereon. Each process sheet 23 includes, but is not limited to, both graphics and text. The graphics may include the dimensional characteristics of the part for the particular portion of the manufacturing process, the text contains various data identifying the part and operation and noting revisions. In the example shown in FIG. 7, we see a part called a "Tripod Joint Spider." The operation that this process sheet depicts is number 10 in a set of operations and is described as a "drill, chamfer and ream" and it may be seen by the graphics that a 41 mm hole is to be drilled through the part and chamfered out 48 deg from the central axis of the hole (or 42 deg from the surface of the spider joint) on both sides.

Enhancement to Horizontally Structured Manufacturing Process Modeling

A first alternative embodiment of the manufacturing process is disclosed which utilizes the horizontal CAD/CAM modeling methods described above to ultimately generate process instructions and documentation used to control automated machinery to create a real-world part based on a horizontally-structured model. In a preferred method, process model "extracts" are used to generate process sheets or other instructions for each procedure to machine the real-world part.

Figure 8:
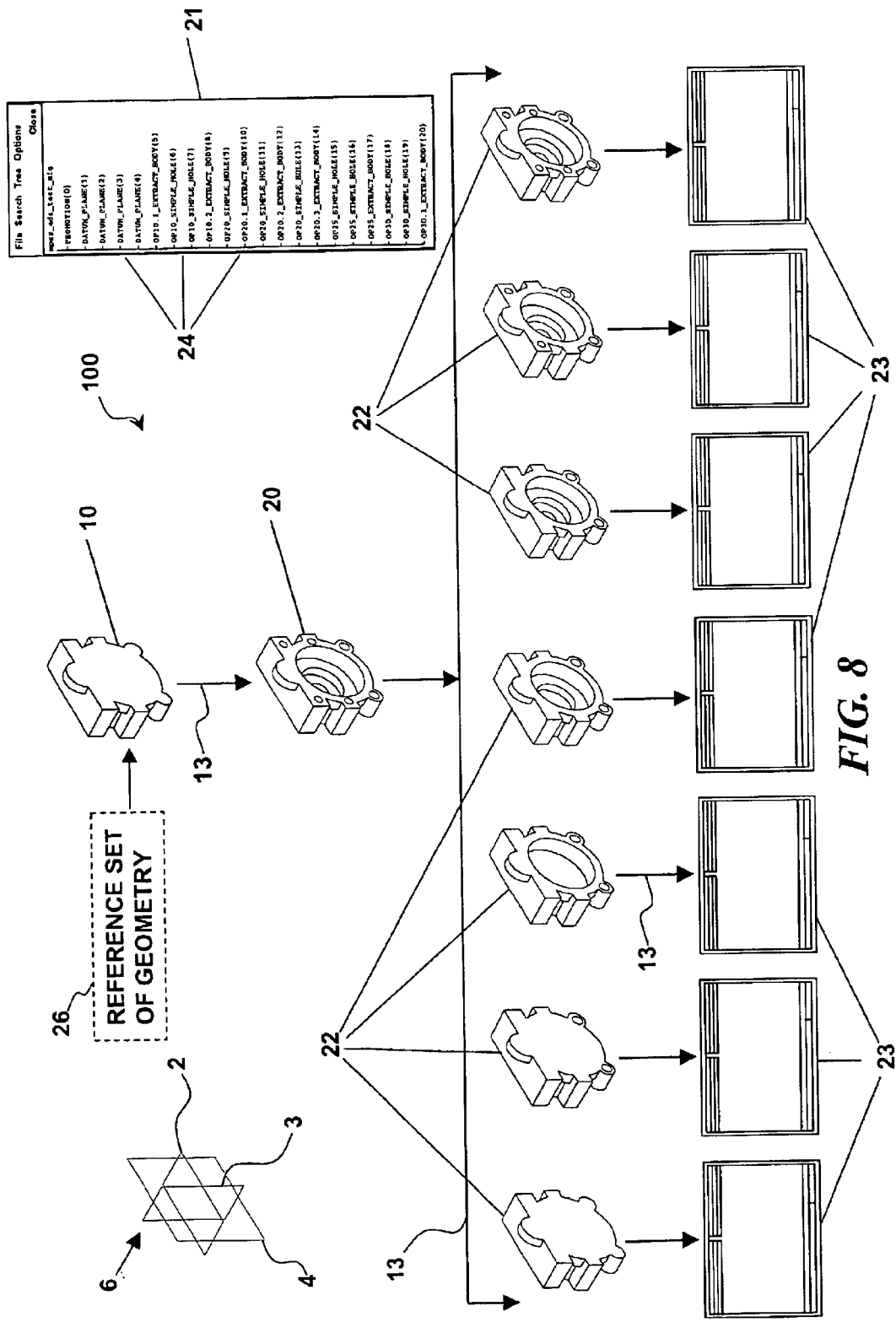
FIG. 8 is a schematic of the enhanced horizontally structured manufacturing process.

Referring to FIG. 8, to initiate the manufacturing process and virtual machining, once again, a suitable blank may be selected or created, for example, a cast piece, the dimensions and measurements of which, are used as the virtual blank 10 for the virtual machining of the 3-D parametric solid model with the horizontally structured manufacturing method. Alternatively, a virtual blank 10 may be selected, and a blank could be manufactured to match it. This alternative may prove be less desirable as it would incorporate additional machining which would not be necessary if the virtual blank 10 initiates with the blank's dimensions. It is nonetheless stated to note that the method disclosed includes, and is not limited to a variety of approaches for establishing the blank and a representative virtual blank 10 for the model.

For example, in the Unigraphics® environment, a suitable blank or component is selected. A virtual blank 10 is generated therefrom, commonly a referenced set of geometries from a model termed a reference set 26 shown in FIG. 9 (e.g., a built up product model of a part). From this referenced set of geometries a three-dimensional virtual blank 10 model may be generated or created for example via the Wave link or Promotion process of Unigraphics®, which includes all of the modeled details of the completed part.

Once a virtual blank 10 has been established that corresponds to a real-world blank, a horizontally-structured 3-D parametric solid model is generated or created in a manner that describes machining operations to be performed on the blank so as to produce the final real-world part. This horizontally structured model will be referred to as the master process model 20. It is noteworthy to appreciate that the master process model 20 depicted includes with it, but is not limited to, the virtual blank 10, added manufacturing features 12a–12j by way of virtual machining, and datum planes 2, 3, and 4 all in their respective associative relationships as exhibited from the geometries and characteristics of the reference set 26.

The master process model 20, logically, is a child of the reference set 26 and virtual blank 10, thereby ensuring that if a design change is implemented in the product model utilized for the reference set 26, such a change flows through to the master process model 20 and manufacturing process. Unique to this embodiment, is the lack of a mandatory associative relationship among the master process model 20 and the datum planes 2, 3, and 4 which comprise the reference 3-D coordinate system 6 with respect to which, the form features and manufacturing features are positioned and oriented. Moreover, also unique to this embodiment, is the absence of a mandatory associative relationship among the datum planes 2, 3, and 4 themselves. This independence, as with the modeling described above provides significant flexibility in the manufacturing process by allowing a user to interchangeably apply various features to a master process model. Likewise, interchangeable master process models may be generated without impacting the particular features or datum planes utilized.

Referring once again to FIG. 6, the virtual machining process of the exemplary embodiment where manufacturing features are "machined" into the virtual blank 10 is depicted. For example, at N, O, and P various holes are "drilled" into the virtual blank 10 as manufacturing features 12a, 12b, and 12c respectively. Moreover, at S a large hole is created via boring operation at 12f. It is also noted once again, just as in the horizontally structured modeling methods discussed above, that the datum planes 2, 3, and 4 may be added as features to the 3-D coordinate system as children just like any form feature (e.g., 5a–5g) or manufacturing feature 12a–12j. These may be added as needed to position other features, or to place them on surfaces in addition to the datum planes 2, 3, and 4. For example as shown in FIG. 6 at V, such an added plane may be created as a child of the virtual blank 10 just as the third datum plane 4 is. Moreover, at V the model has been flipped around and a face plane 8 is placed on the back as a child of the virtual blank 10. This allows manufacturing features 12i and 12j to be placed on the back of the object, in this case "counter-bores" for the holes "drilled" through the front earlier.

Once again, one may recognize the master process model 20 as the completed horizontally structured model depicted at W in FIG. 6 including all of the "machining" operations. Referring again to FIG. 8, similar to the horizontally structured modeling disclosure above, some CAD/CAM software packages may require that the addition of the manufacturing features 12a–12j to be in a particular order, for example, in the same order as manufacture. In such a case, a method for reordering the features may prove beneficial. In this case, the reordering method is a displayed list of features 24 that the user may manipulate, the order of features in the list corresponding to that in the master process model 20. Here again, as stated earlier, process instructions and documentation termed process sheets 23 are then generated from each operation. The process sheets 23 are used to depict real-time in-process geometry representing a part being machined and can be read by machine operators to instruct them to precisely machine the part. Once again, an example of a Unigraphics® process sheet 23 is shown in FIG. 7. The geometry can then be used to direct downstream applications, such as cutter paths for Computer Numerical Code (CNC) machines. In a preferred embodiment, the software is adapted to generate such CNC code directly and thereby control the machining process with minimal human intervention or even without human intervention at all.

The traditional approach to manufacturing modeling was to create individual models representing the real-world component at particular operation in the manufacturing process. If a change or deletion was made in one model, it was necessary to individually update each of the other models having the same part. Using the horizontally structured modeling disclosed herein, it is now possible to generate a horizontally structured master process model 20 and generate a set of process sheets 23 that are linked thereto. Any changes to the master process model 20 are reflected in all the process sheets 23.

Figure 9:
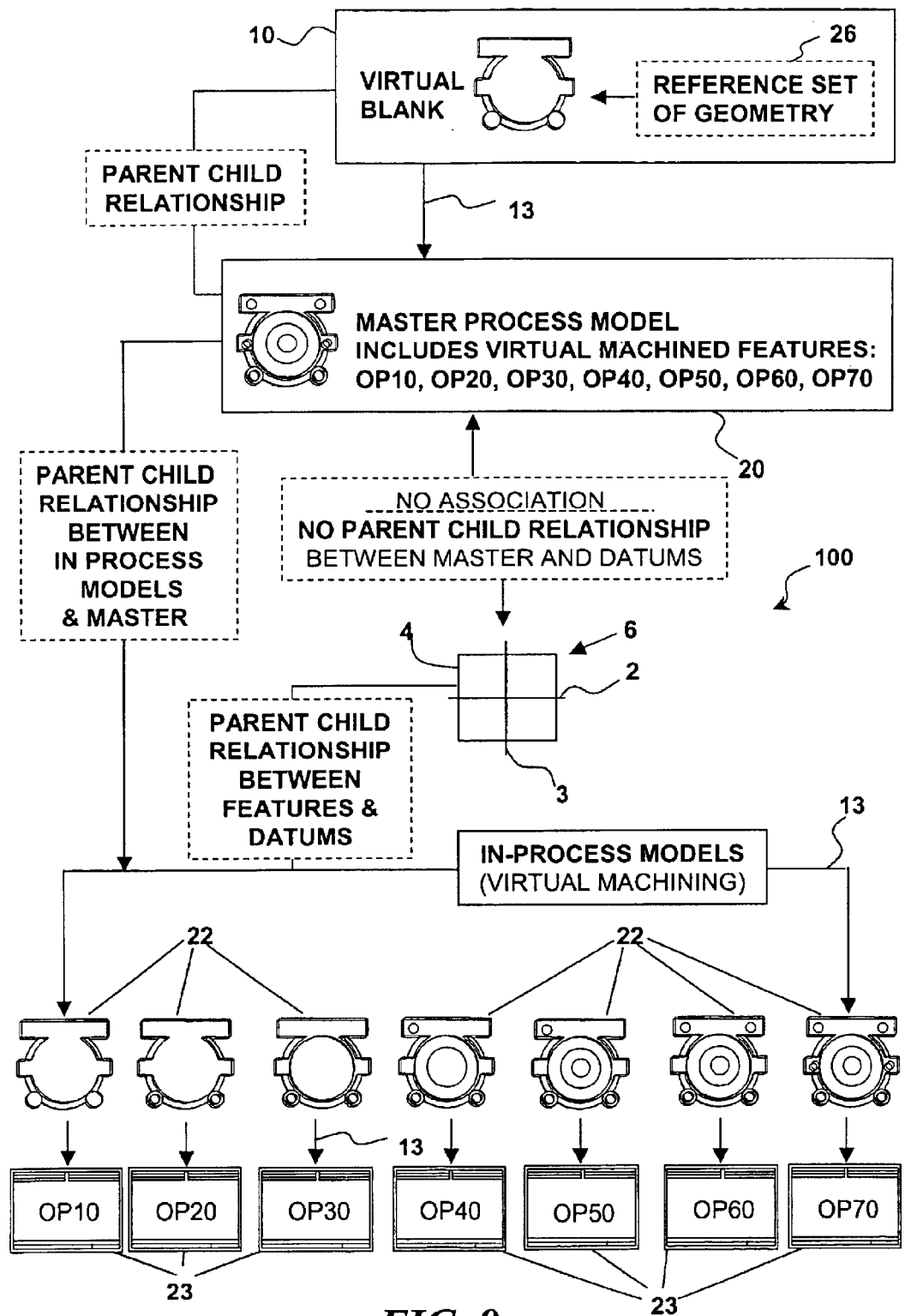
FIG. 9 is a diagram depicting the relationships among the elements of the manufacturing process model for the enhanced manufacturing process modeling.

As seen in FIG. 8, in Unigraphics® software, this linkage between the master process model 20 and the process sheets 23 is preferably achieved through the use of extracted in-process models, called virtual extract(s) or extracted bodies, hereinafter denoted extract(s) 22, that are time stamped and linked to the master process model 20. Referring also to FIG. 9, each in-process model 22 is also a three dimensional solid model and represents the part under fabrication at a particular operation or time in the manufacturing process. Each in-process model 22 is a child of the master process model 20. Any changes to the master process model 20 are automatically reflected in all the relevant extract(s) 22, but changes to the extract(s) 22 have no effect on the master process model 20. It should be noted that in an exemplary embodiment, each in-process model 22 need not necessarily exhibit an associative relationship with the datum planes 2, 3, and 4 respectively nor the manufacturing features 12a–12j respectively. An advantage of the disclosed embodiment then is, in the realization that any changes to the datum planes 2, 3, and 4 as well as the manufacturing features 12a–12j are independent of the relevant extract(s) 22 and vice versa. An additional characteristic of the exemplary embodiment is that each of the manufacturing features 12a–12j, now maintain associative relationships, in this case, parent/child relationships with the corresponding datum planes 2, 3, and 4. Therefore, changes to the datum planes are automatically reflected in all the relevant manufacturing features 12a–12j, but changes to the manufacturing features 12a–12j have no effect on the various datum planes. Once again, the manufacturing features 12a–12j may, but need not necessarily, exhibit an associative relationship among themselves. This separation of the associative relationships of master process model 20 and in-process models 22 from datum planes 2, 3, and 4 and manufacturing features 12a–12j is one characteristic, which enables a user now to effectively manipulate the various elements of the manufacturing process models to facilitate easy substitutions into or out of a model.

Continuing with FIG. 8, each in-process model 22 is a three-dimensional "snapshot" of the master process model 20 at a moment in "time" of its creation in the manufacturing process. The in-process models 22 created for each operation are children of the master process model 20. By changing the master process model 20, the in-process models 22, and therefore, the manufacturing process is automatically updated.

The order of creation of the in-process models 22 is preferably dictated by a user-friendly graphical interface 21, hereinafter referred to as a model navigation tool 21. The model navigation tool 21 will preferably allow the user to arrange the order of features through simple mouse operations to make manipulation of the master process model 20 as simple and intuitive as practicable. In the Unigraphics software, a model navigation tool provides similar functionality and capability. A process sheet 23 is generated for each in-process model 22. In the example depicted in FIG. 8, a process sheet 23 is generated for each extract in one-to-one correspondence. Since the master process model 20 is preferably created using the horizontally-structured methods described above, editing the master process model 20 is a simple and expedited matter of adding, editing, suppressing, or deleting individual features of the master process model 20, which, through the extract(s) 22, will automatically update all the process sheet(s) 23.

Further, this principle may be extended further downstream in the manufacturing process model by utilizing the electronic data for CNC programs, tooling (i.e., cutting tool selection), and fixture design by direct transmission to the machining tools without the need for process sheets 23 and human intervention. For example, in the Unigraphics® environment, such automation may be achieved by creating a reference set (analogous to the reference set 26) to the particular in-process model 22 and including it in a new file via virtual assembly, similar to the method employed for the creation of the virtual blank 10 discussed earlier. The in-process model 22 therefore, is used to create the corresponding geometry. Software must then be provided to adapt the CAD/CAM software to translate the geometry into CNC form.

The method of generating process sheets 23 initiates with selection a virtual blank 10 and then proceeding to add manufacturing features 12a–12j (FIG. 6) to the virtual blank 10 in a horizontally structured manner as described earlier. Following each virtual machining operation, an in-process model 22 is made representing the state of the master process model 20 at that instant of the manufacturing process. The order in which the features are to be machined into the real-world part is decided upon either through automated means or manually by the user with the model navigation tool 21. In the Unigraphics® environment an "extract" is then preferably made of the master process model 20 corresponding to each added feature representing a manufacturing position or operation. The "extraction" is accomplished through a software module provided with the CAD/CAM software, otherwise the user may develop software to program the process. In Unigraphics® software, the Modeling Module includes software to handle the extraction process. Once again, the process sheets 23 may then be created from the in-process models 22 that are added into the Drafting Module of the Unigraphics® software.

Once again, one may think of an in-process model 22 as a "snapshot" of the assembly of the master process model 20 in progress, showing all of the manufacturing features (e.g. one or more of 12a–12j (FIG. 6)) up to that point in the assembly, but none that come after it. The process sheet 23 derived from the in-process model 22 contains the instructions to machine the latest feature that appears at that "snapshot" in time. In the Unigraphics® environment, an in-process model 22 is an associative replica of master process model 20 depicting only those features, which have been added to that point in the manufacturing process. It is noteworthy to appreciate that, manufacturing features 12a–12j may be added to the in-process model 22 without appearing in the master process model 20, however any features added to the master process model 20 will appear in the in-process model 22 if the feature is directed to be added at or before the manufacturing procedure represented by the in-process model 22.

Referring to FIG. 8, there is shown a typical process sheet 23. Once again, a process sheet 23 is a document defining the sequence of operations, process dimensions, and listing of equipment, tools, and gauges required to perform an operation. Manufacturing personnel utilize process sheets to obtain the detailed information required to manufacture and inspect the components depicted thereon. Each process sheet 23 includes, but is not limited to, both graphics and text. Again, the graphics may include, but not be limited to, the dimensional characteristics of the part for the particular portion of the manufacturing process, the text may include, but not be limited to various data identifying the part and operation and noting revisions, and corresponding tooling fixtures and gauges, and the like. Once again, an example is shown in FIG. 7, with the same characteristics as described earlier.

Enhancement to Horizontally Structured Modeling and Manufacturing Process Modeling Employing Model Link/Unlink Another feature of the horizontally structured modeling and manufacturing process modeling is disclosed which utilizes the horizontal CAD/CAM modeling methods described above. Specifically, the first embodiment is further enhanced to ultimately generate CAD/CAM models and process sheets that are used to control automated machinery to create a real-world part based on a horizontally structured CAD/CAM models. In an exemplary embodiment, horizontally structured modeling methods and horizontally structured manufacturing process modeling methods as disclosed above are employed to facilitate the generation of one or more manufacturing process models for creating the actual part. This manufacturing process model is termed a master process model. "Extracts" of master process models are utilized to generate process sheets or other instructions for each procedure to machine a real-world part.

To facilitate the method disclosed and model creation, a link and unlink functionality is disclosed which provides for automatic references and the modification of links associative relationships among one or more CAD/CAM models and model elements. The link/unlink function allows a newly created or existing model or model element to be replaced by another. Moreover, the features associated with a first model may be reassociated to another model with little if any impact to the associated features.

In the Unigraphics environment, the exemplary embodiment takes advantage of the existing link and unlink functionality of the Unigraphics CAD/CAM system software. In the exemplary embodiment, an illustration employing Unigraphics® software is employed. The disclosed method includes the removal of feature dependency between modeling elements, in this instance a master process model generated as disclosed earlier, and a linked geometry. Therefore, enabling the linked geometry to be replaced by a new geometry without losing the prior positional and orientational dependencies associated with the linked geometry. Therefore, this capability maintains the associative relationships generated between a linked geometry and a master process model.

Figure 10:
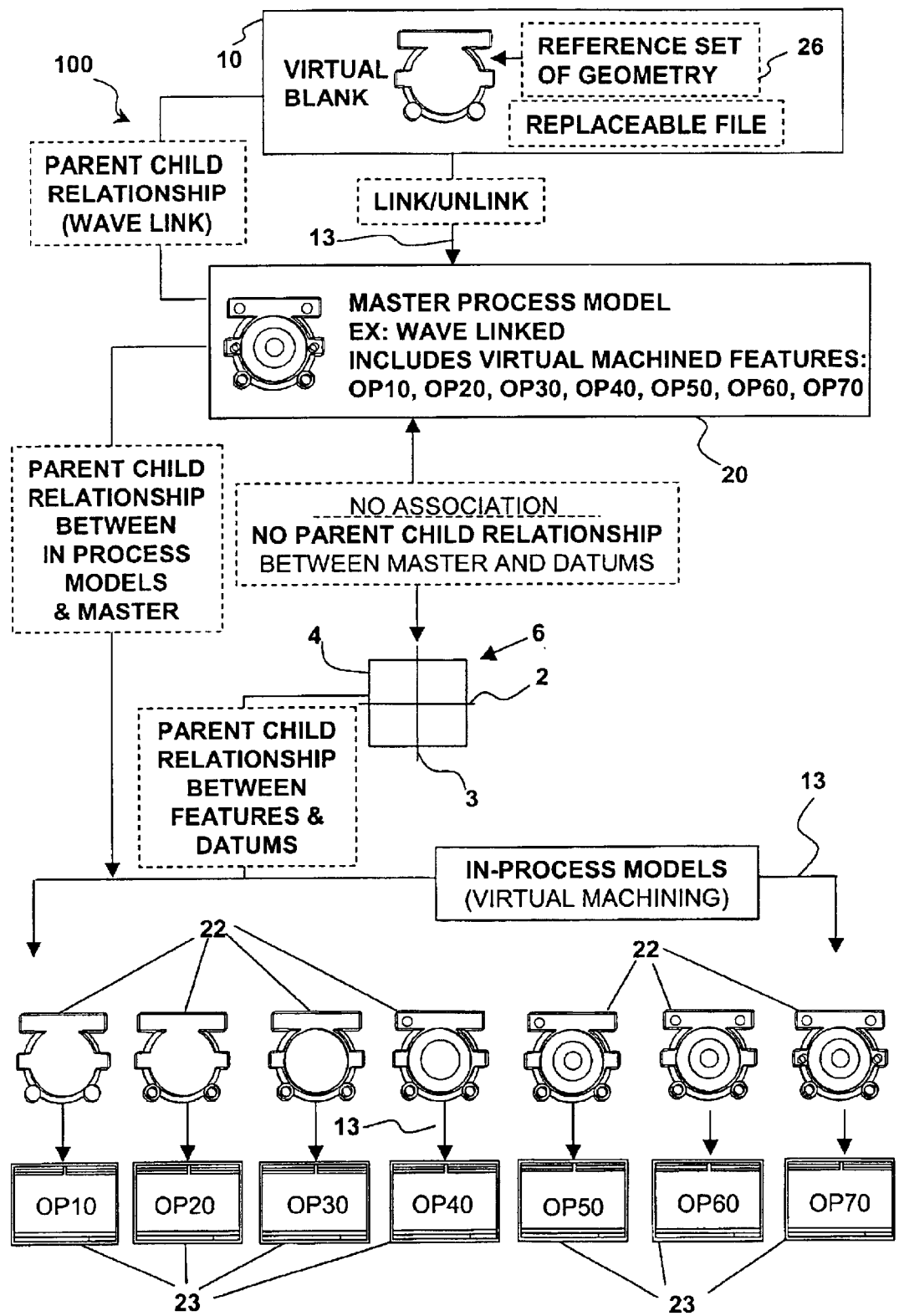
FIG. 10 is a diagram depicting the relationships among the elements of the manufacturing process model with respect to the part link/unlink features.

Referring to FIGS. 9 and 10, and continuing with FIGS. 6 and 8, for a better understanding of the features of the disclosed embodiment, reference is made to the earlier disclosed enhanced modeling and enhanced manufacturing process disclosures, as well as exemplified below. Therefore, the disclosure will be in reference to a manufacturing process modeling but is not to be construed as limited thereto. In reference to the manufacturing process and virtual machining, once again, a suitable blank may be selected or created, a cast piece for instance, the dimensions and measurements of which, are used as the virtual blank 10 for the virtual machining of the 3-D parametric solid model with the horizontally structured manufacturing method. Alternatively, once again, a virtual blank 10 may be selected, and a blank could be manufactured to match it. Once again, this alternative may prove be less desirable as it would incorporate additional machining which would not be necessary if the virtual blank 10 initiates with the blank's dimensions. It is nonetheless restated to note that the method disclosed includes, and is not limited to a variety of approaches for establishing the blank and a representative virtual blank 10 for the model.

For example, again in the Unigraphics® environment, a suitable blank or component is selected. A virtual blank 10 may be generated therefrom, commonly a referenced set of geometries from a model termed a reference set 26 (e.g., a built up product model of a part). From this referenced set of geometries a three-dimensional virtual blank 10 model may be generated or created via the Wave link or Promotion process of Unigraphics®, which includes all of the modeled details of the completed part.

Once a virtual blank 10 has been established that corresponds to a real-world blank, a horizontally-structured 3-D parametric solid model is generated or created in a manner that describes machining operations to be performed on the blank so as to produce the final real-world part. This horizontally structured model is again referred to as the master process model 20. It is noteworthy to appreciate that the master process model 20 depicted includes with it, but is not limited to, the virtual blank 10, added manufacturing features 12a–12j (FIG. 6) by way of virtual machining, and datum planes 2, 3, and 4 all in their respective associative relationships as exhibited from the geometries and characteristics of the reference set 26.

The master process model 20 is a 3-D parametric solid model representative of the geometry of a reference set 26, which includes the reference set 26 associative relationships. Moreover, the master process model 20 may be manipulated and modified as required to model the process of fabricating the actual part. Once again, this master process model 20, logically, is a child of the reference set 26. Moreover, once again, no mandatory associative relationship need exist among the master process model 20 (e.g., in a Unigraphics® environment, the Wave linked geometry) and the datum planes 2, 3, and 4 which comprise the reference 3-D coordinate system 6 with respect to which, the features are positioned and oriented or among the datum planes 2, 3, and 4.

The described independence, as with the modeling described above provides significant flexibility in the manufacturing process by allowing a user to interchangeably apply various features to a particular master process model 20. Likewise, interchangeable master process models 20 may be generated without impacting the particular features or datum planes (e.g., 2, 3, and 4) utilized. For example, different reference sets or geometries may be selected and a new master process model generated therefrom and subsequently, the same features and associated datums added. Referring once again to FIG. 6, the virtual machining process of the exemplary embodiment where manufacturing features are "machined" into the virtual blank 10 is depicted. The process is similar to that disclosed above and therefore, need not be repeated.

Once again, one may recognize the master process model 20 as the completed horizontally structured model depicted at W in FIG. 6 including all of the "machining" operations. Once again, some CAD/CAM software packages may require that the addition of the manufacturing feature(s) 12a–12j to be in a particular order, for example, in the same order as manufacture. Once again, in such a case, a method for reordering the features may prove beneficial.

It is noteworthy to appreciate that the link/unlink capability realizes its potential and significance primarily due to the characteristics of the horizontally structured model and manufacturing processes disclosed herein. Specifically, the separation/distribution of associative relationships in the models provides the enhancement achieved.

In contrast, in "vertical" modeling and traditional manufacturing processes, where the traditional approach to manufacturing modeling was to create separate individual models representing the real-world component at numerous particular operations in the manufacturing process. If a change or deletion was made in one model, it was necessary to individually update each of the other models having the same part. Using the horizontally structured modeling disclosed herein and employing the model link/unlink capabilities, it is now possible to generate multiple horizontally structured master process models linked in a manner such that changes in one model are automatically carried out in other linked models. Further, the subsequent process sheets 23 that are linked thereto are also automatically updated. Any changes to the master process model 20 are reflected in all the process sheets 23.

Once again, as seen in FIG. 10, in Unigraphics® software, this linkage between the master process model 20 and the process sheets 23 is preferably achieved through the use of extracted in-process models, called virtual extracts(s) or extracted bodies, hereinafter denoted as extract(s) 22, that are time stamped and linked to the master process model 20 as disclosed above. Referring also to FIG. 8, each in-process model 22 is also a three dimensional solid model and represents the part under fabrication at a particular operation or time in the manufacturing process and includes the properties as described in earlier embodiments.

In the example depicted in FIG. 10 in a manner similar to that depicted in FIG. 8, a process sheet 23 is generated for each in-process model 22 in one-to-one correspondence as described earlier. Since the master process model 20 is preferably created using the horizontally-structured methods described above, editing the master process model 20 is a simple and expedited matter of adding, editing, suppressing, or deleting individual features of the master process model 20, which through the extract(s) 22, will automatically update all the process sheet(s) 23.

Once again, this principle may be extended further downstream in the manufacturing process model by utilizing the electronic data for CNC programs, tooling (i.e., cutting tool selection), and fixture design by direct transmission to the machining tools without the need for process sheets 23 and human intervention.

Horizontally Structured Coordinate System for Manufacturing Operations

In the abovementioned embodiments, the Cartesian coordinate system employed as a reference for all subsequent measurements and reference was initially undefined. To establish a coordinate system (herein a 3-D coordinate system 6), modeling elements such as datum planes (e.g., 1, 2, 3, and 4) were created in reference to a base or parent feature 0, virtual blank 10, or a master process model 20. These datum planes (e.g., 2, 3, and 4) were used to define placement and positioning references for other modeling elements such as form features e.g., 5a–5g or manufacturing features e.g., 12a–12j.

Employing the abovementioned method, removal of the parent feature e.g., a master process model 20, datum plane 1, and the like, results in a loss of associativity with the datum planes e.g., 2, 3, and 4 and the parent feature, which, in turn, results in the loss of any features e.g., 12a–12j that are associated to these parent features. Therefore, it would be beneficial to modify features and modeling elements e.g., master process models 20, datums 2, 3, and 4 or features 5a–5g without significant impact to the existing modeling elements.

Disclosed herein by way of an exemplary embodiment is a new methodology for configuring a coordinate system for subsequent manufacturing process modeling. Referring once again to FIG. 18, a 3-D coordinate system 6a is defined using three references in this instance, datum planes 2a, 3a, and 4a, respectively, denoted as base datums is created in accordance with an existing work coordinate system 7. The work coordinate system 7 is an arbitrary reference coordinate or measurement system inherent or generated in existing CAD systems. The references may be points, axes, lines, curves, datum planes, surfaces, bodies, regions, and the like, as well as combination including at least one of the foregoing. Hereinafter, the references shall be referred to as in this instance, datum planes 2a, 3a, and 4a respectively for clarity. Using datums, for example, these features become the basis of the horizontally structured model.

The 3-D coordinate system 6a comprising the datum planes 2a, 3a, and 4a may thereafter be referenced by subsequent constrained reference coordinate systems e.g., datums and/or modeling elements. The new configuration for the horizontally structured coordinate system facilitates manufacturing process model generation where a modeling element or manufacturing feature e.g., 12a–12j is placed and positioned, or an operation is performed independently according to the subsequent constrained references e.g., coordinate system(s), datums and the like. In such a configuration, if the parent feature e.g. virtual blank 10, is removed, there will be no loss of any associated child features. This independence of the various modeling elements also allows for the addition, subtraction, and reordering of new or existing modeling elements.

For example, a Cartesian coordinate system creates a 3-D coordinate system. A virtual blank 10 is then created as described earlier and positioned relative to these datums. To illustrate, referring to FIG. 18 and specifically FIG. 19, another 3-D coordinate system 6b comprising (in this example) a set of three additional datums may be established. The three new datums denoted as master datums 2b, 3b, and 4b respectively are depicted with a zero offset from the datums 2a, 3a, and 4a respectively. Further, a series of positioning datums 4c–4n is created, each depicted with offsets along the z-axis from master datum 4b. For example, as depicted in the figure, a virtual blank 10 is modeled in a master process model 20 as an extrusion from a reference geometry 26, in this instance, a rectangular shape with radial two radial opposing sides. The virtual blank 10 is modeled by translating the reference geometry 26 along the z-axis forming a solid model as depicted. It will be appreciated that the process of "extrusion" in a modeling sense is well known, but also further defined herein. The master process model now including a 3-D solid model with the virtual blank 10 upon which selected machining operations are to be performed. Thereafter, to facilitate the virtual machining of the virtual blank 10, one or more additional datums e.g. 4c–4n are positioned with offsets relative to datum 4b along the z-axis. Each of the additional datums e.g. 4c–4n includes no associative relationship with another, only (in this instance) with datum 4b. Thereafter, additional modeling elements may be added/manipulated with associative relationships to any of the datums where a modeling element, for example, a form feature 5 or manufacturing feature 12 is referenced to one of the coordinate system e.g., 6a, datums etc. while another modeling element e.g., another manufacturing feature (12b for example) is referenced to coordinate system 6b, or a datum. Moreover, as shown in the figure, a series of features (or any modeling element for that matter) may be created each including associative relationships with one or more of the respective datums e.g., 4c–4n. In such a fashion, if the coordinates for a particular datum are later modified, the form features that include associative relationships with that particular datum Would also include the modification. For example, if datum 4n is later offset further along the Z-axis, the form features e.g., 5 that includes an associative relationship with that datum would also now include the modified offset. Continuing with FIG. 19, in an exemplary embodiment, a series of form features 5 (in this example points) are determined and established along each of the datum planes 4b–4n respectively where the respective datum planes e.g., 4b–4n intersect the surface of the virtual blank 10, to establish a helical path 52 for a tool to follow. The virtual blank 10 may then virtual machined with a selected tool of selected dimensions to establish a helical groove 50 "cut" into the virtual blank 10 and thereby completing a 3-D manufacturing process model for the part and its manufacture.

Additional references may be created and association established to the various references and modeling elements.

The references may be points, axes, lines, curves, datum planes, surfaces, bodies, regions, and the like, as well as combination including at least one of the foregoing. In an exemplary embodiment, datums are described as references and various for features are created and positioned relative and associated to these datums. These datums may be positionally constrained with numeric values or expression parameters from existing modeling features, after which, all consecutive child modeling elements features are created preferably using the Horizontally Structured CAD/CAM Modeling techniques as described above.

Horizontally Structured Modeling Manufacturing Process Modeling for Alternate Operations The model link/unlink functionality coupled with the horizontally structured process modeling as disclosed earlier brings forth new opportunities for enhancement of CAD/CAM modeling manufacturing processes. One such opportunity is horizontally structured CAD/CAM modeling and manufacturing process modeling methods to facilitate alternate operations and manufacturing processes. For a better understanding of the features of the disclosed enhancement, reference is made to the earlier disclosed horizontally structured modeling and horizontally structured manufacturing process modeling including model link/unlink disclosed above, and as exemplified below.

Figure 11:
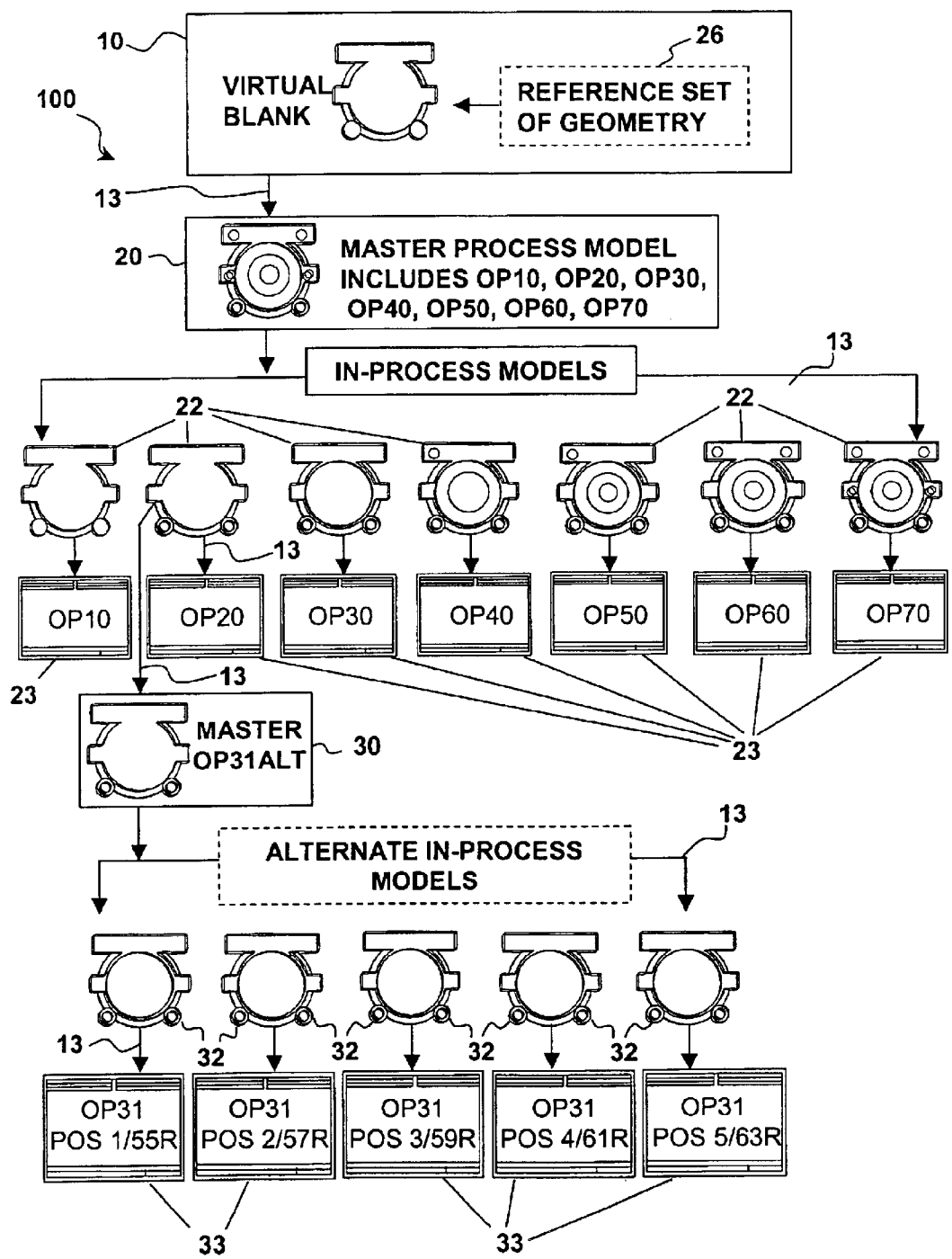
FIG. 11 is a diagram depicting the relationships among the elements of the manufacturing process model for alternate operations.

Referring to FIG. 11, in the disclosed method, horizontally structured modeling methods as disclosed above are employed to facilitate the generation of one or more manufacturing process models for creating the actual part. This manufacturing process model is termed a master process model. "Extracts" of master process models are utilized to generate process sheets or other instructions for each procedure to machine a real-world part just as described above.

To facilitate the method disclosed and model creation, the link/unlink and extraction function disclosed above is employed to facilitate performing an alternative manufacturing process. The alternative manufacturing process may be initiated via the "extraction" process of an existing model generating an alternate master process model e.g., a replica of a first or existing model. The existing model may include, but not be limited to, a reference set, a newly created master process model, or an existing master process model.

In an exemplary embodiment, an illustration employing Unigraphics® software is disclosed. The disclosed method includes the creation of a master process model 20, and performing virtual machining thereon, followed by the generation of in-process models 22 and process sheets in a manner as disclosed above. Additionally, an alternate master process model 30 is generated and likewise, followed by the generation of alternate extract(s) 32 and ultimately alternate process sheet(s) 33 therefrom. Thereby, multiple alternate processes for manufacturing operations may be created.

For a better understanding of the features of the disclosed embodiment, reference is made to the earlier disclosed modeling and manufacturing process disclosures as well as exemplified below. Referring to FIG. 11, the enhancement is described by illustration of additional features subsequent to the abovementioned embodiments, specifically an enhancement to the manufacturing process modeling. Therefore, the disclosure will be in reference to a manufacturing process modeling but is not to be construed as limited thereto.

In reference also to FIG. 10 and once again FIG. 8 and to the manufacturing process modeling, once again, a master process model 20 is created and includes the characteristics, relationships and limitations as described above. To avoid duplication, reference may be made to the abovementioned embodiments for insight concerning the generation or creation of a master process model and any characteristics thereof.

Turning now to FIG. 11, the figure provides additional insight into the application of a reference set 26, master process model 20, and the extracted alternate master process model 30. In one or more sets of process models, as disclosed in the abovementioned embodiments, one or more extract(s) may be generated from the master process model 20. From the extract(s) 22, corresponding process sheets may also be generated. To facilitate alternate manufacturing operations, however, the alternate master process model 30 is created following the completion of the "virtual" machining of the desired common manufacturing features (e.g. 12a, and 12b for instance). The alternate master process model 30 may be extracted once again from the last in-process process model 22 including the particular manufacturing features desired to generate a new 3-D parametric solid model to facilitate the definition of an alternate process of manufacturing. Alternate machining operations to add alternative manufacturing features for example, may be performed on the alternate master process model 30. Once again, in a similar manner to the abovementioned embodiments, extracts may be made during the virtual machining process and therefrom process sheets generated. Where the extracts, in this case termed alternate extracts 32 of the alternate master process model 30 are created at various operations of the manufacturing process, in this case the alternate manufacturing process. Once again from these alternate extracts 32, alternate process sheets 33 may be generated for specifying the manufacturing operations.

It is noteworthy to appreciate that the alternate manufacturing operations process capability disclosed realizes its potential and significance primarily due to the characteristics of the horizontally structured model and manufacturing processes disclosed herein. Specifically, the separation/distribution of associative relationships in the models provides the enhancement achieved. In contrast, in "vertical" modeling and traditional manufacturing processes, where the traditional approach to manufacturing modeling was to create separate individual models representing the real-world component at numerous particular operations in the manufacturing process. If a change or deletion was made in one model, it was necessary to individually update each of the other models having the same part. Using the horizontally structured modeling disclosed herein and employing the model link/unlink capabilities, it is now possible to generate multiple a horizontally structured alternate master process model(s) 30 linked in a manner such that changes in one model are automatically carried out in other linked models enabling a multitude of alternate manufacturing processes. Further, the subsequent alternate process sheets 33 that are linked thereto are also automatically updated. Any changes to the alternate master process model 30 are reflected in all the alternate process sheets 33.

Horizontally Structured Modeling Manufacturing Process Modeling for Multiple Master Process Models The model link/unlink functionality coupled with the horizontally structured process modeling as disclosed earlier brings forth new opportunities for enhancement of CAD/CAM modeling and manufacturing process modeling. One such opportunity is horizontally structured CAD/CAM modeling and manufacturing process modeling methods to facilitate large-scale manufacturing processes incorporating a large (e.g. more than 50 operations) number of manufacturing operations. For a better understanding of the features of the disclosed embodiment, reference is made to the earlier disclosed horizontally structured modeling and horizontally structured manufacturing process modeling including model link/unlink disclosed above, and as further exemplified below.

In current large-scale manufacturing process models, generally a separate file with separate models is created for each manufacturing operation, none of the files or models linked in any associative relationship across individual files or models. Such a configuration, dictates that a change made in one model or file that reflects upon others must be manually entered for each of the affected files. For manufacturing processes employing a larger number of operations, such a method becomes unwieldy. In addition, in most CAD/CAM software systems manufacturing process models of such a sort tend to be very large software files (e.g., commonly 40–50 megabytes). Such large files are cumbersome for computer system to utilize and result in delays for a user.

In horizontally structured manufacturing process models as described above, for manufacturing processes employing a large number of operations, the situation is not much different. The master process model and each of the extracted in-process models are part of a single file which once again can become unwieldy and burdensome for the user. The situation may be improved somewhat by employing separate files. However, such an approach leads to separate process models that once again include no linkage or associative relationships among the separate files. Therefore, in this case, each separate model would, once again, require manual updates to reflect any changes in the product casting or the manufacturing process.

For a better understanding of the features of the disclosed embodiment, reference is made to the earlier disclosed modeling and manufacturing process disclosures as well as exemplified below. The embodiment is described by illustration of additional features subsequent to the abovementioned embodiments, specifically an enhancement to the horizontally structured manufacturing process modeling disclosed and claimed herein. Therefore, the disclosure will be in reference to and illustrated using manufacturing process modeling but is not to be construed as limited thereto.

Figure 12:
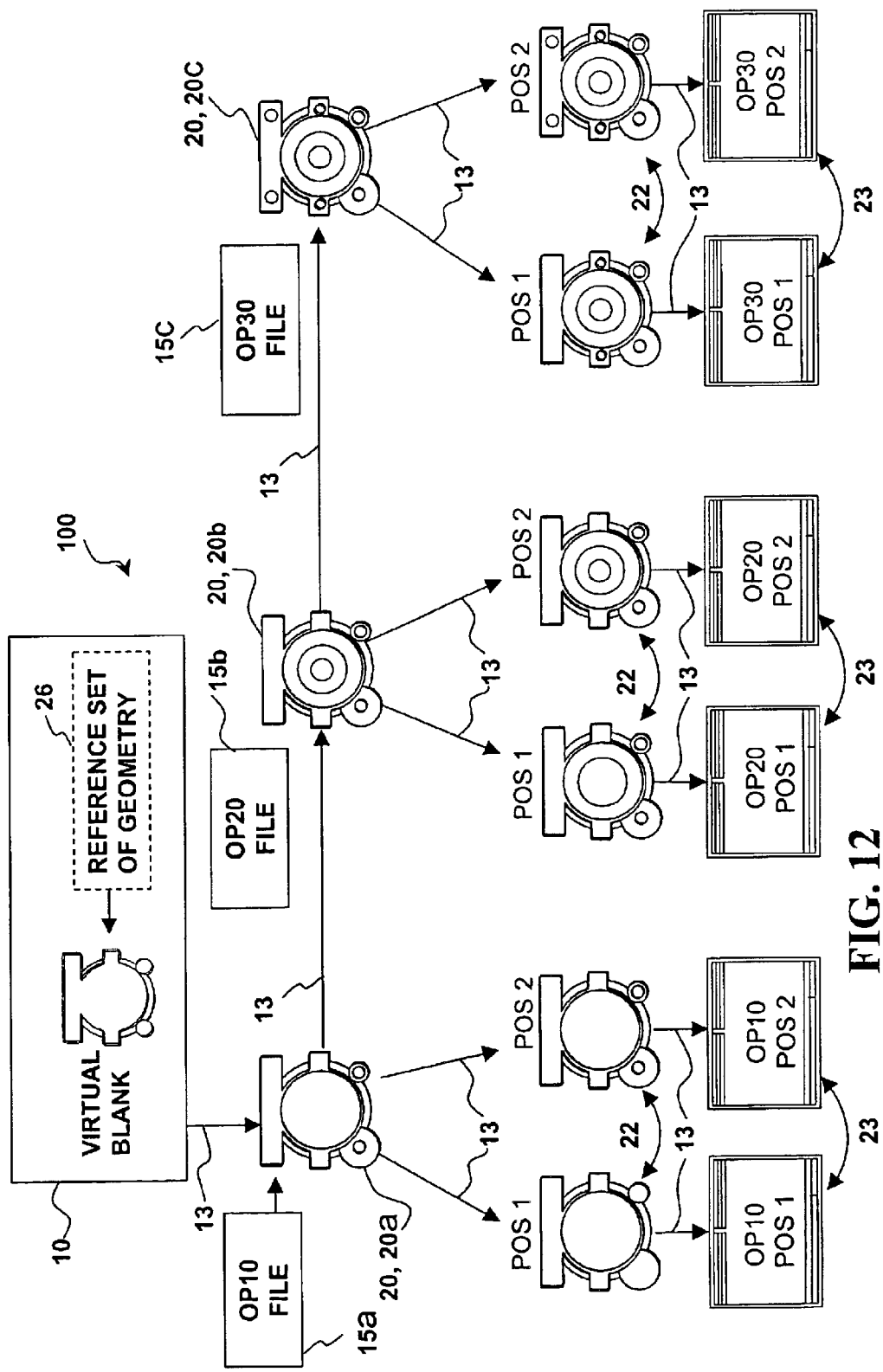
FIG. 12 is a diagram depicting the relationships among the elements of the manufacturing process model for large-scale models.

In the disclosed embodiment, horizontally structured modeling methods and the part link/unlink embodiments as disclosed above are employed to facilitate the generation of a manufacturing process for creating an actual part (e.g., a method for modeling and performing a large number of manufacturing operations). The manufacturing process comprises a plurality of models each termed master process models analogous to those described above. In this instance, each of the master process models are generated and configured in a hierarchy and include associative relationships (e.g. links) configured such that changes in a "senior" master process model are reflected in all the subsequent or "junior" linked master process models. However, changes in the subsequent or "junior" master process models will not affect the more "senior" master process models. "Extracts" of each master process model are utilized to generate process sheets or other instructions for each procedure to machine a real world part just as described in earlier embodiments. Thereby, the combination of the multiple processes enabling large-scale manufacturing operations may be created. Referring to FIG. 12, to facilitate the method disclosed and large-scale model creation, once again, the link/unlink and extraction functions disclosed above are once again employed. To execute generating a large-scale manufacturing process, multiple master process models e.g., 20*a*, 20*b*, and 20*c* are created each including a subset of the manufacturing operations required to complete the total manufacturing requirements. In the figure, by way of illustration of an exemplary embodiment, three such master process models 20*a*, 20*b*, and 20*c* are depicted. Each master process model 20*a*, 20*b*, and 20*c* is created in a separate file, the files linked in associative relationships as depicted by the arrows in the figure. Once again, the master process model 20*a*, 20*b*, and 20*c* may be created or generated in a variety of manners as described above. For example, in the Unigraphics® environment, the master process model 20 may be generated via virtual machining of a virtual blank 10, which was an "extraction" from a reference set 26, as a replica of an existing model. Once again, a master process model is created that includes the characteristics, relationships and limitations as described in the abovementioned embodiments. To avoid duplication, reference may be made to the abovementioned embodiments for insight concerning a master process model and horizontally structured models.

Referring once again to FIG. 12, each of,the master process models 20*a*, 20*b*, and 20*c* are configured in a hierarchy, in three separate files and include associative relationships (e.g. links) configured such that changes in a "senior" (e.g., 20*a*, 20*b*, and 20*c* respectively) master process model are reflected in all the subsequent linked master process models (e.g., 20*b* and 20*c*). However, changes in the subsequent master process models (e.g., 20*c*, and 20*b*, respectively) will not affect the prior master process models. Moreover the master process models are created, configured and linked with associative relationships such that changes to the reference set 26 or virtual blank 10 from which they originated, flow down to all master process models 20*a*, 20*b*, and 20*c* respectively.

An exemplary embodiment further illustrates application to a large scale manufacturing process. A "senior" master process model, e.g., 20*a* is generated in a first file 15*a* as disclosed herein, namely initiated with a virtual blank 10 as a replica of the desired reference set 26, virtual blank 10, or a product casting. The virtual machining necessary to add a first subset of all the desired manufacturing features for example, 12*a*, and 12*b* is performed. Following the addition of the first subset of manufacturing features, a second or junior master process model e.g., 20*b* in a separate file denoted 15*b* is generated from the first e.g. 20*a*. The subsequent desired manufacturing features to be associated with the second master process model e.g., 12*c*, and 12*d* are added to the second master process model e.g., 20*b*. Finally, as illustrated in the figure, a third master process model e.g., 20*c* is generated from the second e.g., 20*b* in yet another separate file denoted 15*c* and further subsequent manufacturing features e.g., 12*e* and 12*f* are added. Subsequent "junior" master process models may be generated in subsequent separate files as needed to accomplish the entire large scale manufacturing process and yet keep the individual file size manageable. A particular feature of the exemplary embodiment is that it would allow the user to readily add new manufacturing features any where in the large scale manufacturing process model without disrupting the every file and model. Moreover, global changes which affect the entire model may be made at the highest level via the first master process model e.g., 20*a*, reference set 26 geometry, or virtual blank 10 which then flow down to all the subsequent models by virtue of the associative relationships among them.

Turning now to FIG. 12, once again for insight into the utilization of a reference set 26, the virtual blank 10, and the multiple master process model(s) 20*a*, 20*b*, and 20*c* with their respective associated relationships and progeny are applied to facilitate a large-scale manufacturing process. In one or more sets of manufacturing process models, as disclosed in the abovementioned embodiments, one or more in-process models or extract(s) may be generated from each of the master process model(s) 20*a*, 20*b*, and 20*c* respectively (in this instance three are depicted). Once again, the in-process models 22 correspond to the state of the respective master process models 20*a*, 20*b*, and 20*c* at various operations for the virtual machining of the manufacturing features (e.g., 12*a*–12*j* of FIG. 6). Referring also to FIGS. 6 and 8, it should also be apparent that in order to accomplish a large-scale manufacturing process, the virtual machining of manufacturing features 12*a*–12*j*, the generation of respective in-process models 22, and the generation of corresponding process sheets 23 is divided among the various master process models 20*a*, 20*b*, and 20*c*.

From the extract(s) 22 associated with each master process model e.g., 20*a*, 20*b*, and 20*c*, corresponding process sheets may also be generated. Where again, extracts, of the respective master process models 20*a*, 20*b*, and 20*c* are created at various operations of the manufacturing processes associated with a particular master process model of the plurality. Once again from these in-process models 22, corresponding process sheets 23 may be generated for specifying the manufacturing operations. Once again, it should be recognized that the in-process models 22 and process sheets 23 are created and include the characteristics, relationships and limitations as described above for horizontally structured models and horizontally structured process models. To avoid duplication, reference may be made to the abovementioned embodiments for insight concerning in-process models or extracts and process sheets.

It is noteworthy to appreciate that the large-scale manufacturing operations process capability disclosed realizes its potential and significance primarily due to the characteristics of the horizontally structured model and manufacturing processes disclosed herein. Specifically, the separation/distribution of associative relationships in the models provides the enhancement achieved. In contrast, where the traditional approach to manufacturing modeling was to create separate individual models representing the real-world component at numerous particular operations in the manufacturing process. If a change or deletion was made in one model, it was necessary to individually update each of the other models having the same part. Using the horizontally structured modeling disclosed herein and employing the model link/unlink capabilities, it is now possible to generate multiple horizontally structured master process model(s) linked in a manner such that changes in one model are automatically carried out in other linked models enabling a multitude of alternate manufacturing processes. Further, the subsequent process sheets 23 that are linked thereto are also automatically updated. Any changes to a particular master process model 20*a*, 20*b*, or 20*c* are automatically reflected in the corresponding in-process models 22 and process sheets 23.

Enhancement to Horizontally Structured Modeling Manufacturing Process Modeling—Exterior Linked Representational Embodiment The model link/unlink functionality coupled with the horizontally structured process modeling as disclosed earlier brings forth yet another opportunities for enhancement of CAD/CAM modeling and manufacturing process modeling. One such opportunity is horizontally structured CAD/CAM modeling and manufacturing process modeling methods to facilitate large-scale manufacturing processes incorporating a large (e.g. more than 50 operations or positions) number of manufacturing operations. For a better understanding of the features of the disclosed embodiment, reference is made to the earlier disclosed horizontally structured modeling and horizontally structured manufacturing process modeling including model link/unlink disclosed above, and as further exemplified below.

In current large-scale manufacturing process models, generally a separate file with separate models is created for each manufacturing operation, none of the files or models linked in any associative relationship across individual files or models. Such a configuration, dictates that a change made in one model or file that reflects upon others must be manually entered for each of the affected files. For manufacturing processes employing a larger number of operations, such a method becomes unwieldy. In addition, in most CAD/CAM software systems manufacturing process models of such a sort tend to be very large software files (e.g., commonly 40–50 megabytes). Such large files are cumbersome for computer system to utilize and result in delays for a user It will be appreciated that the disclosed methodology is not limited to just large part files, and may readily be employed for smaller files. Moreover, in certain instances, as a function of the particular modeling software being employed, it may be the only method available.

In horizontally structured manufacturing process models as described above, for manufacturing processes employing a large number of operations, the situation is improved. Here, the individual master process models and their associated in-process models are part of a single file, which once again, may become unwieldy and burdensome for the user. The situation is improved by employing separate files, however, such an approach leads to separate process models that once again include no linkage or associative relationships among the separate files. Therefore, in this case, each separate model would once again, require manual updates to reflect any changes in the product casting or the manufacturing process. Thus, it would be beneficial to have a horizontally structured manufacturing process where linked in-process models could be maintained in separate files from a master process model with which they are associated.

For a better understanding of the features of the disclosed embodiment, reference is made to the earlier disclosed modeling and manufacturing process disclosures and the description provided herein. The embodiment is described by illustration of additional features subsequent to the abovementioned embodiments, specifically an enhancement to the horizontally structured manufacturing process modeling disclosed and claimed herein. Therefore, the disclosure will be in reference to and illustrated using manufacturing process modeling but is not to be construed as limited thereto.

In the disclosed embodiment, horizontally structured modeling methods and the part link/unlink embodiments as disclosed above are employed to facilitate the generation of a manufacturing process for creating an actual part (e.g., a method for modeling and performing a large number of manufacturing operations). It will be appreciated that in the prior methodology, as described above, subsequent models and in-process models specifically are created using the extract function: The extract is a 3-D solid model (also denoted body) that includes the characteristics of the features that are above it on the feature list. In other words, the extract is a "snapshot" of the model at a selected instance in the manufacturing process. This extract exists in the same file that it was created in along with the model from which it was created. To get the extract into another file, a reference set must be put on or made the solid body model, which may thereafter be referenced from another file. The manufacturing process once again, employs a master process models analogous to those described above. In this instance, in-process models are created from master process model 20 as a "reference of sequential features that represents a specific operation or position and linked into separate but linked files. The in-process models are the utilized to generate process sheets or other instructions for each procedure to machine a real world part just as described in earlier embodiments. Thereby, the combination of the multiple processes enabling large-scale manufacturing operations may be created employing multiple files for the in-process models.

Figure 20:
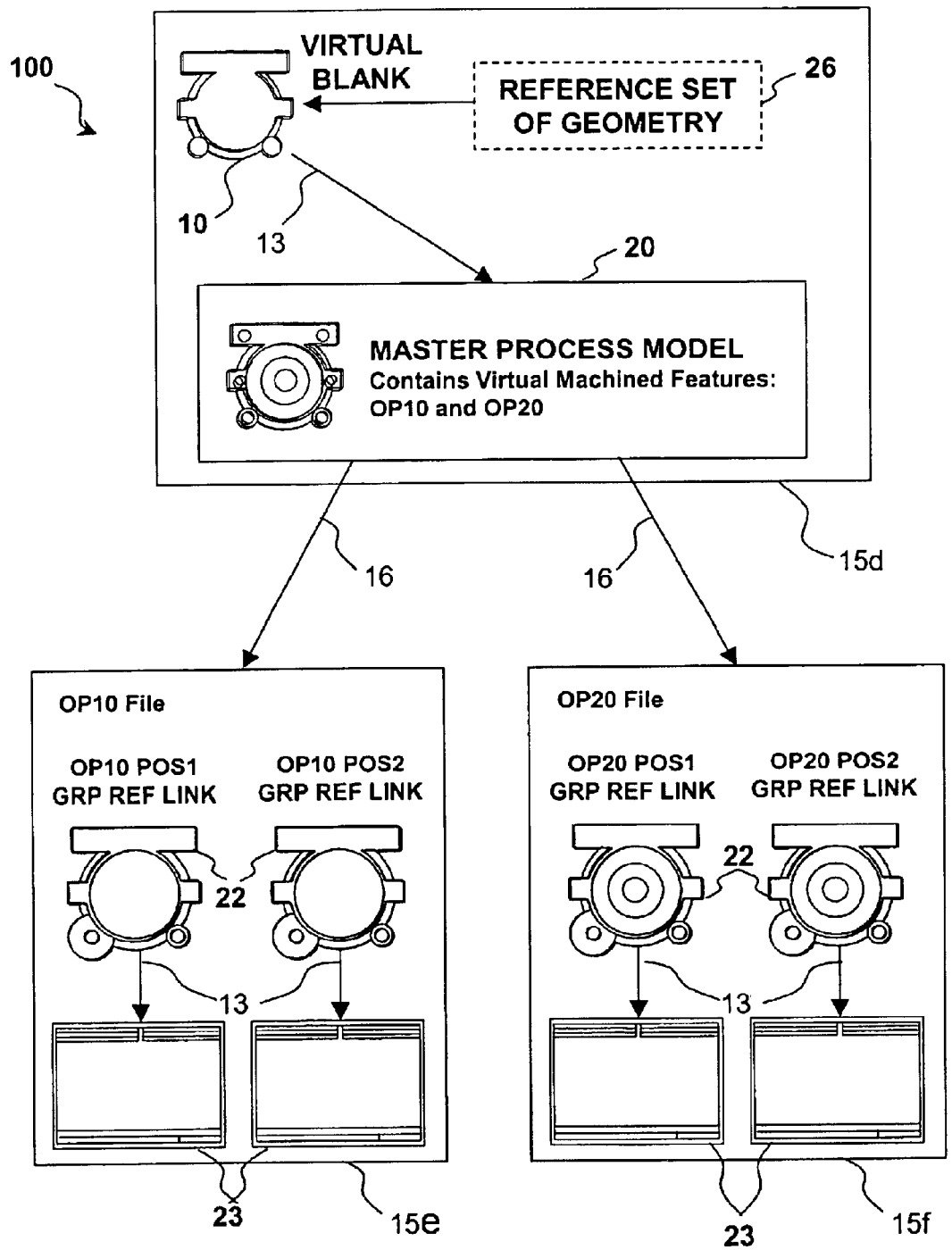
FIG. 20 is an exemplary depiction of an exterior linked representational embodiment in a horizontally structured environment.
Figure 21:
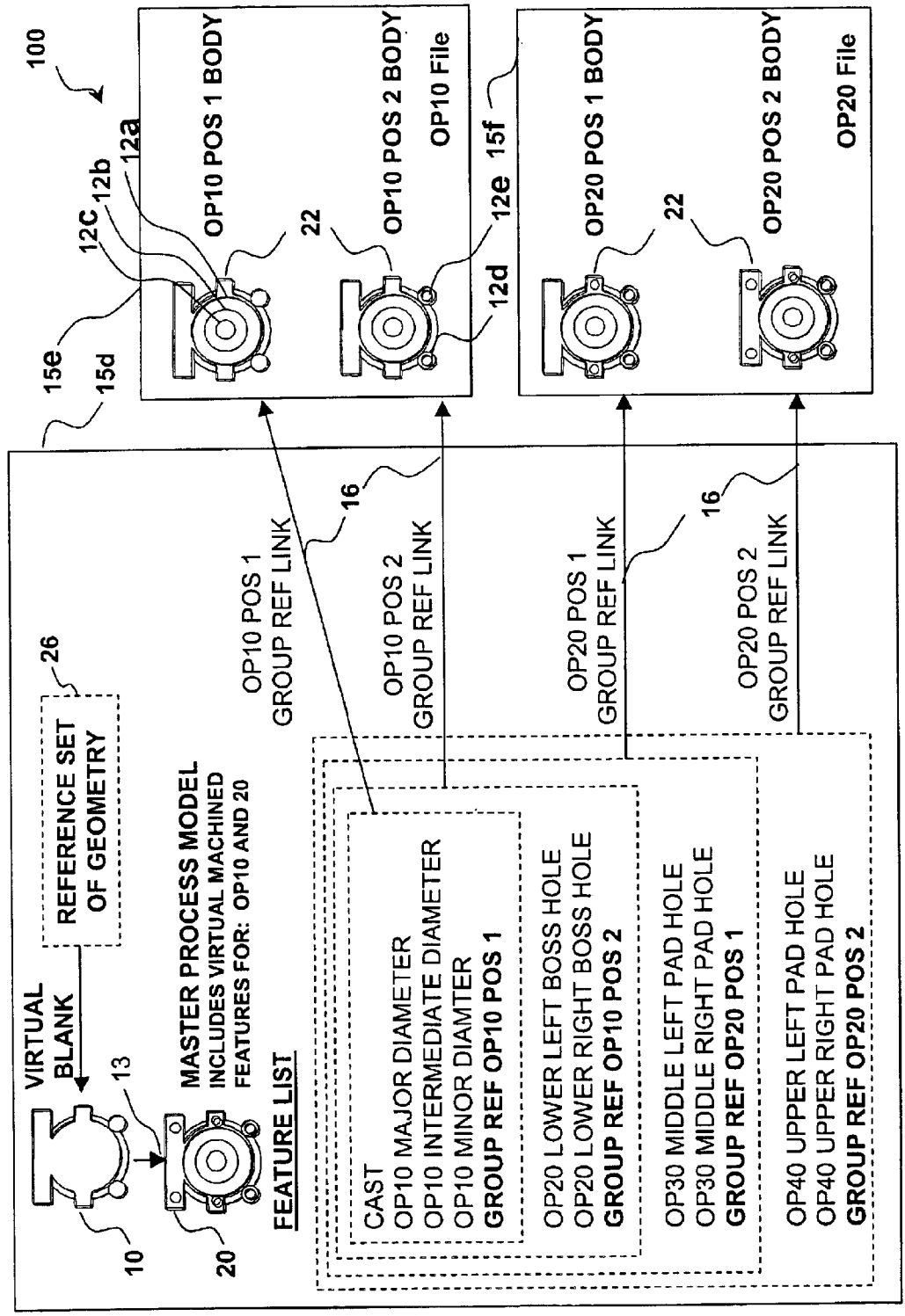
FIG. 21 is another exemplary depiction of exterior linked representational embodiment in a horizontally structured environment

Referring now to FIG. 20, to facilitate explanation and illustration of the method disclosed for generating a large-scale manufacturing process in an exemplary embodiment, a master process model 20 is created, including the manufacturing operations required to complete the total manufacturing requirements in a master file 15*d*. An exemplary embodiment further illustrates application to a large scale manufacturing process. Referring also to FIG. 21, for a more detailed depiction of the methodology, the master process model, 20 is generated in a similar manner as disclosed earlier herein, namely initiated with a virtual blank 10 as a replica and 3-D model of the desired reference set 26, of a selected geometry, virtual blank 10, or a product casting in a master file 15*d*. However, to create the master process model 20 and all in-process models 22, as well as the related process sheets in the same file becomes increasingly difficult as the part or process becomes larger. To address this, the manufacturing process is divided across multiple files. To facilitate in this division, in an exemplary embodiment, a new functionality is provided for development and generation of manufacturing processes. The new "group reference link" 16 operates similar to a reference set 26 as described herein that includes features, characteristics etc of a model, but not solid bodies e.g., 3-D models. Advantageously, this new operational process facilitates formulation of time stamp of the master process model 20 in master file 15*d* while facilitating suppression of selected manufacturing features 12. Similar to the extract function, this new function "group reference link" 16 enables referencing the selected geometry and thereby, the creation a new 3-D solid model (whether a new master process model 20 or in-process model 22) in another specified file. Moreover, unlike the extract function, this new 3-D solid model not in the same file e.g., 15*d* as the master process model 20. Therefore, in an exemplary embodiment a new model including selected manufacturing features 12 on the master process model 20 may readily be generated in another file e.g. 15*e*, and thereby, large part manufacturing processes may be accomplished.

Continuing now with the figures, in an exemplary embodiment, The virtual machining necessary to add a first subset of the desired manufacturing feature(s) 12 e.g., for a first operation denoted OP 10 for two positions, for example, virtual machining for manufacturing features 12*a*, 12*b*, 12*c* herein denoted major diameter, intermediated diameter, and minor diameter respectively at position 1 is performed. Following the addition of the first subset of manufacturing features, associative in-process models 22 from the master process model 20 are "group reference linked" 16 as described above and therby a new in-process model 22 may be created in a first operational file 15*e* also denoted an OP10 file. Virtual machined manufacturing features, for example, 12*a*–12*c*, in this instance, representing only a first manufacturing operation, for example Operation 10 from the master process model 20 in file 15*d* are depicted. A group reference representing a time stamp of the master process model 20 at the various manufacturing processes for operation 10 are referenced from a first operational file 15*e* (OP10 file). Optionally, the separate operational files e.g., 15*e*, need only contain the references of the geometry that depicts a particular operation or operations. All virtual machining may be carried out in the master process model 20. Additionally, the first operational file 15*e* now contains a solid model (e.g., denoted an in-process model 22, however, optionally this model could be utilized as a new master process model 20, that represents what the real part looks like at operation 10, containing all of the manufacturing processes perfomed at that operation.

Similarly, the virtual machining necessary to add a subsequent subset of the desired manufacturing features e.g., for a second operation or position, for example, 12*d* and 12*e*, in this instance, a left and right boss hole is performed. Following the addition of the second subset of manufacturing features e.g., 12*d* and 12*e*, from the master process model 20 representing OP10 at position 2 are group reference linked 16, and therby facilitating the creation of a second in-process model 22 in the first operational file 15*e*. Virtual machined manufacturing features, for example, 12*c* and 12*d* representing only the second manufacturing operation, for example Operation 10 from the master process model 20 in file 15*d* are depicted. Once again, the geometry of the master process model 20 at the various manufacturing processes for operation 10 (with the selected manufacturing features e.g., 12*a*–12*e*) are depicted. Additionally, the operational file 15*e* now contains another solid model (e.g., another in-process model 22) that represents what the real part looks like at operation 10 positon 2, containing all of the manufacturing processes perfomed at that operation.

Similarly, the virtual machining necessary to add a subsequent subset of the desired manufacturing features e.g., for a second operation or position, for example, 12*f* and 12*g*, in this instance, a left and right pad hole is performed. Following the addition of the second subset of manufacturing features e.g., 12*f* and 12*g*, from the master process model 20 representing OP20 at positon 1 are group reference linked 16 from a second operational file 15*f* also denoted an OP20 file. Virtual machined manufacturing features, for example, 12*f* and 12*g* representing the second manufacturing operation, for example Operation 20 from the master process model 20 in file 15*d* are depicted. Additionally, in the the new file 15*f* a new 3-D solid model (e.g., in-process model 22) that represents what the real part looks like at operation 20 position 1, containing all of the manufacturing processes perfomed at that operation and those previous.

Subsequent operational files containing in-process models 22 for subsequent manufacturing features 12 may be generated in subsequent separate files 15 as needed to accomplish the entire large scale manufacturing process and yet keep the individual file size manageable. A particular feature of the exemplary embodiment is that it would allow the user to readily add new manufacturing features 12 anywhere in the large scale manufacturing process model without disrupting the every file 15 and model. Moreover, global changes which affect the entire model may be made at the highest level via the first master process model e.g., 20, reference set 26 geometry, or virtual blank 10 which then flow down to all the subsequent in-process models 22 by virtue of the associative relationships among them.

It will be appreciated that while in an exemplary embodiment, two operational files 15*e* and 15*f* including two in-process models 22 are described, any combination is possible. It should further be appreciated that each operational file 15 could include a single in-process model 22 or as many as desired. Furthermore, separate operational files could be utilized if desired fore each of in-process models 22 and corresponding process sheets 23.

It should once again be appreciated that from the in-process models 22, in the subsequent operational files e.g., 15f corresponding process sheets 23 may also be generated for specifying the manufacturing operations. Where again, respective group reference linked 16 geometries from the master process model 20 are created at various operations of the manufacturing processes. Once again it should be recognized that the group reference linked 16 geometry, and in-process models 22 and process sheets 23 are created and include the characteristics, relationships and limitations as described above for horizontally structured models and horizontally structured process models. To avoid duplication, reference may be made to the abovementioned embodiments for insight concerning in-process models 22 and group reference linked 16 geometry and process sheets 23.

In yet another alternative embodiment, the in-process model 22 created in a separate operational file 15e may be treated instead as a separate, new master process model 20 for further manufacturing processing for separate charted parts or alternate opperations as described herein. Advantageously, this embodiment takes advantage of the ability to formulate multiple master process models 20 in separate files 15 from a "parent" master process model. To avoid duplication, reference may be made to the embodiments described herein for further insight concerning charted parts and alternate operations, their application, use, and manufacturing processes.

It is noteworthy to appreciate that the large-scale manufacturing operations process capability disclosed realizes its potential and significance primarily due to the characteristics of the horizontally structured model and manufacturing processes disclosed herein. Specifically, the separation/distribution of associative relationships in the models across files provides the enhancement achieved. In contrast, where the traditional approach to manufacturing modeling was to create separate individual models representing the real-world component at numerous particular operations in the manufacturing process. If a change or deletion was made in one model, it was necessary to individually update each of the other models having the same part. Using the horizontally structured modeling disclosed herein and employing the model link/unlink capabilities, it is now possible to generate multiple horizontally structured master process model(s) linked in a manner such that changes in one model are automatically carried out in other linked models enabling a multitude of alternate manufacturing processes. Further, the subsequent process sheets 23 that are linked thereto are also automatically updated. Any changes to the master process model 20 are automatically reflected in the corresponding in-process models 22 and process sheets 23.

It may be further appreciated that the above described process may be more readily implemented employing selected versions of commercially available solid modeling software. For example, the abovementioned embodiments are readily implemented on Catia® but may not be in Unigraphics® as Unigraphics' Extract function is not configured to extract to another file. Similarly, if the reference set functionality of Unigraphics® was enhanced to facilitate selection of certain features as reference set, the above mentioned description may be employed. Therefore, it should be evident that the process flow of this invention as applied to Unigraphics® is different than its CATIA® version enhancement which uses a similar "copy with link" functionality as described herein in the section titled: Further Enhancement To: Horizontally Structured Modeling Manufacturing Process Modeling and Across File Feature Operability. This embodiment is defining a new functionality to enhance the current capabilities of a function within Unigraphics® to create linked in-process models across files utilizing the master process model.

Enhancement to: Horizontally Structured Modeling Manufacturing Process Modeling for Multiple Master Process Models—Across File Feature Operability In the horizontally structured modeling embodiments disclosed herein, an "extraction process" allows for the creation of a horizontally linked copy "child" model as a snapshot of a parent model. The "child" includes all the modeling elements of the parent and the respective associative relationships. The process creates an additional linked model in the same file for a part. Often, it may be desirable to have such a linked model in a separate files or to reorder various modeling elements between them. Currently, if a selected modeling element must be shown in a different file, the modeling element must first be deleted from its current location and then recreated in the new desired location.

Disclosed herein in an exemplary embodiment, is an approach, which enables across file operations in a CAD/CAM system such that linked modeling elements may co-exist in multiple files. In the disclosed embodiment, horizontally structured modeling methods and part link/unlink embodiment are employed to facilitate the transfer of modeling elements/features between multiple files. The functionality is facilitated by a "navigator" functionality menu of a CAD/CAM system, which is linked to a "file assembly" functionality menu. These CAD/CAM system operational menus provide a designer the ability to drag and drop/relocate features to and from files within the assembly. For example, in a Unigraphics® environment, a feature navigator menu facilitates selection and manipulation of the various manufacturing features e.g., 12a–12j associated with a particular assembly. Similarly, a file assembly functionality menu facilitates manipulation of the various modeling elements of a model and various files. This functionality would also allow virtual in-process models to be relocated to other files. All features relocated update all associated linked files and modeling elements. In other words, an operator is now provided with the capability to "drag and drop" modeling elements to and from various files associated with an assembly or assembly operation. As modeling elements are relocated to new files the associative relationships among various elements are also updated automatically.

The model link/unlink functionality coupled with the horizontally structured process modeling as disclosed earlier brings forth new opportunities for manufacturing process modeling. One such opportunity is an enhancement to the horizontally structured manufacturing process modeling to facilitate large-scale manufacturing processes.

In addition to the embodiments described in the previous section, a new method has been developed for "Horizontally structured modeling manufacturing process modeling for multiple master process models". Referring now to FIGS. 12, as described above, this method involves the creation of plurality of models each termed master process model 20a, 20b, and 20c in separate part files 15a, 15b, and 15c respectively. Each of the master process models 20a, 20b, and 20c are generated in a hierarchy and include associated relationships 13, such that changes in the senior models e.g., 20a are reflected in all subsequent junior master process models e.g., 20b and 20c. However, with this approach, it is not possible to change the "sequence" of manufacturing the component. For example, if a feature that is manufacturing in later operation e.g., in master process model 20c, needs to be moved to an earlier operation e.g., to master process model 20a, the operator would need to delete the feature from the later master process model e.g., 20c, and recreate the feature in the desired earlier master process model e.g., 20a.

Figure 23:
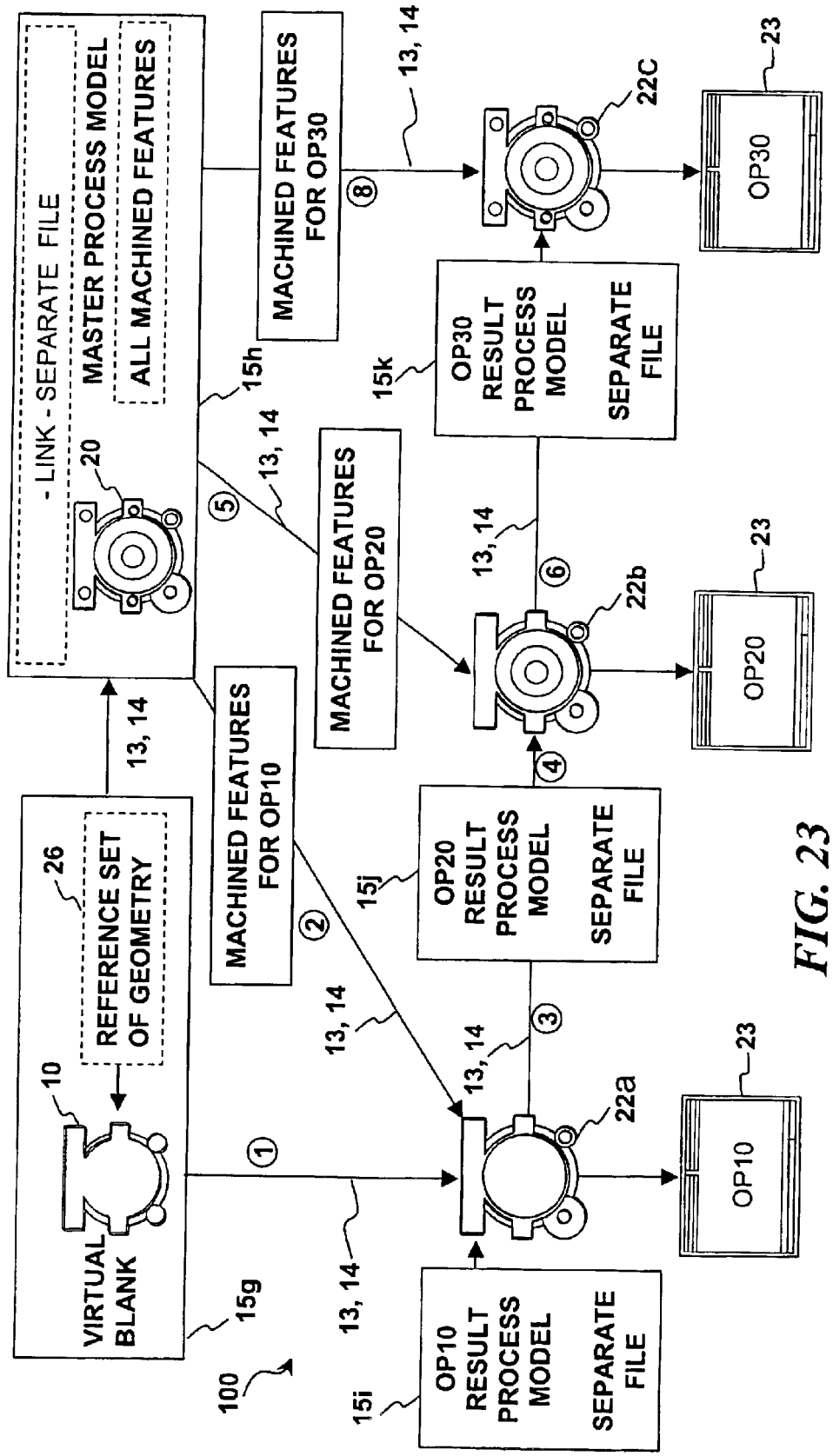
FIG. 23 depicts another modeling diagram of another embodiment across file operability in a horizontally structured modeling environment.

For a better understanding of the features of the disclosed exemplary embodiment, reference is made to the illustrations of FIGS. 12 and 23. In the figures, the "Horizontally structured modeling manufacturing process modeling for multiple master process models" as described above, is employed to create multiple master process models. In FIG. 12, three such master process models corresponding to three sets of manufacturing operations OP10, OP20 and OP30 are created denoted 20*a*, 20*b*, and 20*c* respectively. Similar to that described above, each master process model 20*a*, 20*b*, and 20*c* contains the features that will be manufactured during that operation. The master process models 20*a*, 20*b*, and 20*c* are created in three separate linked files 15*a*, 15*b*, and 15*c* denoted OP10, OP20 and OP30 respectively, and include associative relationships 13 between the respective master process models 20*a*, 20*b*, and 20*c*.

Figure 22:
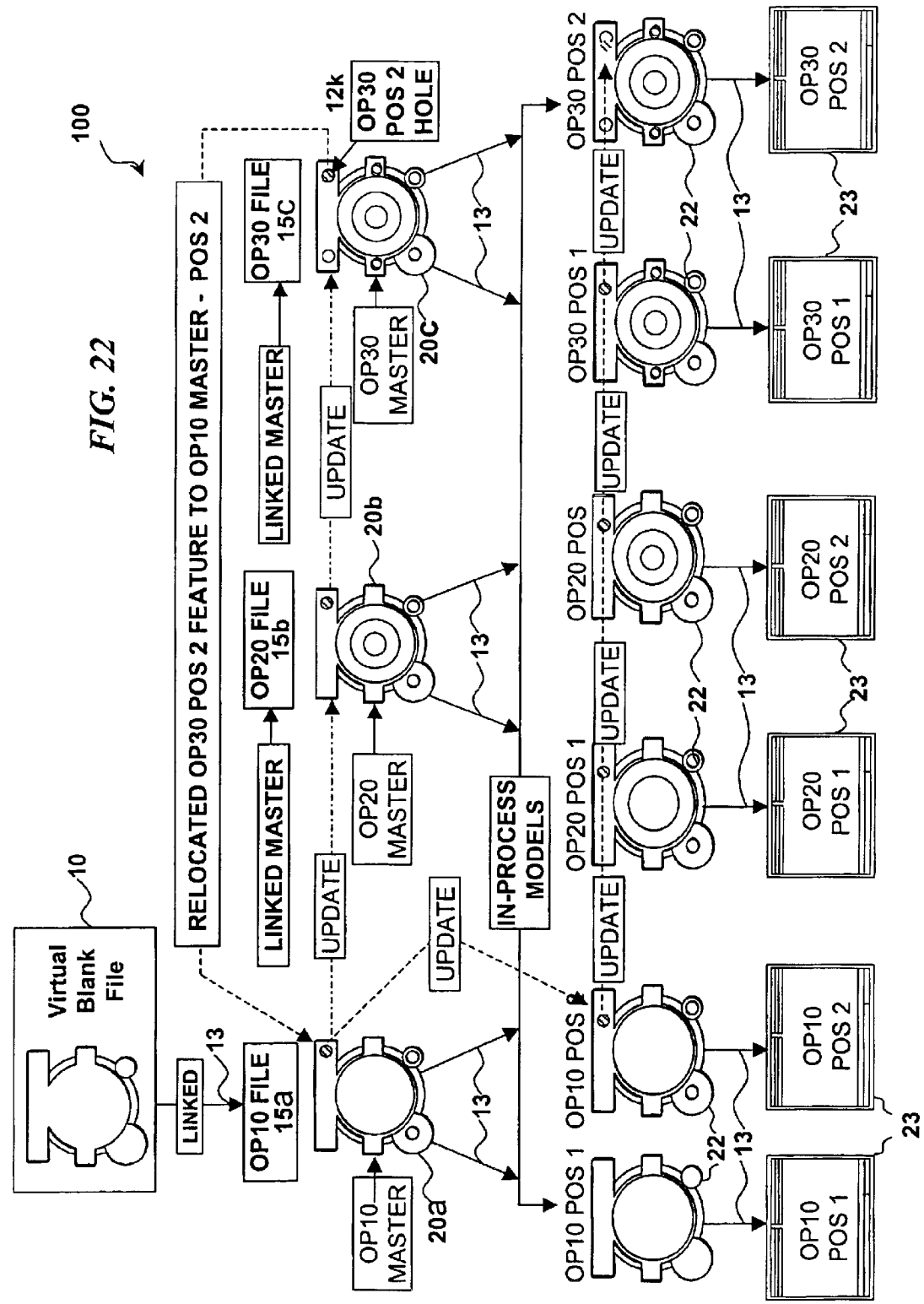
FIG. 22 depicts a modeling diagram of across file operability in a horizontally structured modeling environment.

Referring again to FIG. 22, once again similar to the disclosure above, in-process models 22 are created within each file e.g., 15*a*, 15*b*, and 15*c* to represent the component during various positions within the operation. In the figure, the in-process models 22 are represented as OP10POS1, OP10 POS2, and so on.

The feature navigator functions and file assembly functions described earlier are then used to change the "sequence" of manufacturing the component. For example, the feature 12*k*, a hole, in OP30 master process model 20*c* is relocated to OP10 master process model 20*a*. This re-sequencing functionality will include automatically deleting the feature 12*k* from OP30 master process file 15*c* and re-creating the feature 12*k* in the OP10 master process file 15*a*. The feature 12*k* is 're-attached" to the OP10 master process model 20*a* in-reference to the datum planes created in the OP10 master process file 15*a*. In the preferred embodiment of this invention, the feature 12*k* is automatically reattached to the OP10 master process model 20*a* based on the positional values of the feature 12*k* in reference to the datum planes in the original master process model, e.g., the OP30 master process model 20*c*. However, it is also possible to have the user/operator manually enter some of the parameters required to create and attach the feature to the OP10 master process model 20*a*.

In a similar fashion, the abovementioned functionality would also facilitate virtual in-process models/extracts 22 being relocated to other files 15. For example, the feature navigator and file assembly functionality discussed above may be used to move "extracted" models to a different file. This functionality would be particularly advantageous for modeling manufacturing operations incorporating a large number of operations or positions (e.g., more than 50 positions), such as transfer line operations.) With this capability, each of the extracted in-process models 22 could be placed in and linked to a separate file 15 for a part, or multiple in-process models 22 could be placed in a single file. Once again, the in-process models 22 represent the component at a specific position within a manufacturing operation. The in-process models/extracts 22 are linked to the master process model e.g., one of 20*a*, 20*b*, and 20*c* and reflect any changes made to that corresponding master process model 20*a*, 20*b*, and 20*c*. Finally, as stated earlier, from the in-process models 22, corresponding process sheets 23 may also be generated.

Although the capabilities disclosed above can be used for process modeling for all types of operations, the capabilities will particularly be helpful for process modeling of large-scale manufacturing processes exhibiting a large number of operations and/or positions. Furthermore, while the benefits and advantages of the disclosed embodiments are most evidently realized with large-scale manufacturing processes where the manufacturing process models and files may become so large as to be cumbersome to utilize, the exemplary embodiment as disclosed herein, is also applicable to other modeling processes in addition to manufacturing process modeling.

Further Enhancement to: Horizontally Structured Modeling Manufacturing Process Modeling and Across File Feature Operability The above mentioned embodiments currently entails the method of creating linked process models in 3D CAD/CAM systems using a master process model for horizontally structured manufacturing process modeling. This master process model(s) disclosed in these embodiments, are derived from a linked blank and all in-process models are extracts that are created from it.

Yet another enhanced methodology of for manufacturing process modeling utilizes the master process model introduced and described in the embodiments above. The enhanced methodology is slightly different, however, in that in this instance, while in-process models are derived from features contained within the master process model just like before, but now the actual 3D in-process model is not created as an extract from the master process model. Instead, the in-process model is now created from the result of the finished in-process model or blank resulting from the previous manufacturing operation. This new methodology allows for more functionality within other CAD/CAM systems that do not necessarily exhibit the same functionality that permits creation of in-process models by the methods previously disclosed.

Refering now to FIG. 23 a virtual blank 10 or casting must be created using a 3D parametrically controlled CAD system. In one exemplary empodiment, A file 15*g* with a virtual blank 10 containing a solid model representing a blank is created. The virtual blank 10 is created from a reference set geometry 26 as described above. A second file 15*h* containing what will become a master process model 20 is created. The virtual blank 10 from the first file 15*g* is thereafter copied and linked 14 into the second file 15*h* containing the master process model 20. The copy and link 14 function creating a copy exhibiting associative relationship 13, between the modeling elements. In this instance, the virtual blank 10, and the master process model 20. All machining of various features are created on the copied and linked virtual blank model i.e., the master process model in the second file 15*h*. This master process model 20 of file 15*h* contains all in-process features (also denoted manufacturing feature e.g. 12*a*–12*j* in the abovementioned embodiments) (see FIG. 6), modeling elements and the like, as well as combinations including at least one of the foregoing representing all operations and positions defined for the manufacturing process of the virtual blank 10 that make up the final part to be created. The master process model 20, its creation, characteristics, features, and the like are thoroughly described in the abovementioned embodiments and are not repeated here for brevity. Each feature will depict a specific operation, station, position, etc. This master process model 20 may then be utilized to create and manipulate the entire set of associated in-process models 22.

During, or after the creation of the master process model 20, the in-process models 22 are created depicting and defining the addition of various manufacturing features e.g., 12*a*–12*j*. In an ecxemplary embodiment, a variation of the process for formulating the in-process models 22 and process sheeets 23 therefrom is disclosed. As stated earlier the fomulation characteristics, features, and the like of in-process models 22 are disclosed and discusssed in the numerous embodiments above, and are not repeated here for brevity.

In an exemplary embodiment, the in-process models 22 are copied and linked 14 into yet another file (but it need not be another file) that will contain a model to represent a given operation, etc. of the manufacturing process documentation. Refering once again to FIG. 23, To create associative in-process models of each operation and position, the virtual blank from the first file 15g is copied and linked 14 into a first sequence file 15i, denoted in the figure OP10 result process model to formulate a first in-process model denoted 22a in the figure. Virtual machined manufacturing features, for example 12a and 12b representing ONLY a first manufacturing operation, for example Operation 10 from the master process model 20 in file 15h are copied and linked 14 from the master process model 20 into the first sequence file 15i (OP10 file). To formulate the first in-process model, these features are "machined" into the linked virtual blank model (that was linked there by the abovementioned process). The solid model now represents what the real part looks like at operation 10 of the manufacturing process. Thus file 15i now contains a solid model which is an in-process model containing all of the manufacturing processes perfomed at the first operation. In this instance Operation 10.

Moving now the methodology for creation of a second in-process model representing operation 20. Refering once again to FIG. 23, a second sequence file 15j also denoted OP20 is created. The "result" of the previous operations e.g., OP10, which is the previously finished solid model 22a in sequence file 15i, is copied and linked 14 into the second sequence file 15j (OP20 file). Virtual machined manufacturing features, for example 12f and 12g representing ONLY a second manufacturing operation, for example Operation 20 from the master process model 20 in file 15h are copied and linked 14 into the second sequence file 15j (OP20 file). To formulate the second in-process model 22b, these features are "machined" into the in Operation 10 in-process model (that was copied and linked 14 to the OP20 by the abovementioned process). The solid in-process model 22b now represents what the real part looks like at operation 20 of the manufacturing process. Thus file 15j now contains a solid model which is an in-process model 22b containing all of the manufacturing processes perfomed at the second operation. In this instance Operation 20.

Finally, the methodology for creation of a third or subsequent in-process model representing operation 30. Refering once again to FIG. 23, a third sequence file 15k also denoted OP30 is created. The "result" of the previous operations e.g., OP20, which is the previously finished solid model 22b in sequence file 15j, is copied and linked 14 into the third sequence file 15k (OP30 file). Once again, virtual machined manufacturing features, for example 12d and 12e representing ONLY the third manufacturing operation, for example Operation 30 from the master process model 20 in file 15h are copied and linked 14 into the third sequence file 15k (OP30 file). To formulate the third in-process model 22c, these features are "machined" into the in Operation 20 in-process model (that was copied and linked 14 into the OP30 by the abovementioned process). The solid in-process model 22c now represents what the real part looks like at operation 30 of the manufacturing process. Thus file 15k now contains a solid model which is an in-process model 22c containing all of the manufacturing processes perfomed at the third operation. In this instance Operation 30.

This process is repeated for as many operational and/or positional in-process models needed for all desired manufacturing operations. As with the earlier embodiments, process sheets, drafting files or views can be created in or from the associated model files.

Each new file and in-process model will then therefore be linked the same. The manufacturing process features that come from the master process model in file 15h will be linked into the a sequence file e.g., 15i, 15j, and 15k and then will then be added to another copied and linked 14 in-process model e.g., 22a, 22b, 22c that came from the sequence file e.g., 15i, 15j, and 15k for the preceding manufacturing operation. Each sequence file e.g., 15i, 15j, and 15k will, therefore, contain at least two primary associative relationships 13 or links, one to the preceding in-process model and second to the linked manufacturing process features e.g, 12a, 12b, 12d, 12e, 12f, and 12g in this example from the master process model 20 of file 15h.

Horizontally Structured Modeling Manufacturing Process Modeling for Charted Parts The model link/unlink functionality coupled with the horizontally structured process modeling as disclosed earlier brings forth new opportunities for enhancement of CAD/CAM modeling and manufacturing process modeling. One such opportunity is horizontally structured CAD/CAM modeling and manufacturing process modeling methods to facilitate charted parts manufacturing. Charted parts include, but are not limited to a group of machined parts exhibiting one or more common manufacturing features. For example, two independent machined parts that originate from the same casting. For a better understanding of the features of the disclosed embodiment, reference is made to the earlier disclosed horizontally structured modeling and horizontally structured manufacturing process modeling including model link/unlink disclosed above, and as further exemplified below.

In charted parts manufacturing processes, manufacturing models may need to be created for each individual part to be fabricated. Moreover, when a separate model is created for each manufacturing operation of a charted part where some elements of the model are common and yet no associative relationship exists between the manufacturing process models, a problem arises when one part or model requires an addition or modification. That being, that all subsequent models will also require manual updates to incorporate the desired modification. For example, if a global change to a common casting was required.

Disclosed herein is an embodiment, which utilizes the features and characteristics of horizontally structured manufacturing process and the link/unlink functionality disclosed earlier to develop manufacturing process models that contain multiple parts that share common manufacturing features and element(s). In an exemplary embodiment, for all of the different parts, all common manufacturing features may be linked in associative relationships, while uncommon manufacturing features need not be associatively linked. Such a configuration coupled with the characteristics of the associative relationships between subsequent models, processes, or operations dictates that a change made in one is reflected down the entire stream.

The embodiment is described by way of illustration of descriptions of features in addition to the abovementioned embodiments, specifically, an enhancement to the horizontally structured manufacturing process modeling disclosed and claimed herein. Therefore, the disclosure will be in reference to and illustrated using manufacturing process modeling but is not to be construed as limited thereto.

Figure 13:
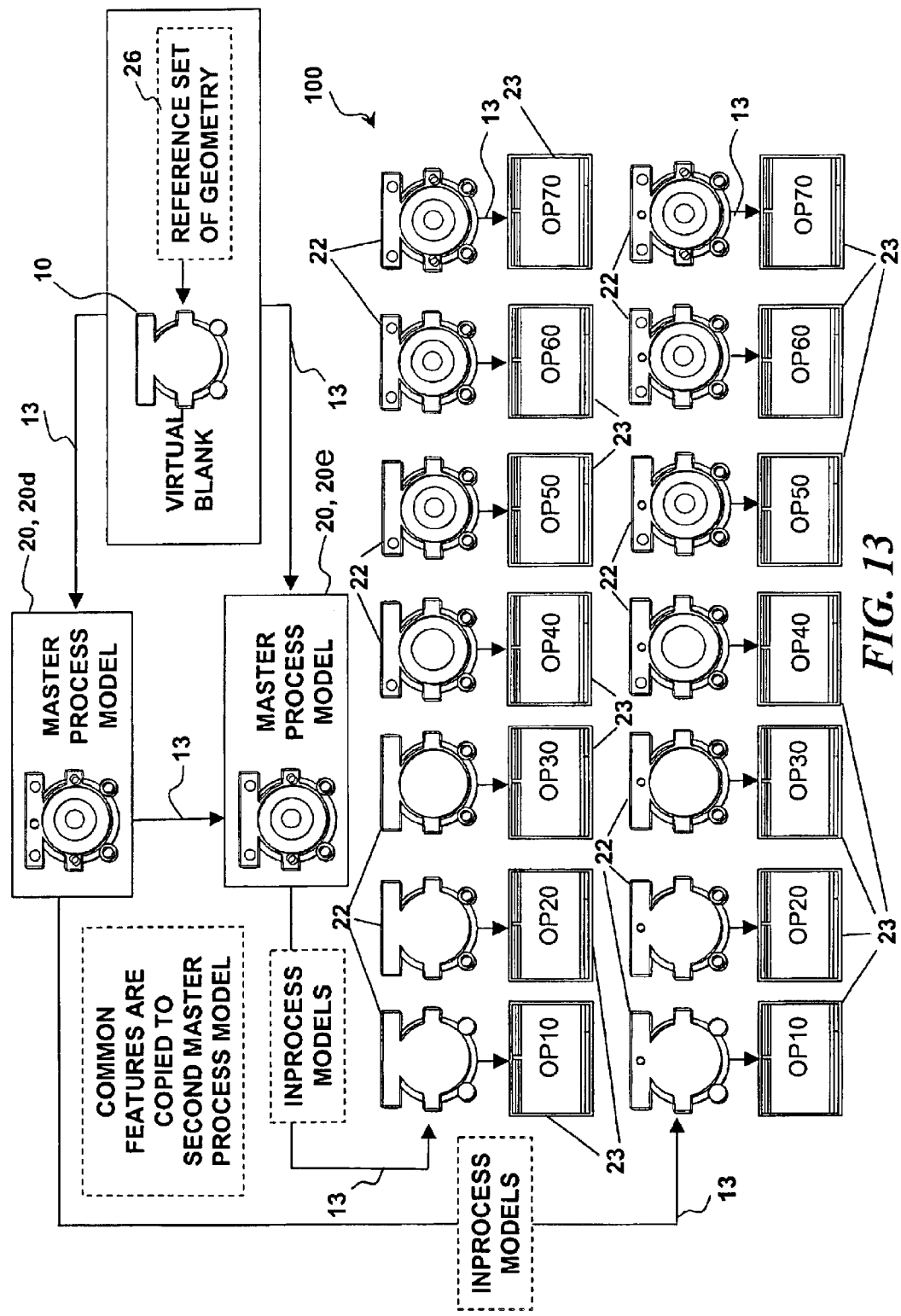
FIG. 13 is a diagram depicting the relationships among the elements of the manufacturing process model for charted parts.

Referring to FIG. 13, in the disclosed embodiment, horizontally structured modeling methods as disclosed above are employed to facilitate the generation of a manufacturing process for creating charted parts (e.g., a method for modeling and fabricating charted parts with some common and uncommon features). To facilitate the method disclosed, once again, the link/unlink and extraction functions disclosed above are here again employed.

To execute generating a manufacturing process for charted parts, multiple master process models are created each including features and manufacturing operations common to the required charted parts. The manufacturing process comprises a plurality of models each termed master process models analogous to those described above once again created or generated from a virtual blank 10 extracted from the geometry of a reference set 26 or a casting model. Initially a master process model 20 generated, which is virtual machined to include the manufacturing features common to all charted parts. Second, from this master process model 20, one or more subsequent master process model(s) 20d are created or generated and each of the part specific manufacturing features are added. In the figure, a single common master process model is depicted as well as a single master process model corresponding to a particular charted part. Subsequently additional master process models may be added for each additional charted part. In reference to the manufacturing process modeling, once again, master process models are created and include the characteristics, relationships and limitations as described above for horizontally structured models. To avoid duplication, reference may be made to the abovementioned embodiments for insight concerning a master process model and horizontally structured models.

In the figure, two such master process models are depicted. The master process model 20 and the subsequent master process model 20d. Once again, each of the master process models 20 and 20d includes associative relationships (e.g. links) as depicted by the arrows in the figure, with the virtual blank 10 and subsequent corresponding in-process models (extracts) 22. Each associative relationship is characterized such that changes in the reference set 26, virtual blank 10, or particular master process model 20 or subsequent master process model 20d are reflected in all the subsequent linked in-process models (extracts) 22 corresponding to that particular master process model. Once again, the master process models 20 and 20d may be created in a variety of manners as described in the embodiments above. For example, in the Unigraphics® environment, the master process model 20 may be created or generated via virtual machining of a virtual blank 10, which was created as a linked body or a promotion from a reference set 26, as a replica of an existing model. A master process model may also be generated by the extraction process from an existing model element "Extracts" of each master process model are utilized to generate process sheets 23 or other instructions for each procedure to machine a real world part just as described in earlier embodiments. Thereby, the combination of the multiple processes enabling fabrication of charted parts may be created.

Turning now to FIG. 13 once again for insight into the utilization of a reference set 26, virtual blank 10, and the master process model 20, and subsequent master process model 20d with their respective associated relationships and progeny are applied to facilitate a manufacturing process for charted parts. Similar to the abovementioned embodiments, each of the master process models 20 and 20d are configured to include associative relationships (e.g. links) configured such that changes in a reference set, 26 or virtual blank 10 are reflected in the subsequent linked master process models and their progeny. Likewise, as stated earlier, changes in the master process models e.g., 20 and 20d will not affect the parents.

An exemplary embodiment further illustrates application to a charted parts manufacturing process. Two master process models, e.g., 20 and 20d are generated as disclosed herein, namely initiated with a virtual blank 10 as a replica of the desired reference set 26 or product casting. The virtual machining necessary to add all common desired manufacturing features, for example, 12a, 12b, and 12c (FIG. 6) (12a–12j are depicted in FIG. 13) is performed on one master process model 20 for example. Following the addition of the first subset of manufacturing features, a subsequent master process model e.g., 20d is generated. The manufacturing features from the master process model 20 are copied to the subsequent master process model 20d. Thereby the common manufacturing features for example, 12a, 12b, and 12c are applied in the subsequent master process model 20d with modifiable constraints. The modifiable constraints enable the user to individually select and dictate the linkages and relationships among the various model elements. In this instance, for example this may include, but not be limited to, the linkages between the common manufacturing features (e.g. 12a, 12b, and 12c) and the first master process model 20. Therefore, the subsequent master process model 20d may include the common manufacturing features (e.g. 12a, 12b, and 12c) and yet not necessarily include associative relationships with the master process model 20. The subsequent desired manufacturing features e.g., 12d, and 12e may then be added to the subsequent master process model e.g., 20d. Moreover, the additional uncommon features may then be added to the master process models 20 and 20d. Finally, as illustrated in the figure, as disclosed in the abovementioned embodiments, a plurality in-process models or extract(s) may be generated from each of the master process model(s) 20, and 20d respectively (in this instance two are depicted). From the extract(s) 22 associated with each master process model e.g., 20 and 20d corresponding process sheets 23 may also be generated. Where again, extracts, of the respective master process models 20 and 20d are created at various operations of the manufacturing processes associated with a particular master process model of the plurality. Once again from these in-process models 22, corresponding process sheets 23 may be generated for specifying the manufacturing operations. Once again, it should be recognized that the in-process models 22 and process sheets 23 are created and includes the characteristics, relationships and limitations as described above for horizontally structured models and horizontally structured process models. To avoid duplication, reference may be made to the abovementioned embodiments for insight concerning in-process models or extracts and process sheets.

A particular feature of the exemplary embodiment is that it would allow the user to readily add new manufacturing features and thus new charted parts any where in the charted parts manufacturing process model without disrupting the every file and model. Moreover, global changes, which affect the entire model, may be made at the highest level via the master process model with the common features e.g., 20 or the referenced geometry, which then flow down to all the subsequent models by virtue of the associative relationships among them.

It is noteworthy to appreciate that the charted parts manufacturing operations process capability disclosed realizes its potential and significance primarily due to the characteristics of the horizontally structured model and manufacturing processes disclosed herein. Specifically, the separation/distribution of associative relationships in the models provides the enhancement achieved. In contrast, in "vertical" modeling and manufacturing processes, where the traditional approach to manufacturing modeling was to create separate individual models representing the real-world component at numerous particular operations in the manufacturing process. If a change or deletion was made in one model, it was necessary to individually update each of the other models having the same part. Using the horizontally structured modeling disclosed herein and employing the model link/unlink capabilities, it is now possible to generate multiple horizontally structured master process model(s) linked in a manner such that changes in one model are automatically carried out in other linked models enabling a multitude of charted parts manufacturing processes. Further, the subsequent process sheets 23 that are linked thereto are also automatically updated.

Virtual Concurrent Product and Process Design

Product and process modeling traditionally, involves the creation of two models, one to represent the finished component and another to represent the manufacturing processes. The two models generally include no feature linkages, particularly in the final product model and therefore, the models have to be manually updated to reflect any changes to the manufacturing process or the finished component. Moreover, certain operations may need to be repeated for both the product model and the manufacturing process modeling. Maintaining two models and manually updating models is cumbersome and expensive.

The model link/unlink functionality coupled with the horizontally structured process modeling as disclosed earlier brings forth new opportunities for enhancement of CAD/CAM modeling and manufacturing process modeling. One such opportunity is horizontally structured CAD/CAM modeling and manufacturing process modeling methods to facilitate concurrent product and process design. An exemplary embodiment addresses the deficiencies of known manufacturing modeling methods by creating a single master model to represent the finished component or product and the manufacturing process for the product.

For a better understanding of the features of the disclosed embodiment, reference is made to the earlier disclosed horizontally structured modeling and horizontally structured manufacturing process modeling including model link/unlink disclosed above, and as further exemplified below. The exemplary embodiment is described by illustration of additional features subsequent to the abovementioned embodiments, specifically an enhancement to the horizontally structured manufacturing process modeling disclosed and claimed herein. Therefore, the disclosure will be in reference to and illustrated using manufacturing process modeling as an example but is not to be construed as limited thereto.

In the disclosed method, horizontally structured modeling methods as disclosed above are employed to facilitate the generation of a product design and manufacturing process model for creating an actual part. The exemplary embodiment comprises a model termed master product and process concurrent model analogous to those described above, but including both the product design model and the manufacturing process model. In this instance, the master product and process concurrent model includes associative relationships (e.g. links) configured such that changes in master product and process model are reflected in all the subsequent linked in-process models or extracts and subsequently process sheets. Similar to the abovementioned embodiments, "extracts" of the master product and process concurrent model are utilized to generate process sheets or other instructions for each procedure to machine a real-world part.

Figure 14:
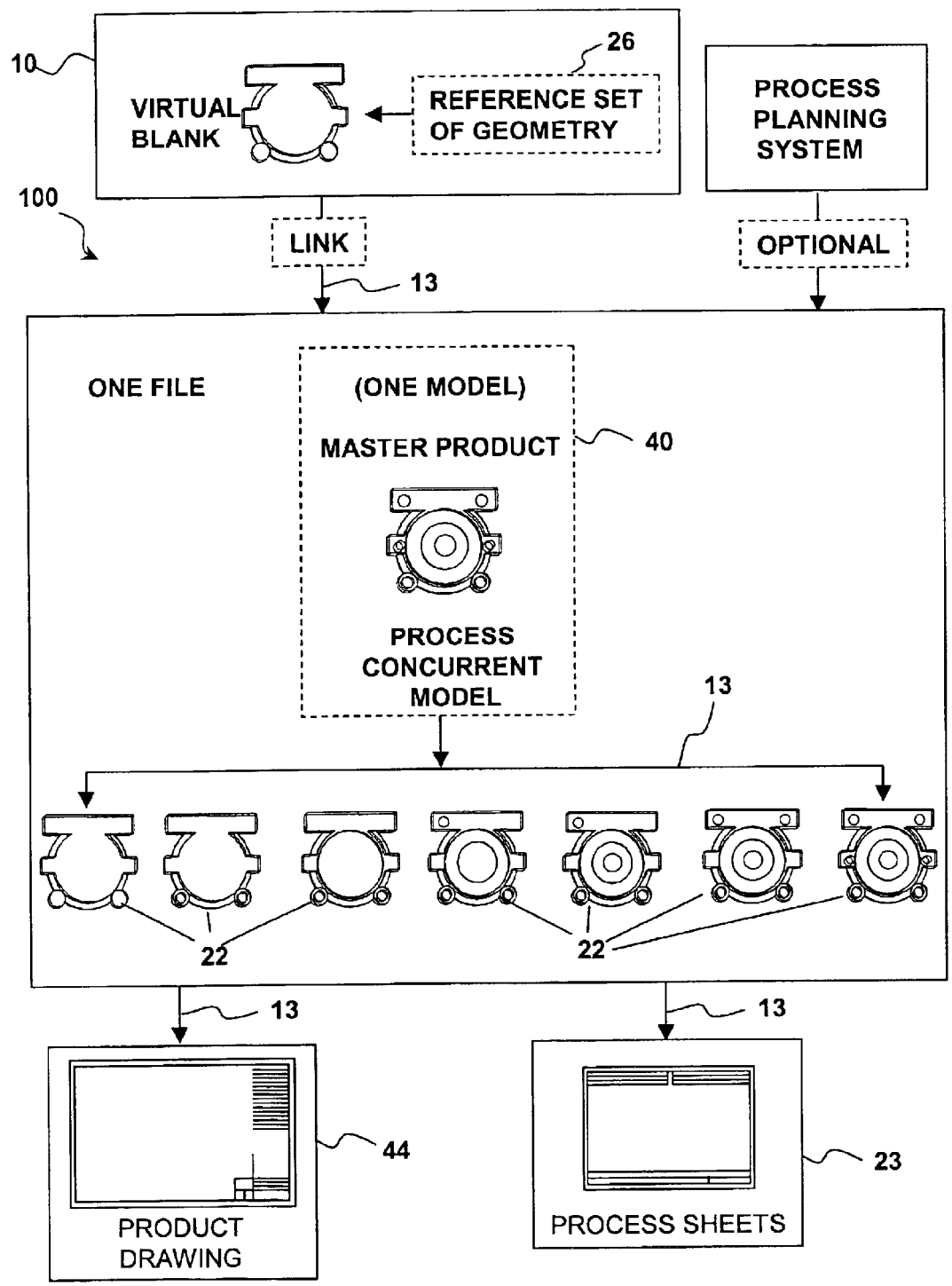
FIG. 14 is a diagram depicting concurrent product and process design.

Referring now to FIG. 14, to facilitate the disclosed embodiment, the link/unlink and extraction functions disclosed above may once again be employed. Moreover, to facilitate the disclosure reference should be made to FIGS. 6 and 8. To execute generating a combined product and manufacturing process model, once again in the same manner as described in the embodiments above, is a 3-D parametric solid model representative of the geometry of a reference set 26 is created. The new model termed the master product and process concurrent model 40 includes, but is not limited to the combined elements, characteristics, and relationships of a virtual blank 10 (e.g. FIG. 5), datum planes 2, 3, and 4 (e.g. FIG. 5) as in the horizontally structured modeling embodiment as well as a master process model 20 (e.g. FIG. 5) as described in the horizontally structured manufacturing process modeling embodiments above. Moreover, the relationships, including, but not limited to, positional, orientational, associative, and the like, as well as combination of the foregoing among the model elements are also acquired and retained. To avoid duplication, reference may be made to the abovementioned embodiments for insight concerning a master process model and horizontally structured models.

Therefore, now the master product and process concurrent model 40 may be manipulated and modified as required to model the creation as well as the method of manufacturing the actual part. Once again, this master product and process concurrent model 40, logically, is a child of the reference set 26 and virtual blank 10. Moreover, once again, no mandatory associative relationship need exist among the master product and process concurrent model 40 and the datum planes 2, 3, and 4 (e.g., FIG. 5) which comprise the reference 3-D coordinate system 6 with respect to which, the manufacturing features 12a–12j (FIG. 6) are positioned and oriented.

The described independence, as with the modeling described above provides significant flexibility in the product design modeling and manufacturing process modeling by allowing a user to interchangeably apply various features to a particular master product and process concurrent model 40. Likewise, interchangeable master product and process concurrent models 40 may be generated without impacting the particular manufacturing features 12a–12j or datum planes (e.g., 2, 3, and 4) utilized. For example, different reference sets 26 may be selected and a new master product and process concurrent model 40 generated therefrom and subsequently, the same manufacturing features 12a–12j and associated datum planes (e.g., 2, 3, and 4) added.

Turning now to FIG. 14 once again for insight into the utilization of a reference set 26, the virtual blank 10, the master product and process concurrent model 40 with associated relationships and progeny are applied to facilitate a product design and manufacturing process. In an exemplary embodiment product models, as disclosed in the abovementioned embodiments may be generated, ultimately resulting in a product drawing 44 depicting the design of the product. The product drawing including the information required to define the part, including, but not limited to, materials, characteristics, dimensions, requirements for the designed part or product, and the like, as well as combinations of the foregoing. In addition, from the master product and process concurrent model 40 one or more in-process models or extract(s) may be generated. From the extract(s) 22 associated with the master product and process concurrent model 40, corresponding process sheets 23 may thereafter be generated. Where again, extracts, of the master product and process concurrent model 40 are created at various operations of the manufacturing processes associated with a master product and process concurrent model 40. Once again from these in-process models 22, corresponding process sheets 23 may be generated for specifying the manufacturing operations. Once again, it should be recognized that the in-process models 22 and process sheets 23 are created and include the characteristics, relationships and limitations as described above for horizontally structured models and horizontally structured process models. To avoid duplication, reference may be made to the abovementioned embodiments for insight concerning in-process models or extracts and process sheets.

In yet another exemplary embodiment of the concurrent product and process design modeling, the master product and process concurrent model 40 disclosed above may further be linked with a manufacturing process planning system. For example, the process planning system may be utilized to define the manufacturing in-process feature and manufacturing process parameters (e.g., machining speeds, material feed speeds, and the like, as well as combinations of the foregoing) based upon the finished product requirements. The process planning system may be developed within the CAD/CAM environment (e.g., Unigraphics® environment) or developed independently and linked with to the CAD/CAM system.

A process planning system is computer program to automate creation of manufacturing process plans based on existing manufacturing process knowledge, a rules database, and the like, including combinations of the foregoing. A process plan defines the sequence of operations and process parameters for manufacturing the component to meet the desired product geometry and quality requirements.

Preferably, the link between the process planning system and the master process concurrent model 40 may be achieved at the manufacturing feature (e.g. 12a–12j) level. Thereby creating associative relationships among model elements and a process planning system and facilitating the planning process. For example, routines can be developed within the CAD/CAM system and the process planning system to share geometry and process data associated with the manufacturing features (e.g., 12a–12j). For example, process data may include, but not be limited to machining speeds, feeds, tooling, tolerances, manufacturing cost estimates, etc. Additionally, routines may be developed within a CAD/CAM system to enable creation and management of features within the master product and process concurrent model 40. The routines may thereafter be called by the process planning system to create and sequence manufacturing in-process features. Integration of a process planning system with the master product and process concurrent model 40 in such manner will enable rapid creation of process plans concurrent with the product designs.

It is noteworthy to appreciate that the concurrent product and process design modeling capability disclosed realizes its potential and significance primarily due to the characteristics of the horizontally structured modeling and manufacturing processes disclosed herein. Specifically, the separation/distribution of associative relationships in the models provides the enhancement achieved. In contrast, in "vertical" modeling and manufacturing processes, where the traditional approach to manufacturing modeling was to create separate models for product design and manufacturing process. If a change or deletion was made in one model, it was necessary to manually update the other model having the same part. Using the horizontally structured modeling disclosed herein and employing the model link/unlink capabilities, it is now possible to generate concurrent horizontally structured master product and process concurrent model linked in a manner such that changes are automatically carried out in both the product design and manufacturing models enabling significantly enhanced design and manufacturing processes. Further, the subsequent process sheets 23 that are linked thereto are also automatically updated. Any changes to a master product and process concurrent model 40 are automatically reflected in the corresponding in-process models 22 and process sheets 23. Moreover, another aspect of the disclosed embodiment is the potential for integration of process planning and product/process design. Finally, the concurrent product and process design methods disclosed herein facilitate the utilization of a single file for both product and process design.

Virtual Fixture Tooling Process

Manufacturing tool and fixture drawings are often created and maintained as two-dimensional. This practice results in the manual editing of drawings. Moreover, such practice foregoes the generation of a three dimensional parametric solid model, which facilitates down stream applications. Significantly, manual editing eventually produces drawings, which may not be true to size. More damaging, is that many operators may avoid investing the time to incorporate the exact dimensional changes made to a part in the drawings, especially on two dimensional, tool, and fixture drawings.

A method is disclosed which automates the process of generating and editing contact tooling and fixture drawings. This new process creates a 3-D parametric solid model of contact tools and fixtures by linking the contact area of a tool and/or fixture to its corresponding final production part model or in-process models. Thereby, contact area geometry exhibiting associative relationships with a modeled part will be automatically updated as the linked part is modified.

The model link/unlink functionality coupled with the horizontally structured process modeling as disclosed earlier brings forth new opportunities for enhancement of CAD/CAM modeling and manufacturing process modeling. One such opportunity is horizontally structured CAD/CAM modeling and manufacturing process modeling methods to facilitate virtual fixture and tooling product and process design. An exemplary embodiment addresses the deficiencies of known tooling and fixture design and modeling methods by creating linkages to a model, for example a casting model, and to the required in-process models for the finished component or product and the manufacturing process for the product.

A method is disclosed which automates the process of generating and editing contact tooling and fixture drawings. This new process creates a 3-D parametric solid model of contact tools and fixtures by linking the contact area of a tool and/or fixture to its corresponding reference set, production part model, in-process models, or other models, and the like including combinations of the foregoing. Thereby, a contact area geometry exhibiting associative relationships with a modeled part will be automatically updated as the linked part is modified.

For a better understanding of the features of the disclosed embodiment, reference is made to the earlier disclosed horizontally structured modeling and horizontally structured manufacturing process modeling including model link/unlink disclosed above, and as further exemplified below. The exemplary embodiment is described by illustration of additional features subsequent to the abovementioned embodiments, specifically an enhancement to the horizontally structured manufacturing process modeling disclosed and claimed herein. Therefore, the disclosure will be in reference to and illustrated using product CAD/CAM modeling and manufacturing process modeling as an example but is not to be construed as limited thereto. Please refer also to the Virtual Fixture Tooling Modeling disclosed above.

In the disclosed embodiment, horizontally structured modeling methods as disclosed above are employed to facilitate the generation of a product design and manufacturing process model for creating an actual part and the tooling and fixtures therefor. In an exemplary embodiment a model termed master process model analogous to those described above, and including similar characteristics is employed to generate tooling and fixture models, and fabrication instructions. In this instance, similar to the models and master process models disclosed earlier includes associative relationships (e.g. links) configured such that changes in master process model are reflected in all the subsequent linked models or modeling elements, including but not limited to reference sets, virtual blanks, product models, process models, in-process models or extracts, process sheets, product drawings, and the like, as well as combinations including the foregoing. Similar to the abovementioned embodiments, "extracts" of the master product and process model are utilized to generate process sheets or other instructions for each procedure to machine a real-world part. Moreover, changes in such a model may as disclosed herein, also be reflected in tooling and fixture models, which are likewise, subsequently reflected in tooling and fixture drawings.

Referring now to FIGS. 15, as well as FIGS. 6 and 8 to facilitate the disclosed embodiment, the link/unlink and extraction functions disclosed and described above are once again employed. To execute generating a product and manufacturing process model configured to facilitate tooling and fixture generation, once again in the same manner as described in the embodiments above, a 3-D parametric solid model representative of the geometry of a reference set 26 and virtual blank 10 is generated or created or generated in a manner similar to that described in the abovementioned embodiments. The new model, here again termed a master process model 20 includes, but is not limited to the elements, characteristics, and relationships of a reference set 26 or casting as in the horizontally structured modeling embodiment. Moreover, the relationships among the model elements, including, but not limited to, positional, orientational, associative, and the like, as well as combination of the foregoing are also acquired and retained. To avoid duplication, reference may be made to the abovementioned embodiments for insight concerning a master process model 20 and horizontally structured models.

Turning once again to FIG. 15 for insight into the utilization of a reference set 26, a virtual blank 10, and the master process model 20 with associated relationships and progeny are applied to facilitate a product design, tooling and fixture design and fabrication, and a manufacturing process. Once again, as described earlier, from the master process model 20 one or more in-process models or extract(s) may be generated. From the extract(s) 22 associated with the master process model 20, corresponding process sheets 23 may thereafter be generated.

Where again, in-process models 22, of the master process model 20 are created at various operations of the manufacturing processes associated with a master process model 20 and the fabrication of the actual part. Once again from these in-process models 22, corresponding process sheets 23 may be generated for specifying the manufacturing operations. Once again, it should be recognized that the in-process models 22 and process sheets 23 are created and include the characteristics, relationships and limitations as described above for horizontally structured models and horizontally structured process models. To avoid duplication, reference may be made to the abovementioned disclosures for insight concerning in-process models or extracts and process sheets.

In an exemplary embodiment, for a model for a part, selected two dimensional (2-D) contact area geometries and/or surfaces are established for tooling and fixtures. Associative relationships are established with such contact areas and surfaces. The selected contact area 2-D geometries are linked as described earlier, and established a new 2-D reference set. A new file may be created, and the new 2-D reference set is imported to create the virtual tool or fixture. Similar to the abovementioned embodiments, in a Unigraphics® environment, a linked reference geometry is generated via the Wave link function from the new reference set. The linked 2-D reference geometry is then extruded to create a new 3-D parametric solid model for the virtual tool or fixture. This model may be termed a tooling model 25. The extrusion process is a method by which the linked 2-D reference geometry is expanded into a third dimension to 3-D parametric solid model. For example, a 2-D reference geometry of a circle may be extruded into a 3-D solid cylinder. The 3-D solid model now represents the contact tool and corresponds to the feature that is modeled or machined into the actual part.

In an exemplary embodiment the tooling model 25, may be generated as described above. It should be noted that the generation of the tooling model 25 as disclosed herein is illustrative and not limited to the disclosed embodiment. Other methods for generating models such as product models, process models, in-process models as well as extracts and extrusions thereof, and the like, as well as combinations of the foregoing are possible and contemplated. The tooling model 25, a 3-D parametric solid model exhibits characteristics similar to those of other product models or master process models as disclosed in the abovementioned embodiments. Once again, this tooling model 25, logically, is a child of the reference set or referenced geometry 26. The new tooling model 25 includes, but is not limited to the elements, characteristics, and relationships of a part model, reference set 26, virtual blank 10 or casting, or master process model as in the horizontally structured manufacturing process modeling disclosed herein. Moreover, the relationships among the model elements, including, but not limited to, positional, orientational, associative, and the like, as well as combination of the foregoing are also acquired and retained. To avoid duplication, reference may be made to the abovementioned embodiments for insight concerning horizontally structured model characteristics and relationships. Moreover, in a similar fashion to the product modeling and manufacturing process modeling, no mandatory associative relationship need exist among the tooling model 25 and the first, second, and third datum planes 2, 3, and 4 respectively (e.g., FIG. 5). The first, second, and third datum planes 2, 3, and 4 respectively, comprise the reference 3-D coordinate system 6 with respect to which, the form features (e.g. 5a–5g) and manufacturing features 12a–12j (FIG. 6) are positioned and oriented.

Therefore, now the master process model 20 and subsequently, the tooling model 25 may be manipulated and modified as required via modeling and virtual machining processes to model the creation as well as the method of manufacturing the actual part, in this instance, the tool or fixture. The tooling model 25 is utilized to ultimately generate a tool/fixture drawing 46 depicting the design of a tool or fixture. The tool/fixture drawing 46 includes the information required to define the tool/fixture, including, but not limited to, materials, characteristics, dimensions, requirements for the designed part or product, and the like, as well as combinations of the foregoing. Once again, this master process model 20 and tooling model 25, logically, are children of the reference set 26. Moreover, once again, no mandatory associative relationship need exist among the master process model 20 and the datum planes 2, 3, and 4 (e.g., FIG. 5). The datum planes 2, 3, and 4 comprise the reference 3-D coordinate system 6 with respect to which, the manufacturing features 12a–12j (FIG. 6) are positioned and oriented.

The modeling characteristics described above, once again, provide significant flexibility in the product design modeling and manufacturing process modeling by allowing a user to interchangeably apply various manufacturing features 12a–12j to a particular master process model 20. Likewise, interchangeable master process models 20 may be generated without impacting the particular manufacturing features (e.g. one or more of 12a–2j) or datum planes (e.g., 2, 3, and 4) utilized. For example, different reference sets, 26 may be selected and a new master process model 20 and likewise, a new tooling model 25 generated therefrom and subsequently, the same manufacturing features 12a–12j added with associated datum planes (e.g., 2, 3, and 4). Moreover, in a similar fashion, a variety of interchangeable features may be added to multiple tooling models generated from common referenced geometries.

It is noteworthy to appreciate that the virtual tool and fixture design modeling capability disclosed herein realizes its potential and significance primarily due to the characteristics of the horizontally structured model and manufacturing processes disclosed herein and concurrent product and process design modeling. Specifically, the separation/distribution of associative relationships in the models provides the enhancement achieved. In contrast, in "vertical" modeling and manufacturing processes, where the traditional approach to manufacturing modeling was to create separate models for product design and manufacturing process and two-dimensional drawings for tooling/fixture design. If a change or deletion was made in one model, it was necessary to manually update the other model having the same part. Using the horizontally structured modeling disclosed herein and employing the model link/unlink capabilities, it is now possible to generate concurrent horizontally structured master process model linked in a manner such that changes are automatically carried out in both the product design manufacturing and tooling/fixture models enabling significantly enhanced design and manufacturing processes. Further, the subsequent process sheets 23, and tooling/fixture drawings 46 that are linked thereto are automatically updated. Any changes to a master process model 20 are automatically reflected in the corresponding in-process models 22 and process sheets 23.

Automated Manufacturing Process Design

The model link/unlink functionality coupled with the horizontally structured process modeling as disclosed earlier brings forth new opportunities for enhancement of CAD/CAM modeling and manufacturing process modeling. One such opportunity is horizontally structured CAD/CAM modeling and manufacturing process modeling methods to facilitate automated manufacturing process design. An exemplary embodiment addresses the deficiencies of known manufacturing process methods by creating a horizontally structured automated manufacturing process design including a master process model linked to a spreadsheet to capture and organize manufacturing process rules.

Manufacturing process design involves the generation of rules and/or instructions for fabricating an actual part. The automation utilizes a spreadsheet to capture the manufacturing process rules for particular parts. The manufacturing process rules may be organized by each manufacturing operation. Based on the process rules and the product dimensions, in-process dimensions may be calculated for manufacturing operations. Moreover, the spreadsheets may also be linked with master process model such that changes incorporated into the spreadsheets may be automatically reflected in the master process model, in-process models and associated process sheets and the like as well as combinations of the foregoing. Likewise, changes incorporated into the model elements such as master process model, in-process models and associated process sheets and the like as well as combinations of the foregoing may be automatically reflected in the spreadsheets.

For a better understanding of the features of the disclosed embodiment, reference is made to the earlier disclosed horizontally structured modeling and horizontally structured manufacturing process modeling including model link/unlink functionality disclosed above, and as further exemplified below. The exemplary embodiment is described by illustration of additional features subsequent to the above-mentioned embodiments, specifically an enhancement to the horizontally structured manufacturing process modeling disclosed and claimed herein. Therefore, the disclosure will be in reference to and illustrated using manufacturing process modeling as an example but is not to be construed as limited thereto.

In the disclosed embodiment, horizontally structured modeling methods as disclosed above are employed to facilitate the generation of an automated manufacturing process design model for creating an actual part. The exemplary embodiment comprises a model termed master process model analogous to those described above. In this instance, the master process model includes associative relationships (e.g. links) to a spreadsheet including the manufacturing process rules. The master process model may be configured such that changes in master process model are reflected in all the subsequent linked spreadsheets, in-process models or extracts, subsequent process sheets and the like. Similar to the abovementioned embodiments, "extracts" of the master model are utilized to generate process sheets or other instructions for each procedure to machine a real-world part. Moreover, the master process model may be linked with numerically controlled (NC) tool paths and Coordinate Measuring Machine (CMM).

Figure 16:
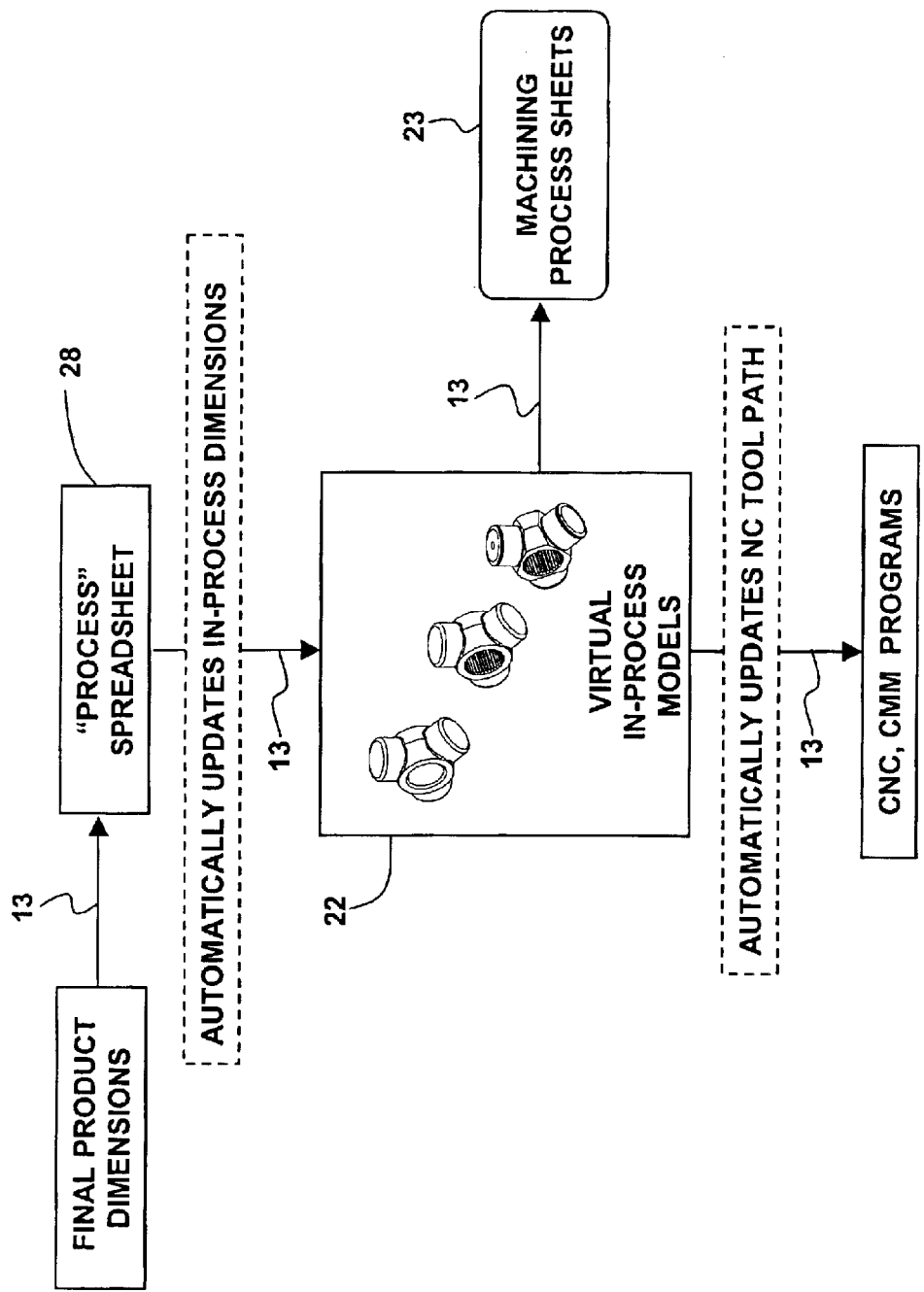
FIG. 16 is a diagram depicting the automated manufacturing process design modeling.

Referring now to FIG. 16, as well FIGS. 6 and 8,to facilitate the disclosed embodiment, the link/unlink and extraction functions disclosed above are here again employed. To execute generating an automated manufacturing process design, once again in the same manner as described in the embodiments above, a 3-D parametric solid model representative of the geometry of a reference set 26 is generated or created. The new model termed the master process model 20 includes, but is not limited to the combined elements, characteristics, and relationships of a reference set 26 geometry and/or the virtual blank 10 (e.g. FIG. 8), datum planes 2, 3, and 4 (e.g. FIG. 6) as in the horizontally structured modeling embodiment as well as a master process model 20 (e.g. FIG. 8) as described in the horizontally structured manufacturing process modeling embodiments above. Moreover, the relationships, including, but not limited to, positional, orientational, associative, and the like, as well as combination of the foregoing among the model elements are also acquired and retained. To avoid duplication, reference may be made to the abovementioned embodiments for insight concerning a master process model and horizontally structured models Therefore, now the master process model 20 may be manipulated and modified as required to model the creation as well as the method of manufacturing the actual part. Once again, this master process model 20, logically, is a child of the reference set 26 and virtual blank 10. Moreover, once again, no mandatory associative relationship need exist among the master process model 20 (e.g., in a Unigraphics® environment, the Wave linked geometry) and the datum planes 2, 3, and 4 (e.g., FIG. 6) which comprise the reference 3-D coordinate system 6 with respect to which, the manufacturing features 12a–12j are positioned and oriented.

The described independence, as with the modeling described above provides significant flexibility in the product design modeling and manufacturing process modeling by allowing a user to interchangeably apply various features to a particular master process model 20. Likewise, interchangeable master process models 20 may be generated without impacting the particular manufacturing features (e.g., one or more of 12a–12j) or datum planes (e.g., 2, 3, and 4) utilized. For example, different reference sets 26 may be selected and a new master process model 20 generated therefrom and subsequently, the same manufacturing features 12a–12j and associated datum planes (e.g., 2, 3, and 4) added.

Figure 17:
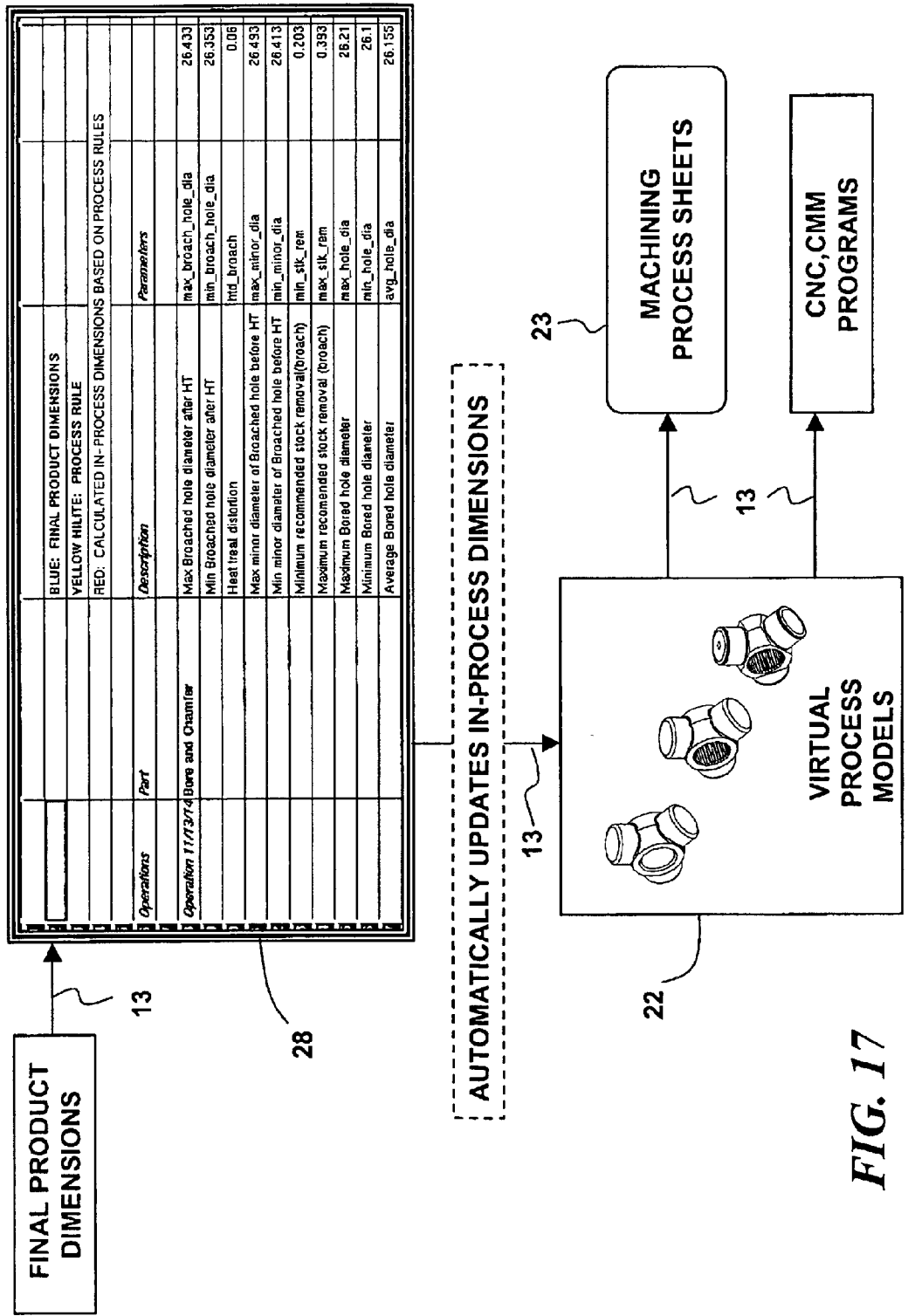
FIG. 17 depicts an exemplary spread sheet as referenced in the automated manufacturing process design modeling disclosure.

Turning now to FIGS. 16 and 17 as well as once again, referring to FIGS. 6 and 8, for insight into the utilization of a reference set 26, the virtual blank 10, the master process model 20 with associated relationships and progeny are applied to facilitate an automated product design and manufacturing process. In an exemplary embodiment manufacturing process models, as disclosed in the abovementioned embodiments may be generated, ultimately resulting in-process sheets 23 for manufacturing the product. The manufacturing process design involves the generation of rules and/or instructions for fabricating an actual part. The manufacturing rules may include, but not be limited to, manufacturing operation features, machining rules, speeds, feed rates, or tolerances, and the like as well as combinations of the foregoing. In an exemplary embodiment, the automation utilizes a spreadsheet 28 (FIGS. 16 and 17) to capture the manufacturing process rules for particular parts. The manufacturing process rules may be organized by each manufacturing operation. Based on the process rules and the product dimensions, in-process dimensions may be calculated for manufacturing operations. Moreover, the spreadsheets 28 may also be linked with master process model 20 such that changes incorporated into the spreadsheets 28 may be automatically reflected in the master process model, in-process models or in-process models 22 and associated process sheets 23 and the like as well as combinations of the foregoing. Likewise, changes incorporated into the model elements such as virtual blank 10, master process model 20, manufacturing features, (e.g., 12a–12j; FIG. 6) in-process models 22, and associated process sheets 23 and the like as well as combinations of the foregoing may be automatically reflected in the spreadsheets 28.

In addition, from the master product model 20 one or more in-process models or extract(s) may be generated. From the extract(s) 22 associated with the master process model 20, corresponding process sheets 23 may thereafter be generated. Where again, extracts, of the master process model 20 are created at various operations of the manufacturing processes associated with a master process model 20. Once again from these in-process models 22, corresponding process sheets 23 may be generated for specifying the manufacturing operations. Once again, it should be recognized that the in-process models 22 and process sheets 23 are created and includes the characteristics, relationships and limitations as described above for horizontally structured models and horizontally structured process models. To avoid duplication, reference may be made to the abovementioned disclosures for insight concerning in-process models or extracts and process sheets.

It is noteworthy to appreciate that the automated manufacturing process design modeling capability disclosed realizes its potential and significance primarily due to the characteristics of the horizontally structured model and manufacturing processes disclosed herein. Specifically, the separation/distribution of associative relationships in the models provides the enhancement achieved. In contrast, in "vertical" modeling and manufacturing processes, where the traditional approach to manufacturing modeling was to create separate models for product design and manufacturing process. If a change or deletion was made in one model, it was necessary to manually update the other model having the same part. Using the horizontally structured modeling disclosed herein and employing the model link/unlink capabilities, it is now possible to generate automated manufacturing processes employing horizontally structured master process model and a and a manufacturing rules spreadsheet linked in a manner such that changes are automatically carried out in both the spreadsheet and manufacturing models enabling significantly enhanced manufacturing processes. Further, the subsequent process sheets 23 that are linked thereto are also automatically updated. Any changes to a master process model 20 are automatically reflected in the corresponding in-process models 22 and process sheets 23

It should be noted the disclosed embodiments may be implemented on any CAD/CAM software system that supports the following functions and capabilities: reference planes, datum planes or similar Cartesian equivalents; parametric modeling, or similar equivalent; and feature modeling or similar equivalents.

It should be noted that the term modeling elements or elements of model and similar phraseology have been used throughout this specification. Such terminology is intended to include, but not be limited to: a reference, a reference axis, a reference datum, a datum, a coordinated system, a reference set, a geometry, a linked geometry, a linked body, a virtual blank, a base feature, a product model, a master process model, a master product and process concurrent model, an extract, an in-process model, an extracted body, a form feature, a manufacturing feature, a process sheet, a drawing, a product drawing, a tool drawing, a fixture, a spreadsheet and the like as well as combinations of the foregoing.

It must be noted that the term "machining" has been used throughout this specification, but the teachings of the invention are applicable to any manufacturing process upon a blank, including welding, soldering, brazing & joining, deformations (e.g., crimping operations), stampings (e.g., hole punchings) and the like including combinations of the foregoing. For any of these manufacturing processes, the master process model can be used to represent the entire manufacturing process, from a blank to a finished component. Virtual in-process models (e.g., extracts) can then be created from the master process model to represent particular manufacturing processes.

The disclosed method may be embodied in the form of computer-implemented processes and apparatuses for practicing those processes. The method can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus capable of executing the method. The present method can also be embodied in the form of computer program code, for example, whether stored in a storage medium, loaded into and/or executed by a computer, or as data signal transmitted whether a modulated carrier wave or not, over some transmission medium, such as over electrical wiring or cabling, through fiber optics, or via electromagnetic radiation, wherein, when the computer program code is loaded into and executed by a computer, the computer becomes an apparatus capable of executing the method. When implemented on a general-purpose microprocessor, the computer program code segments configure the microprocessor to create specific logic circuits.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of horizontally structured manufacturing for Computer Aide Design/Computer Aided Manufacturing, (CAD/CAM) comprising:
   selecting a blank for machining into an actual part:
   establishing a coordinate system;
   establishing another coordinate system wherein said another coordinate system exhibits a first associative relationship with said coordinate system;
   creating a master process model comprising:
      a virtual blank corresponding to said blank, said coordinate system and said another coordinate system substantially independent of said virtual blank;
      a manufacturing feature;
      virtual machining of said manufacturing feature into said virtual blank, said manufacturing feature exhibiting a second associative relationship with at least one of said coordinate system and said another coordinate system; and
      generating manufacturing instructions to create said actual part by machining said manufacturing feature into said blank.

2. The method of claim 1 wherein at least one of said first associative relationship and said second associative relationship is a parent/child relationship.

3. The method of claim 1 further including adding another manufacturing feature.

4. The method of claim 3 wherein said another manufacturing feature exhibits a third associative relationship with at least one of said virtual blank, said manufacturing feature, said coordinate system, and said another coordinate system.

5. The method of claim 1 wherein said virtual blank exhibits a third associative relationship with at least one of said coordinate system and said another coordinate system.

6. The method of claim 1 wherein said coordinate system and said another coordinate system comprises at least one of a point, a line, a curve, a surface, and a datum plane.

7. The method of claim 3 wherein at least one of said virtual blank, said manufacturing feature, and said another manufacturing feature is positioned and oriented relative to at least one of said coordinate system and said another coordinate system.

8. The method of claim 1 wherein said another coordinate system is positioned and oriented relative to said coordinate system.

9. The method of claim 1 wherein said coordinate system comprises:
   creating a first datum plane positioned and oriented relative to a reference;
   creating a second datum plane positioned and oriented relative to said reference; and
   creating a third datum plane positioned and oriented relative to said reference.

10. The method of claim 9 wherein said establishing said another coordinate system comprises:
   creating a fourth datum plane positioned and oriented relative to at least one of said reference, said first datum plane, and said coordinate system;
   creating a fifth datum plane positioned and oriented relative to at least one of said reference, said second datum plane, and said coordinate system; and
   creating a sixth datum plane positioned and oriented relative to at least one of said reference, said third datum plane, and said coordinate system.

11. The method of claim 10 wherein said fourth datum plane, said fifth datum plane, and said sixth datum plane positioned and oriented relative to said first datum plane, said second datum plane, and said third datum plane respectively.

12. The method of claim 1 further comprising creating extracts from said master process model, said extracts comprising replicated models of said master process model at various operations of said horizontally structured manufacturing.

13. The method of claim 12 wherein said extracts exhibit a third associative relationship with said master process model.

14. The method of claim 12 wherein said extracts are used to generate manufacturing instructions, said manufacturing instructions comprising process sheets.

15. The method of claim 12 wherein at least one of said manufacturing instructions and said master process model are linked with numerically controlled tools and a coordinate measuring machine.

16. The method of claim 1 further including modifying a third associative relationship among a plurality of modeling elements.

17. The method of claim 16 wherein said third associative relationship is a parent/child relationship.

18. The method of claim 16 wherein said modifying comprises at least one of establishing and removing said third associative relationship among said modeling elements.

19. The method of claim 16 wherein said modifying includes substituting a second plurality of modeling elements for said plurality of modeling elements.

20. A manufactured part created by a method of horizontally structured manufacturing for Computer Aided Design/Computer Aided Manufacturing (CAD/CAM), comprising:

a blank for machining into the manufactured part;
a coordinate system;
another coordinate system wherein said another coordinate system exhibits a first associative relationship with said coordinate system;
a master process model comprising:
a virtual blank corresponding to said blank, said coordinate system and said another coordinate system substantially independent of said virtual blank;
a manufacturing feature wherein said manufacturing feature is characterized by virtual machining of said manufacturing feature into said virtual blank, said manufacturing feature exhibiting a second associative relationship with at least one of said coordinate system and said another coordinate system; and
said manufactured part created by machining said manufacturing feature into said blank in accordance with a manufacturing instruction.

21. The manufactured part of claim 20 wherein at least one of said first associative relationship and said second associative relationship is a parent/child relationship.

22. The manufactured part of claim 20 further including another manufacturing feature.

23. The manufactured part of claim 22 wherein said another manufacturing feature exhibits a third associative relationship with at least one of said virtual blank, said manufacturing feature, said coordinate system, and said another coordinate system.

24. The manufactured part of claim 20 wherein said virtual blank exhibits a third associative relationship with at least one of said coordinate system and said another coordinate system.

25. The manufactured part of claim 20 wherein said coordinate system and said another coordinate system comprises at least one of a point, a line, a curve, a surface, and a datum plane.

26. The manufactured part of claim 22 wherein at least one of said virtual blank, said manufacturing feature, and said another manufacturing feature is positioned and oriented relative to at least one of said coordinate system and said another coordinate system.

27. The manufactured part of claim 20 wherein said another coordinate system is positioned and oriented relative to said coordinate system.

28. The manufactured part of claim 20 wherein said coordinate system comprises:
a first datum plane positioned and oriented relative to a reference;
a second datum plane positioned and oriented relative to said reference; and
a third datum plane positioned and oriented relative to said reference.

29. The manufactured part of claim 28 wherein said another coordinate system comprises:
a fourth datum plane positioned and oriented relative to at least one of said reference, said first datum plane, and said coordinate system;
a fifth datum plane positioned and oriented relative to at least one of said reference, said second datum plane, and said coordinate system; and
a sixth datum plane positioned and oriented relative to at least one of said reference, said third datum plane, and said coordinate system.

30. The manufactured part of claim 29 wherein said fourth datum plane, said fifth datum plane, and said sixth datum plane are positioned and oriented relative to said first datum plane, said second datum plane, and said third datum plane respectively.

31. The manufactured part of claim 20 further comprising extracts created from said master process model, said extracts comprising replicated models of said master process model at various operations of said horizontally structured manufacturing.

32. The manufactured part of claim 31 wherein said extracts exhibit a third associative relationship with said master process model.

33. The manufactured part of claim 31 wherein said extracts are used to generate manufacturing instructions, said manufacturing instructions comprising process sheets.

34. The manufactured part of claim 20 wherein at least one of said master process model and manufacturing instructions are linked with numerically controlled tools and a coordinate measuring machine.

35. The manufactured part of claim 20 wherein at least one of said first associative relationship and said second associative relationship is modifiable among a plurality of modeling elements.

36. The manufactured part of claim 35 wherein at least one of said first associative relationship and said second associative relationship is a parent/child relationship.

37. The manufactured part of claim 35 wherein at least one of said first associative relationship and said second associative relationship is at least one of established and removed from among said modeling elements.

38. A storage medium encoded with a machine-readable computer program code for horizontally structured manufacturing for Computer Aide Design/Computer Aide Manufacturing (CAD/CAM), said storage medium including instructions for causing a computer to implement a method comprising:
selecting a blank for machining into an actual part;
establishing a coordinate system;
establishing another coordinate system wherein said another coordinate system exhibits an associative relationship with said coordinate system;
creating a master process model comprising:
a virtual blank corresponding to said blank, said coordinate system and said another coordinate system substantially independent of said virtual blank;
a manufacturing feature;
virtual machining of said manufacturing feature into said virtual blank, said manufacturing feature exhibiting another associative relationship with at least one of said coordinate system and said another coordinate system; and
generating machining instructions to create said actual part by machining said manufacturing feature into said blank.

39. A computer data signal embodied in a computer readable media for horizontally structured manufacturing in Computer Aided Design/Computer Aided Manufacturing (CAD/CAM), the computer data signal comprising code configured to cause a processor to implement a method comprising:
selecting a blank for machining into an actual part;
establishing a coordinate system;
establishing another coordinate system wherein said another coordinate system exhibits an associative relationship with said coordinate system;
creating a master process model comprising:
a virtual blank corresponding to said blank, said coordinate system and said another coordinate system substantially independent of said virtual blank;
a manufacturing feature;

virtual machining of said manufacturing feature into said virtual blank, said manufacturing feature exhibiting another associative relationship with at least one of said coordinate system and said another coordinate system; and generating machining instructions to create said actual part by machining said manufacturing feature into said blank.

* * * * *